(12) United States Patent
Matsumoto et al.

(10) Patent No.: US 10,986,732 B2
(45) Date of Patent: Apr. 20, 2021

(54) LAMINATED CIRCUIT BOARD, AND ELECTRONIC COMPONENT

(71) Applicant: SHINKO ELECTRIC INDUSTRIES CO., LTD., Nagano (JP)

(72) Inventors: Takayuki Matsumoto, Nagano (JP); Tsukasa Nakanishi, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 16/594,428

(22) Filed: Oct. 7, 2019

(65) Prior Publication Data
US 2020/0128675 A1 Apr. 23, 2020

(30) Foreign Application Priority Data
Oct. 18, 2018 (JP) .............................. JP2018-196854

(51) Int. Cl.
*H05K 1/18* (2006.01)
*H05K 3/46* (2006.01)

(52) U.S. Cl.
CPC ........... *H05K 1/188* (2013.01); *H05K 3/4652* (2013.01); *H05K 2201/1003* (2013.01)

(58) Field of Classification Search
CPC ........ H05K 1/188; H05K 1/141; H05K 1/165; H05K 1/111; H05K 1/185; H05K 3/4652; H05K 3/4658; H05K 2201/1003; H05K 2201/0154; H05K 2201/086; H01F 2017/0073; H01F 2017/048; H01F 2017/0013; H01F 27/292; H01F 17/0013; H01F 17/04; H01F 2027/2809; H01F 41/041; H01F 41/042; H01F 41/043; H01F 41/045; H01F 41/046; H01F 41/047; H01F 41/048; H01F 5/003

See application file for complete search history.

(56) References Cited

U.S. PATENT DOCUMENTS

| | | | |
|---|---|---|---|
| 6,996,892 B1* | 2/2006 | Dening | H01F 17/0013 29/602.1 |
| 2008/0314633 A1* | 12/2008 | Kang | H05K 3/4069 174/264 |
| 2010/0212150 A1* | 8/2010 | Lotfi | H01L 23/495 29/832 |
| 2014/0009899 A1* | 1/2014 | Ito | H05K 3/4038 361/767 |
| 2016/0021759 A1* | 1/2016 | Furutani | H05K 3/103 174/251 |

FOREIGN PATENT DOCUMENTS

JP 2013-098187 5/2013

* cited by examiner

*Primary Examiner* — Roshn K Varghese
(74) *Attorney, Agent, or Firm* — IPUSA, PLLC

(57) ABSTRACT

A laminated circuit board includes a base having a first surface, and a second surface on an opposite side from the first surface, a first metal layer provided in the base and including a first electrode exposed from the first surface, and a second metal layer provided in the base and including a second electrode exposed from the second surface. The first metal layer includes an inductor electrically connected to the first electrode, and the first electrode and the second electrode are bonded and electrically connected to each other.

15 Claims, 50 Drawing Sheets

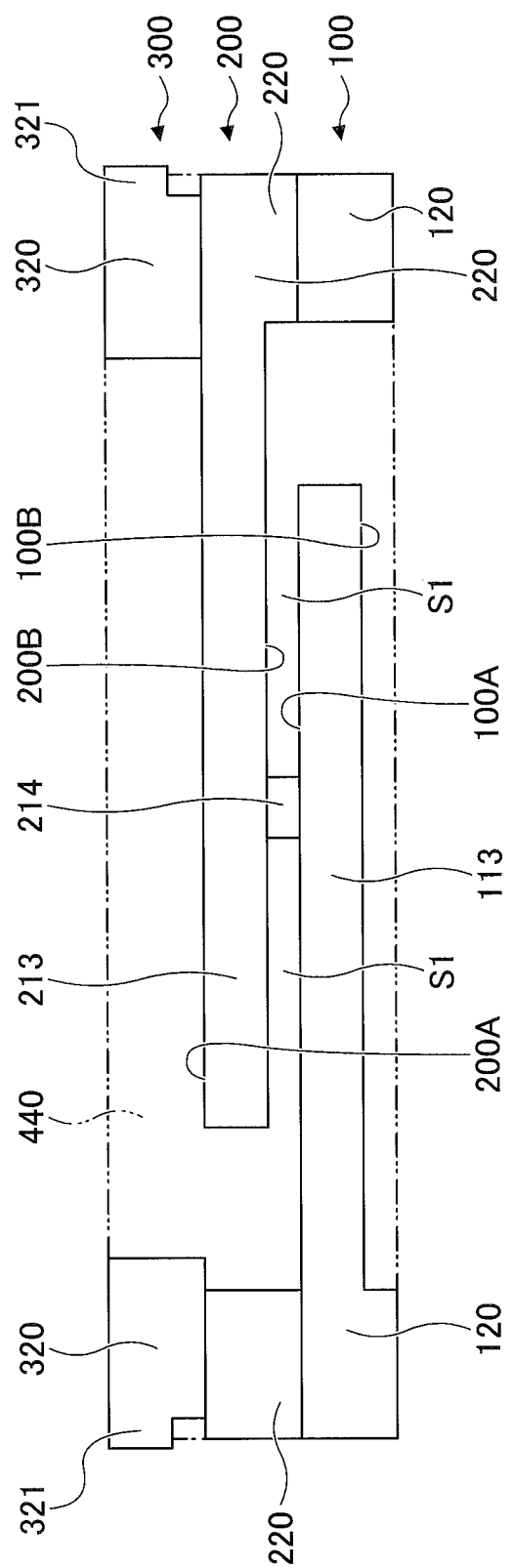

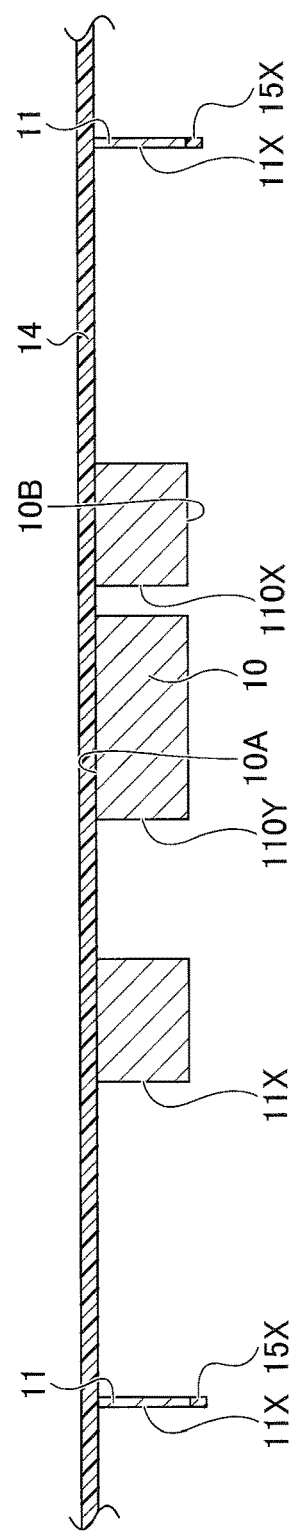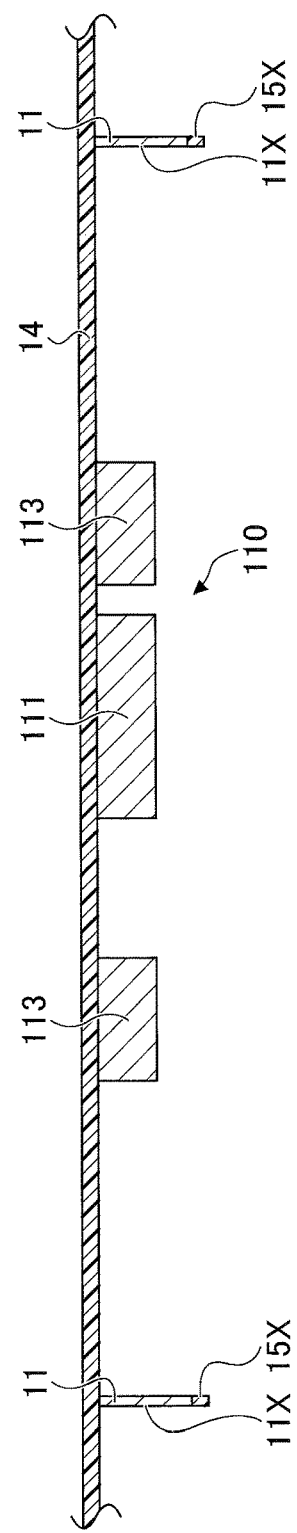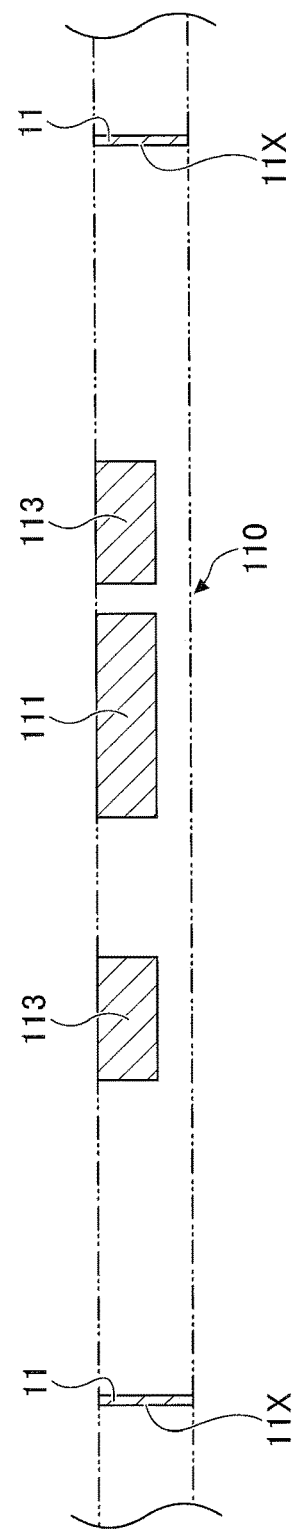

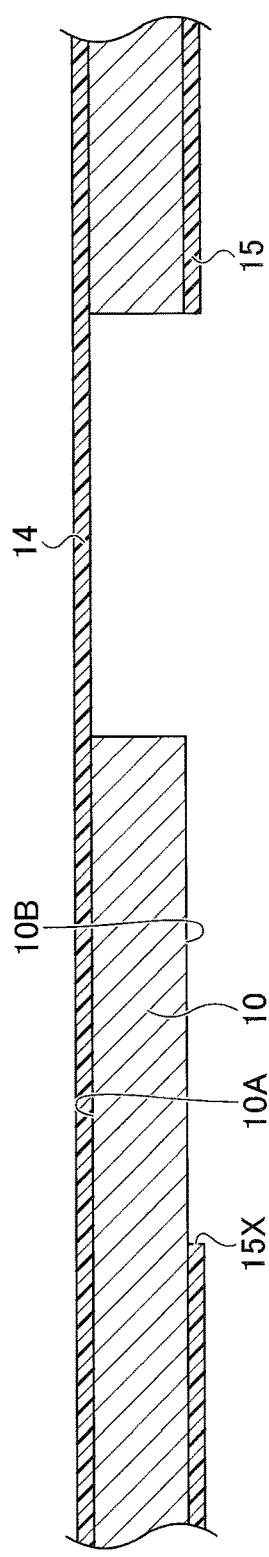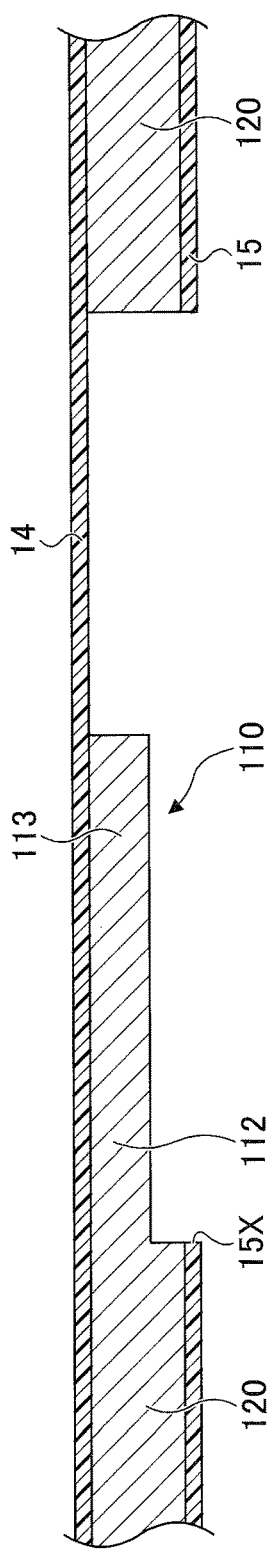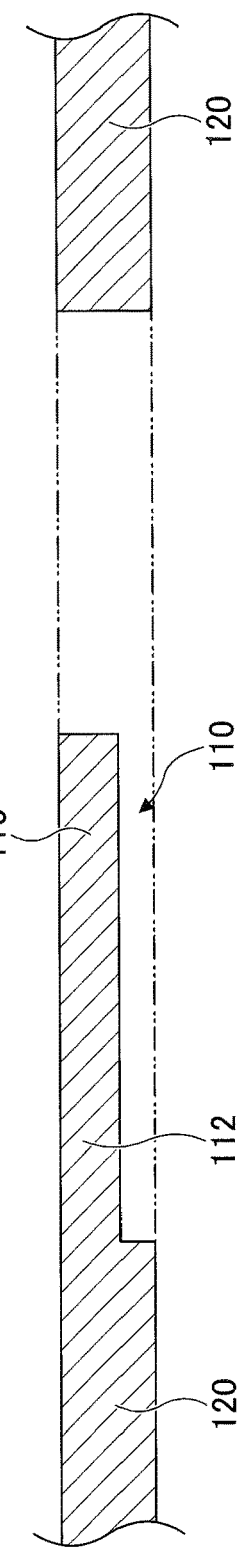

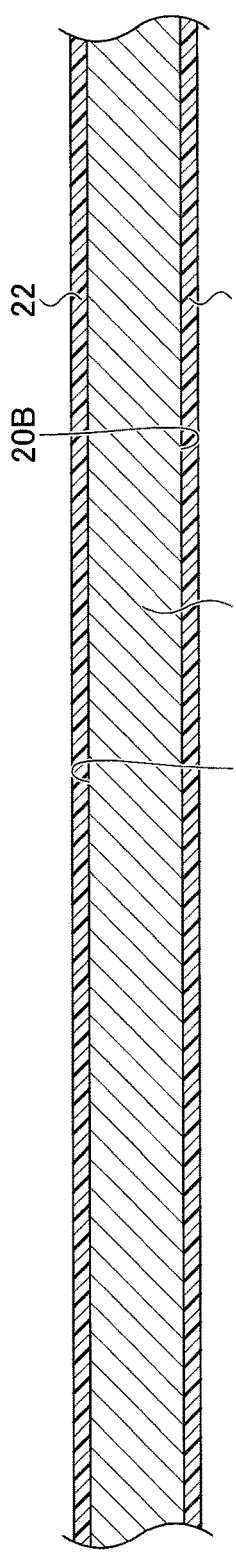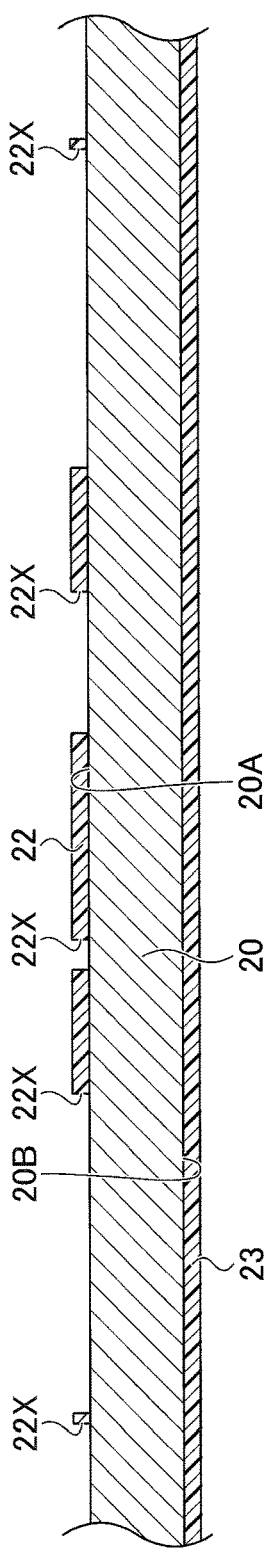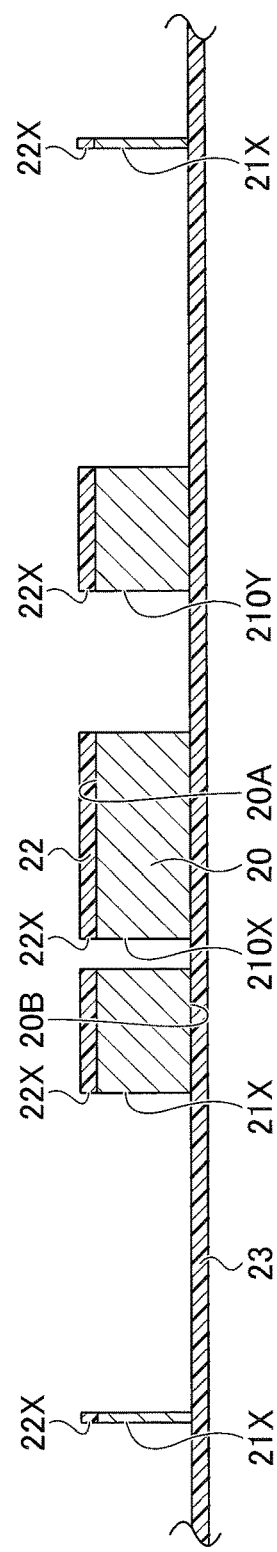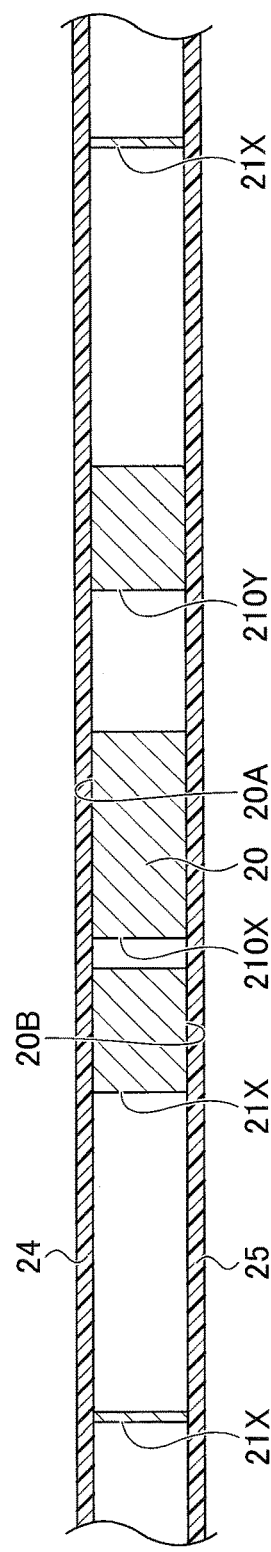

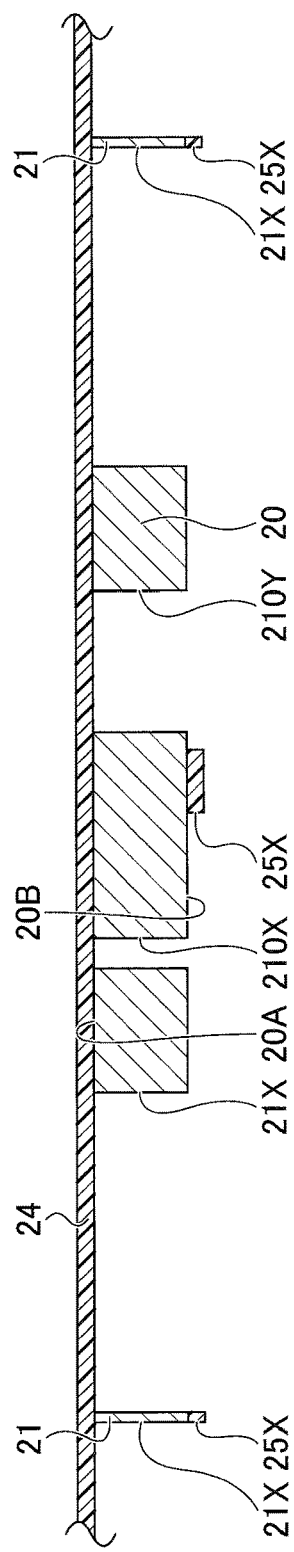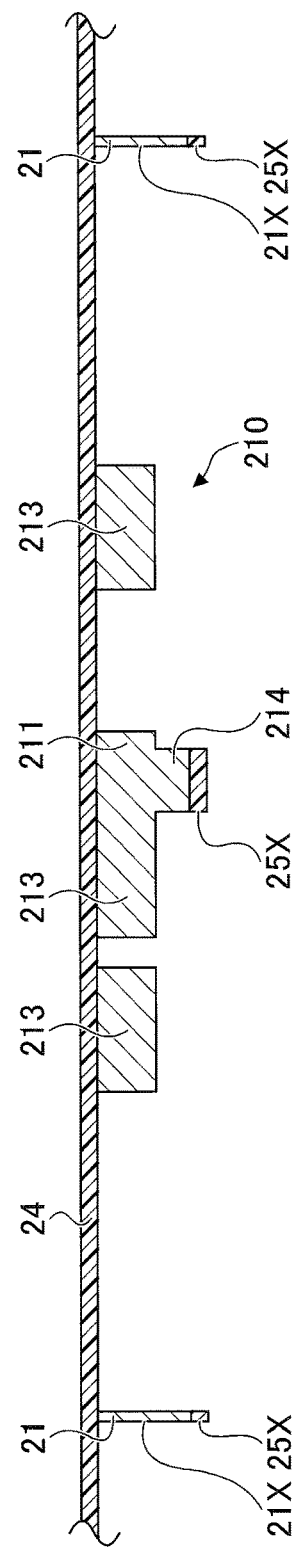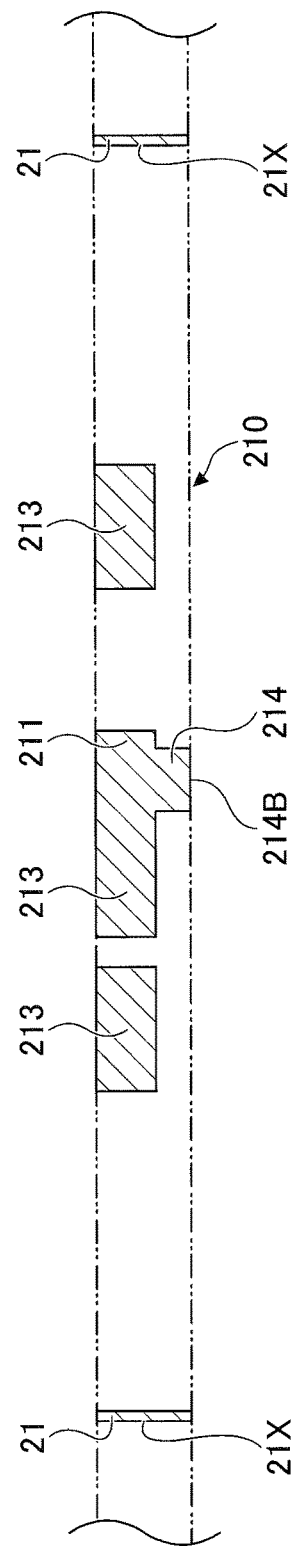

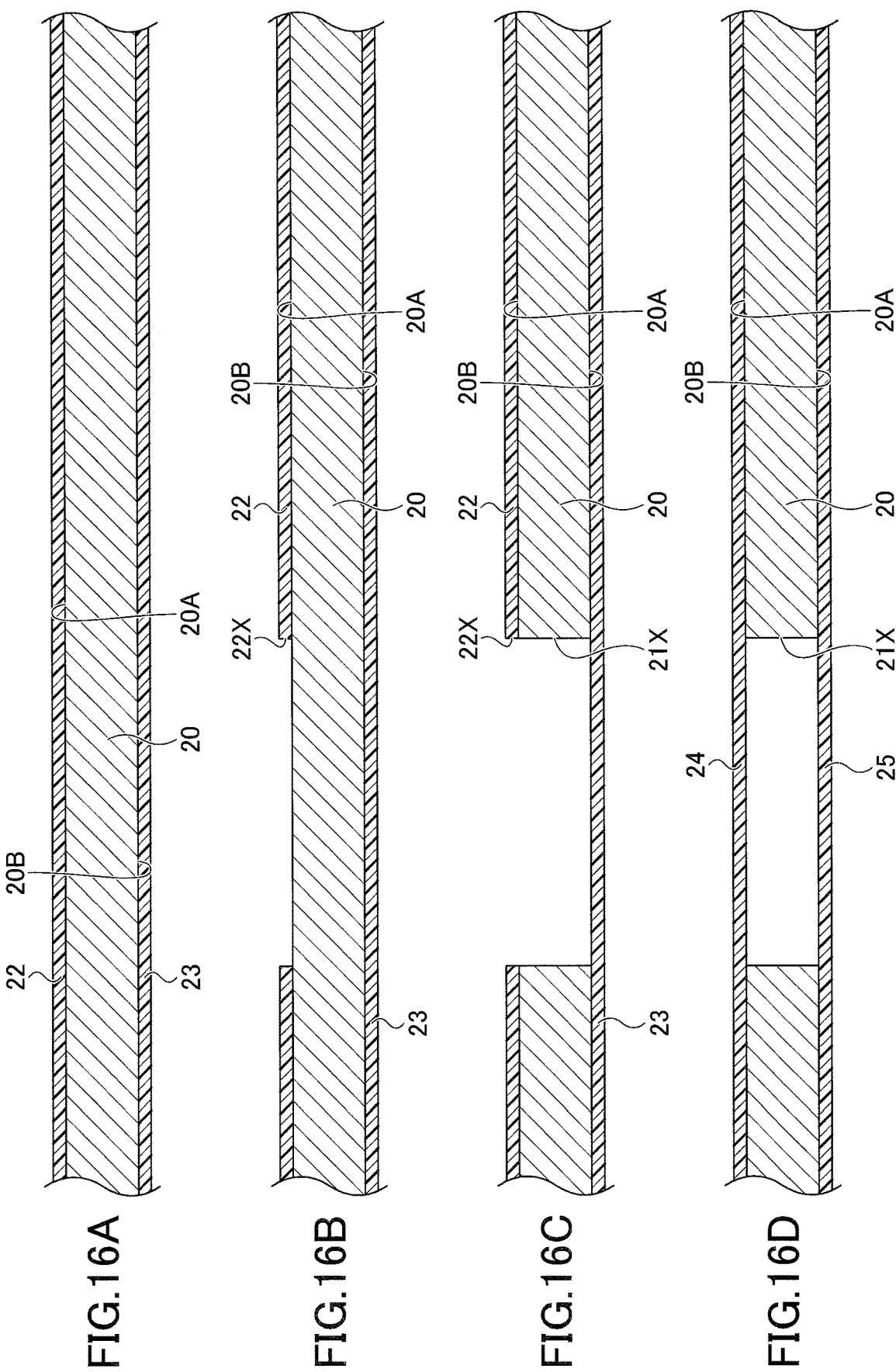

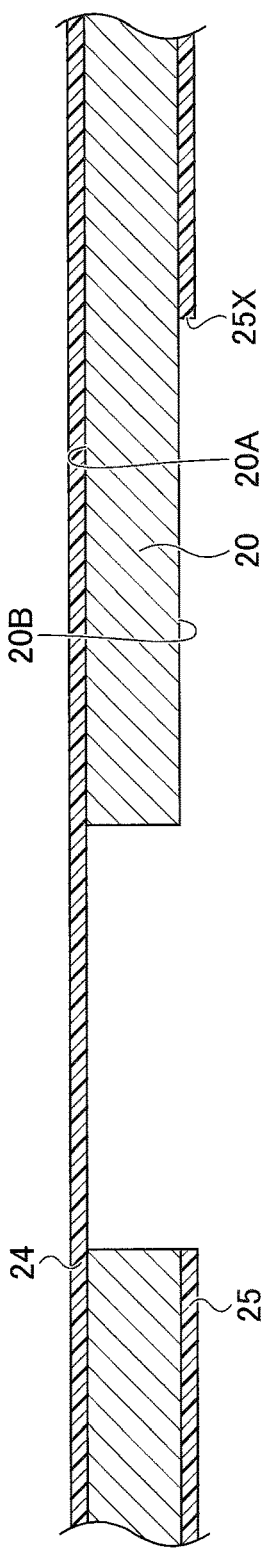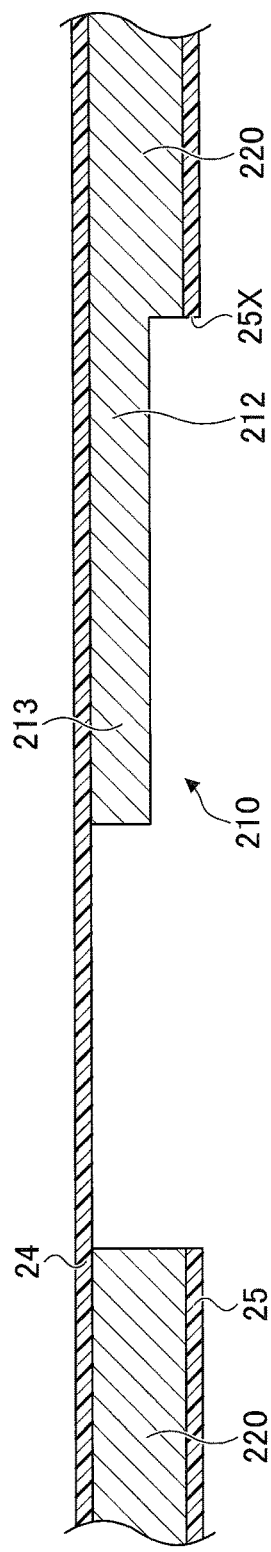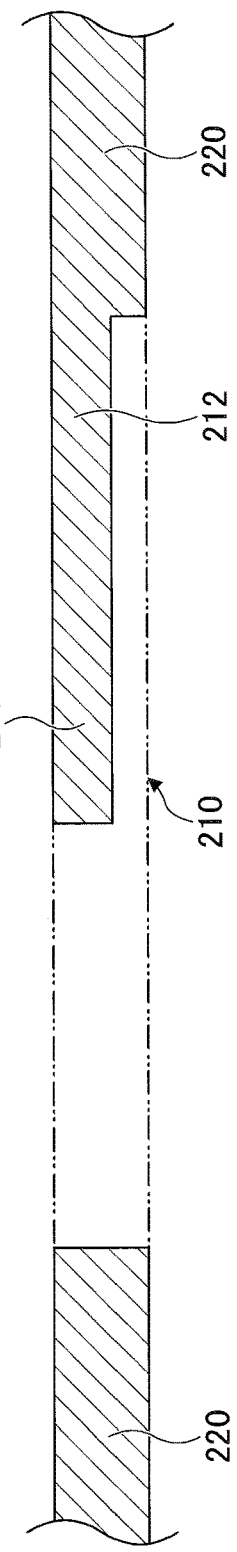

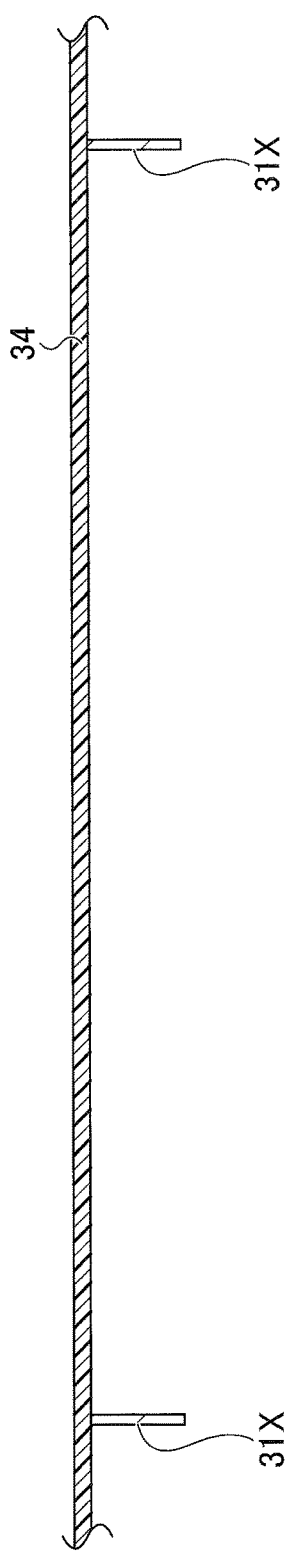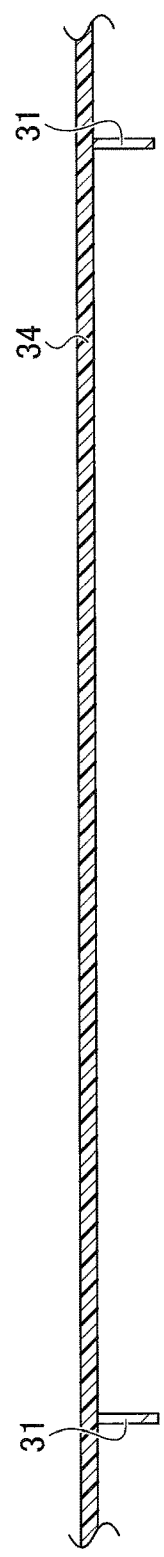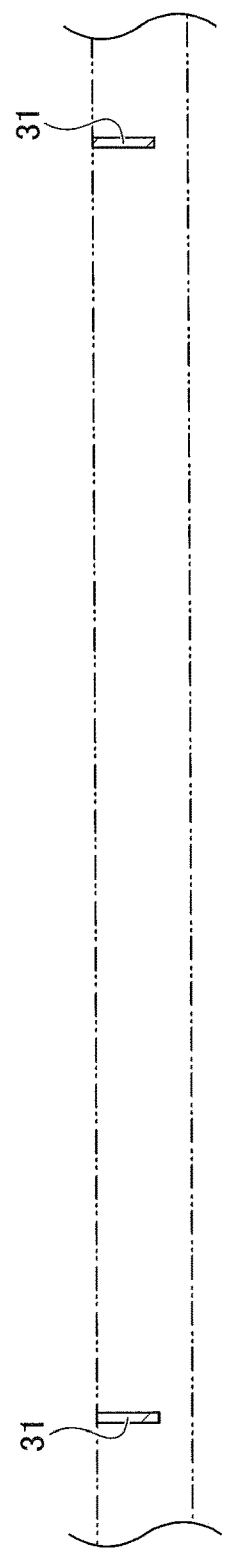

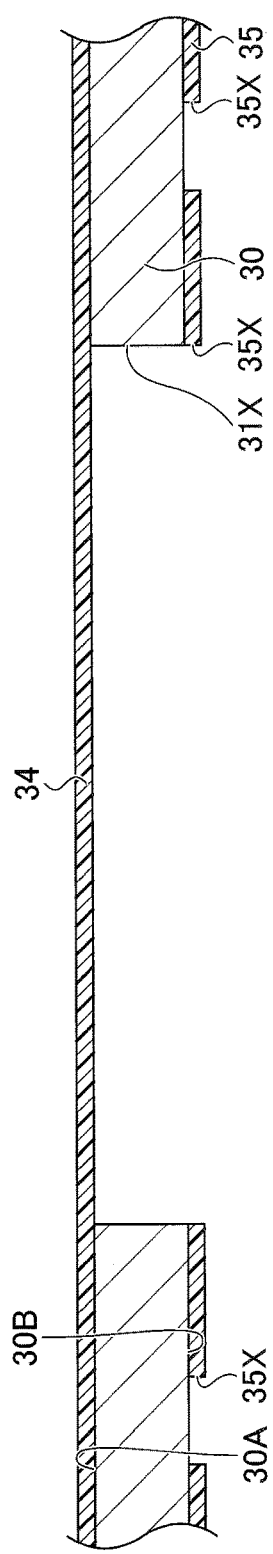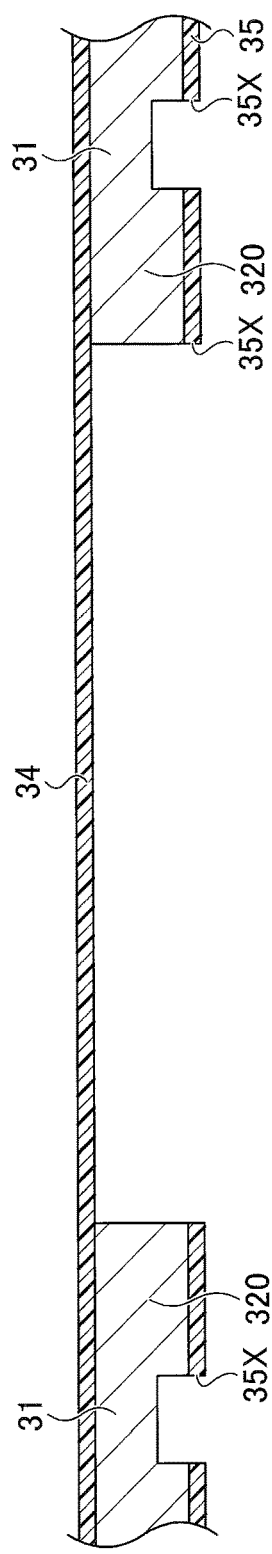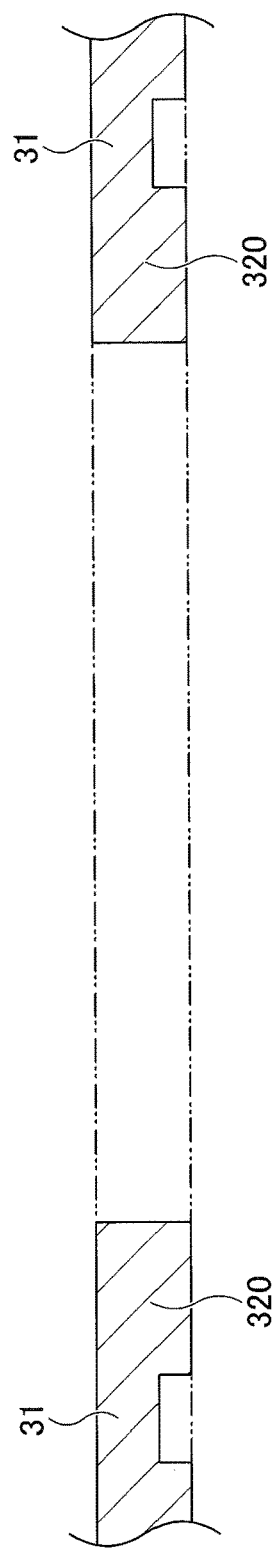

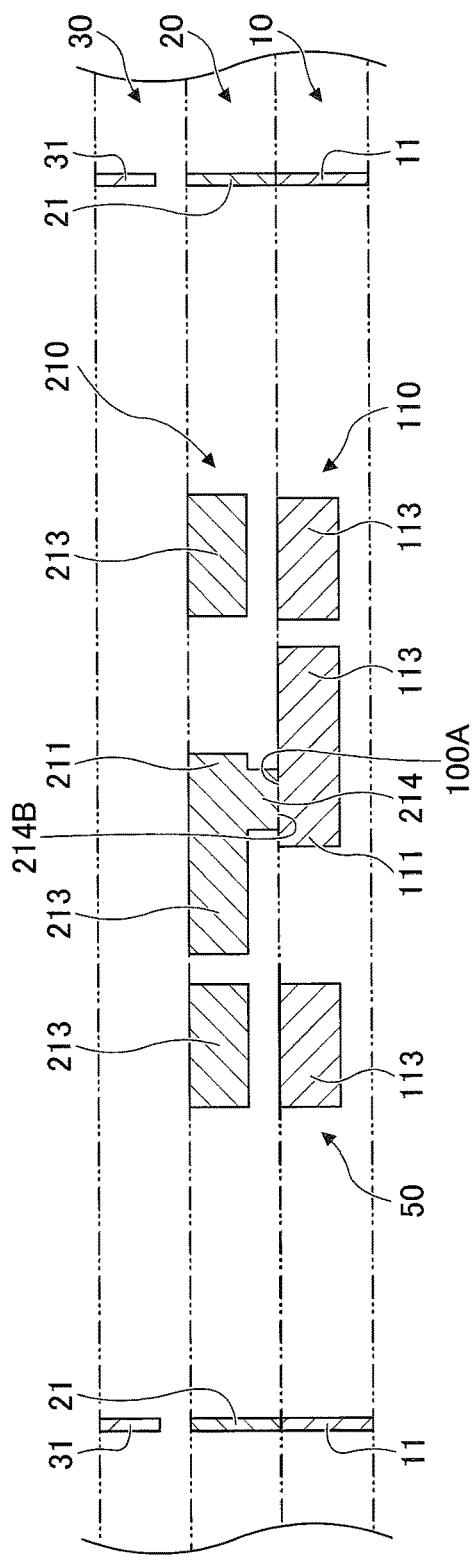
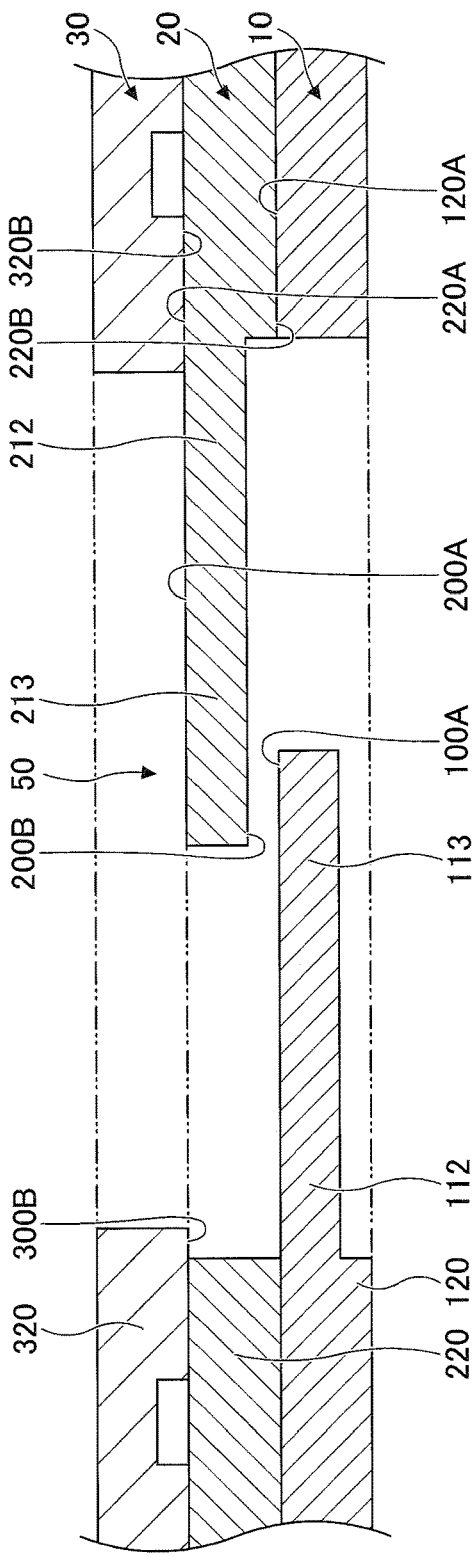
FIG.23A
FIG.23B

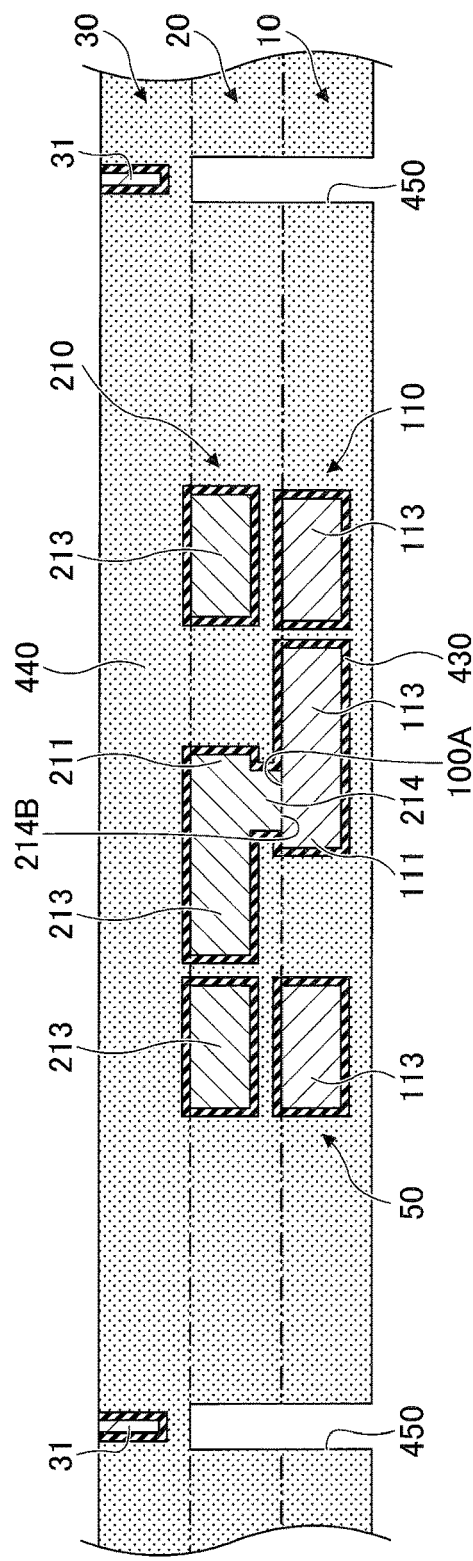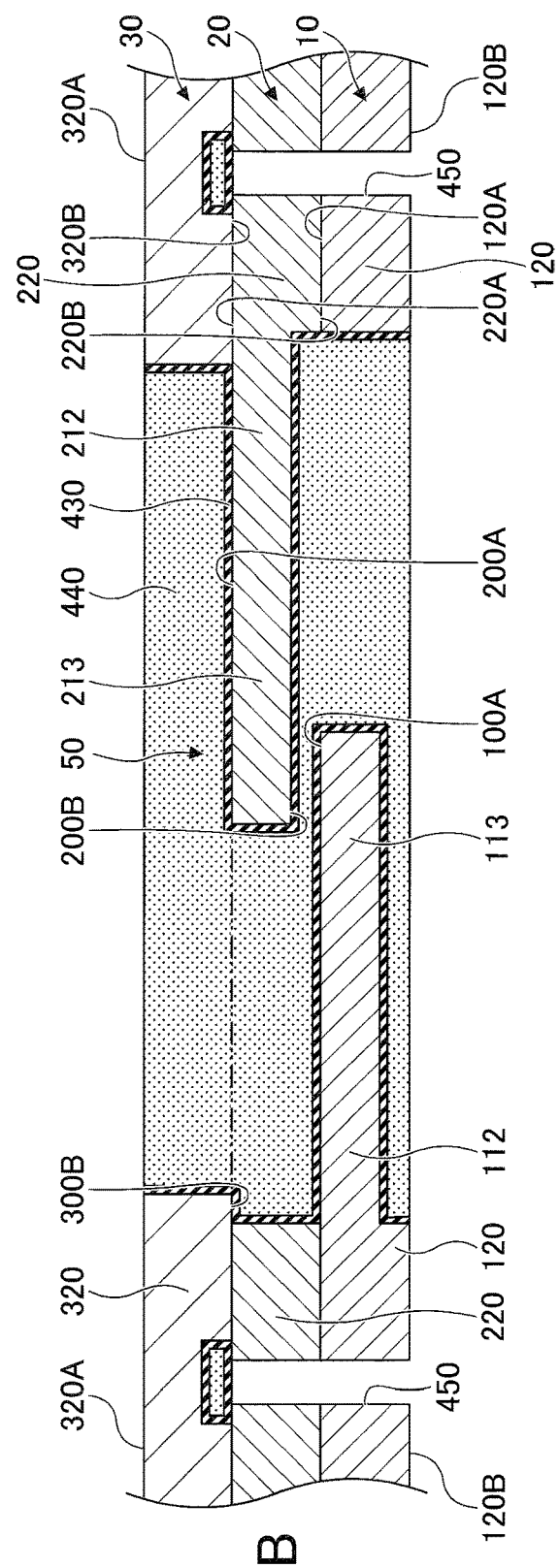
FIG.27A
FIG.27B

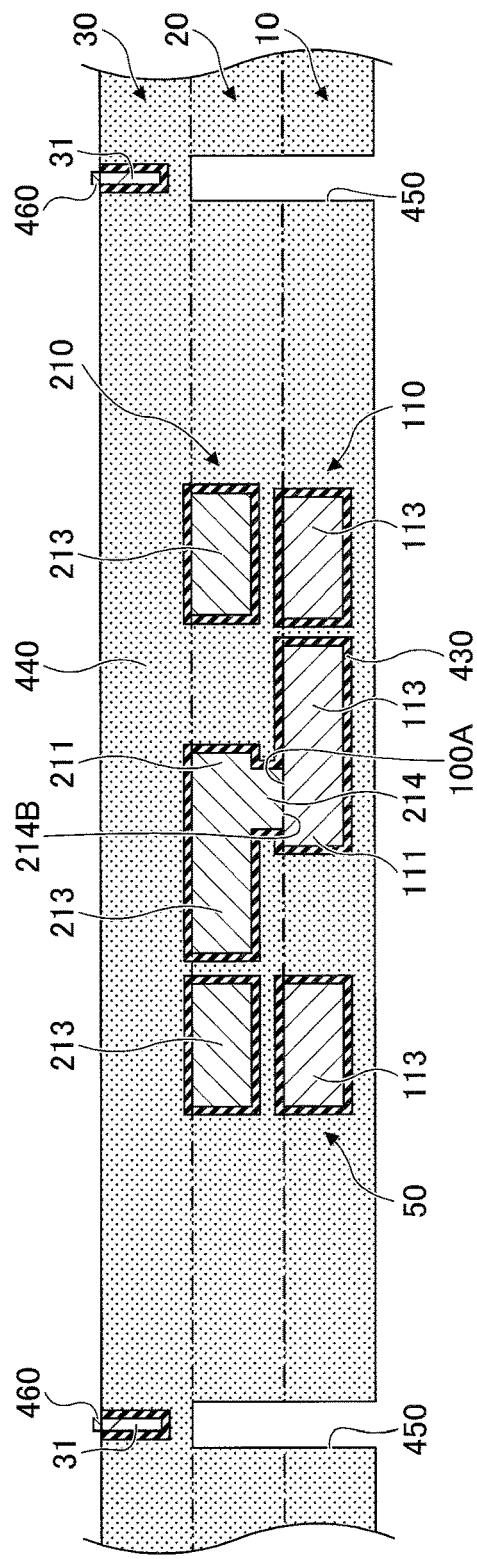
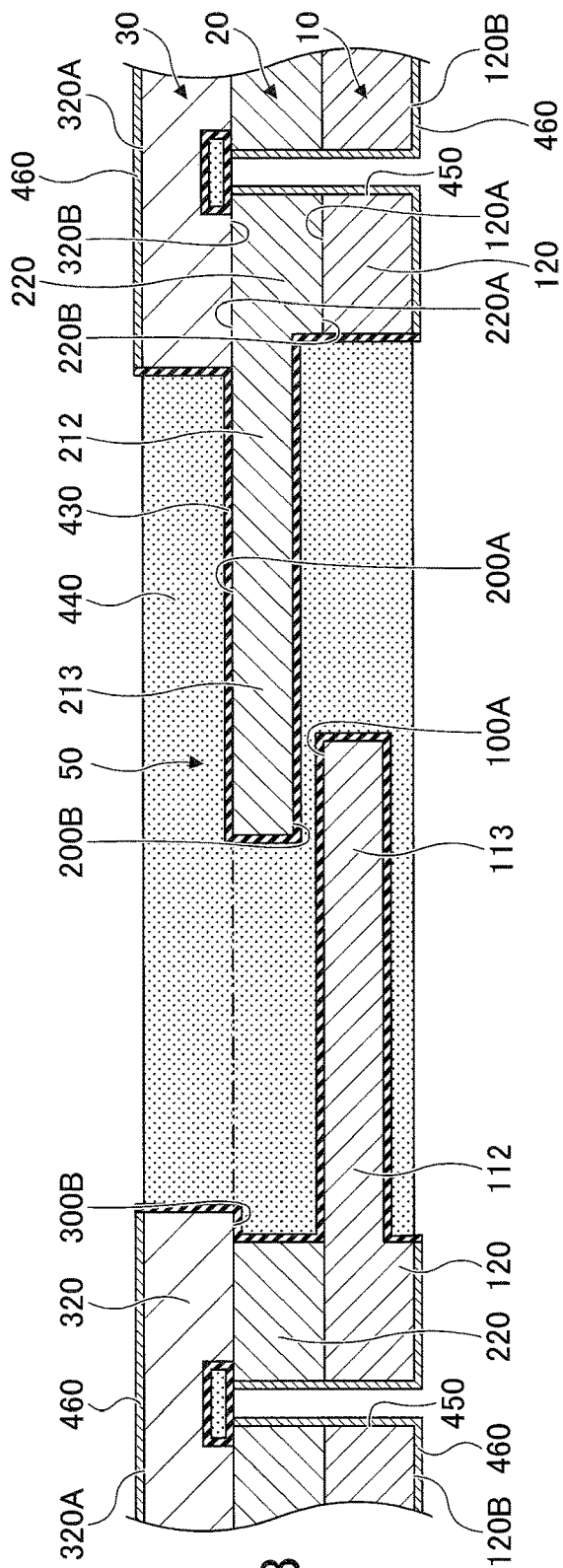
FIG.28A
FIG.28B

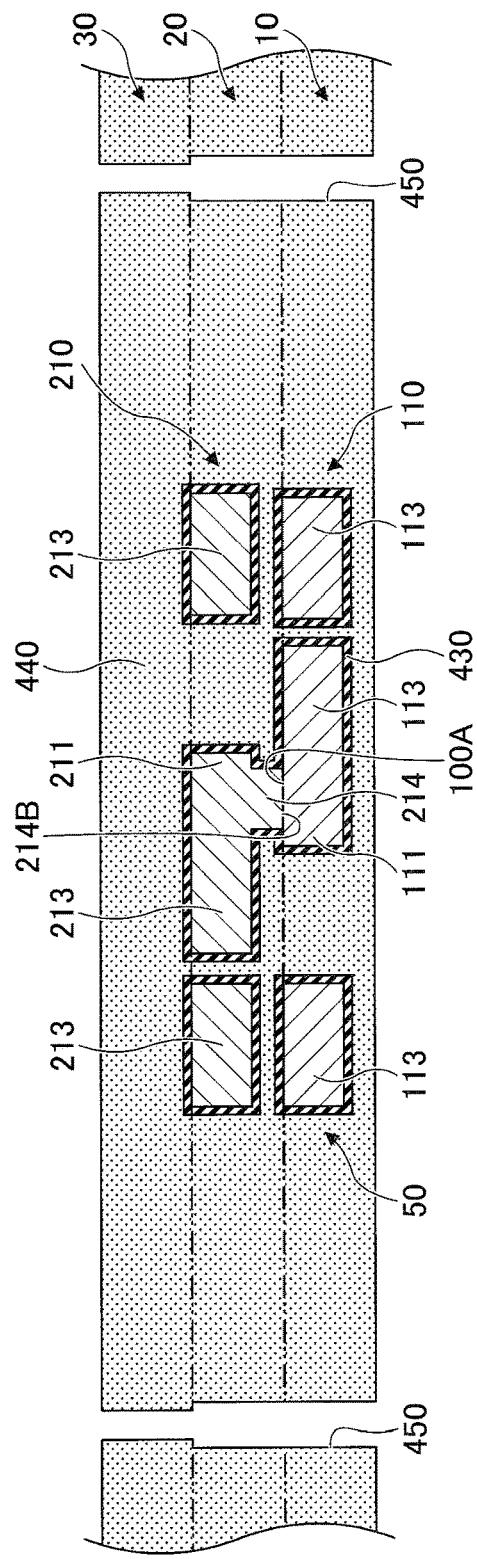
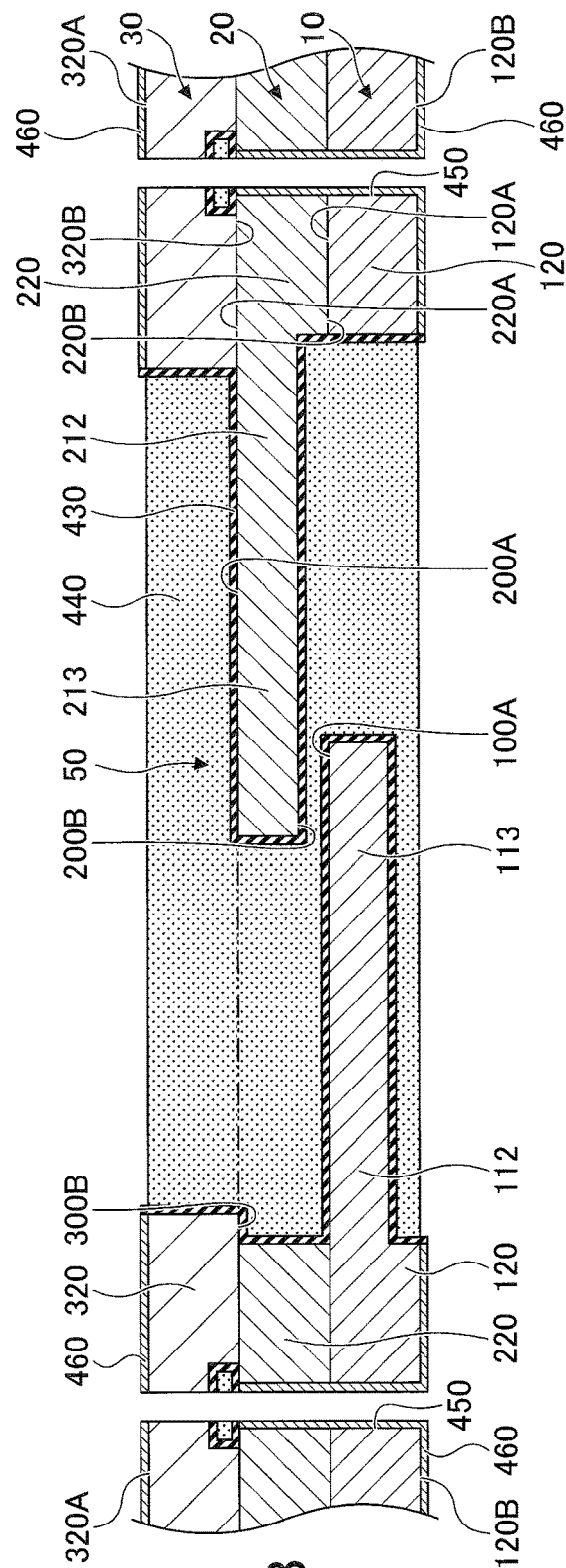
FIG.29A
FIG.29B

LAMINATED CIRCUIT BOARD, AND ELECTRONIC COMPONENT

CROSS-REFERENCE TO RELATED APPLICATION

This application is based upon and claims priority to Japanese Patent Application No. 2018-196854, filed on Oct. 18, 2018, the entire contents of which are incorporated herein by reference.

FIELD

Certain aspects of the embodiments discussed herein are related to a laminated circuit board, an electronic component, and a method of manufacturing the laminated circuit board.

BACKGROUND

A proposed DC-DC converter includes a laminated circuit board in which inductors are formed by laminating a plurality of ferrite sheets having electrode patterns and via electrodes formed thereon.

Examples of the laminated circuit board and the DC-DC converter are described in Japanese Laid-Open Patent Publication No. 2013-98187, for example.

However, according to the conventional laminated circuit board, it is difficult to form low-resistance electrode patterns on the ferrite sheets.

SUMMARY

Accordingly, it is an object in one aspect of the embodiments to provide a laminated circuit board, an electronic component, and a method of manufacturing the laminated circuit board, which can easily form a built-in low-resistance inductor.

According to one aspect of the embodiments, a laminated circuit board includes a base having a first surface, and a second surface on an opposite side from the first surface; a first metal layer provided in the base and including a first electrode exposed from the first surface; and a second metal layer provided in the base and including a second electrode exposed from the second surface, wherein the first metal layer includes an inductor electrically connected to the first electrode, and wherein the first electrode and the second electrode are bonded and electrically connected to each other.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 4 is a side view illustrating the structure of the laminated circuit board according to the first embodiment;

FIG. 10A, FIG. 10B, and FIG. 10C are cross sectional views for explaining the method of forming the metal layer illustrated in FIG. 5A and FIG. 5B;

FIG. 12A, FIG. 12B, and FIG. 12C are cross sectional views for explaining the method of forming the metal layer illustrated in FIG. 5A and FIG. 5B;

FIG. 14A, FIG. 14B, FIG. 14C, and FIG. 14D are cross sectional views for explaining the method of forming the metal layer illustrated in FIG. 6A and FIG. 6B;

FIG. 15A, FIG. 15B, and FIG. 15C are cross sectional views for explaining the method of forming the metal layer illustrated in FIG. 6A and FIG. 6B;

FIG. 16A, FIG. 16B, FIG. 16C, and FIG. 16D are cross sectional views for explaining the method of forming the metal layer illustrated in FIG. 6A and FIG. 6B;

FIG. 17A, FIG. 17B, and FIG. 17C are cross sectional views for explaining the method of forming the metal layer illustrated in FIG. 6A and FIG. 6B;

FIG. 20A, FIG. 20B, and FIG. 20C are cross sectional views for explaining the method of forming the metal layer illustrated in FIG. 7A and FIG. 7B;

FIG. 22A, FIG. 22B, and FIG. 22C are cross sectional views explaining the method of forming the metal layer illustrated in FIG. 7A and FIG. 7B;

FIG. 23A and FIG. 23B are cross sectional views for explaining a method of manufacturing the laminated circuit board according to the first embodiment;

FIG. 27A and FIG. 27B are cross sectional views for explaining the method of manufacturing the laminated circuit board according to the first embodiment;

FIG. 28A and FIG. 28B are cross sectional views for explaining the method of manufacturing the laminated circuit board according to the first embodiment;

FIG. 29A and FIG. 29B are cross sectional views for explaining the method of manufacturing the laminated circuit board according to the first embodiment;

DESCRIPTION OF EMBODIMENTS

Figure 1A:
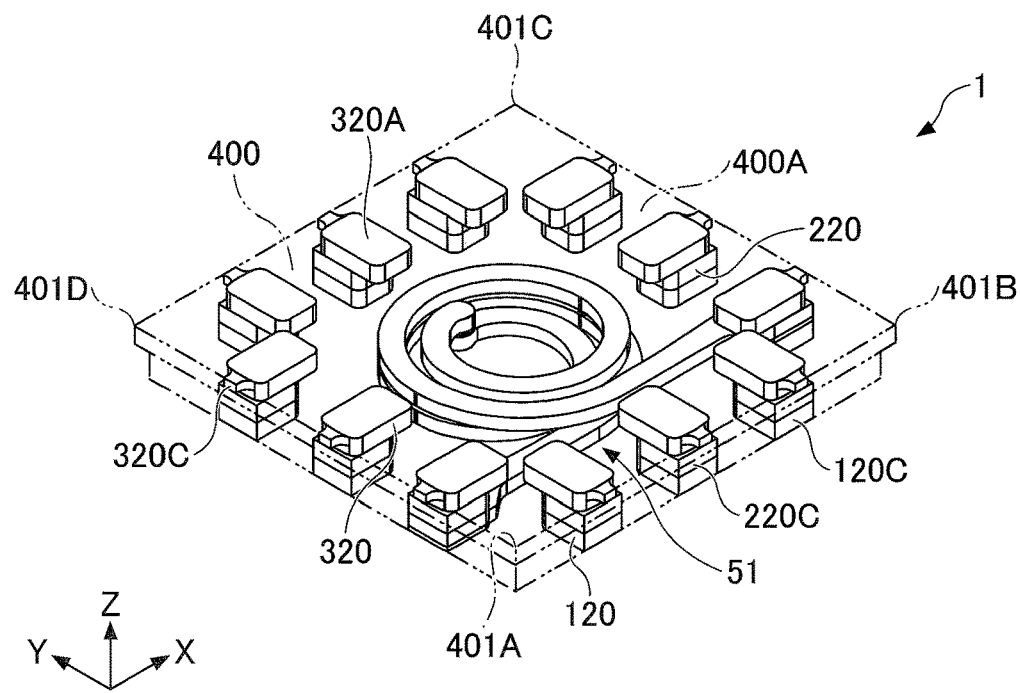
FIG. 1A and FIG. 1B are perspective views illustrating a structure of a laminated circuit board according to a first embodiment.

Preferred embodiments of the present invention will be described with reference to the accompanying drawings. In the drawings, those parts that are substantially the same are designated by the same reference numerals, and a repeated description of the same parts may be omitted. In this specification, "a plan view" of an object refers to a top view of the object, such as that illustrated in FIG. 2, for example, viewed in a vertical direction from above the object in a Z-axis direction in FIG. 1A, for example. In addition, "a planar shape" of the object refers to a shape of the object in the plan view, that is, in the top view of the object viewed in a vertical direction from above the object.

A description will now be given of a laminated circuit board, an electronic component, and a method of manufacturing the laminated circuit board according to each embodiment of the present invention.

First Embodiment

A first embodiment will be described. The first embodiment relates to a laminated circuit board 1.

[Structure of Laminated Circuit Board]

Figure 1B:
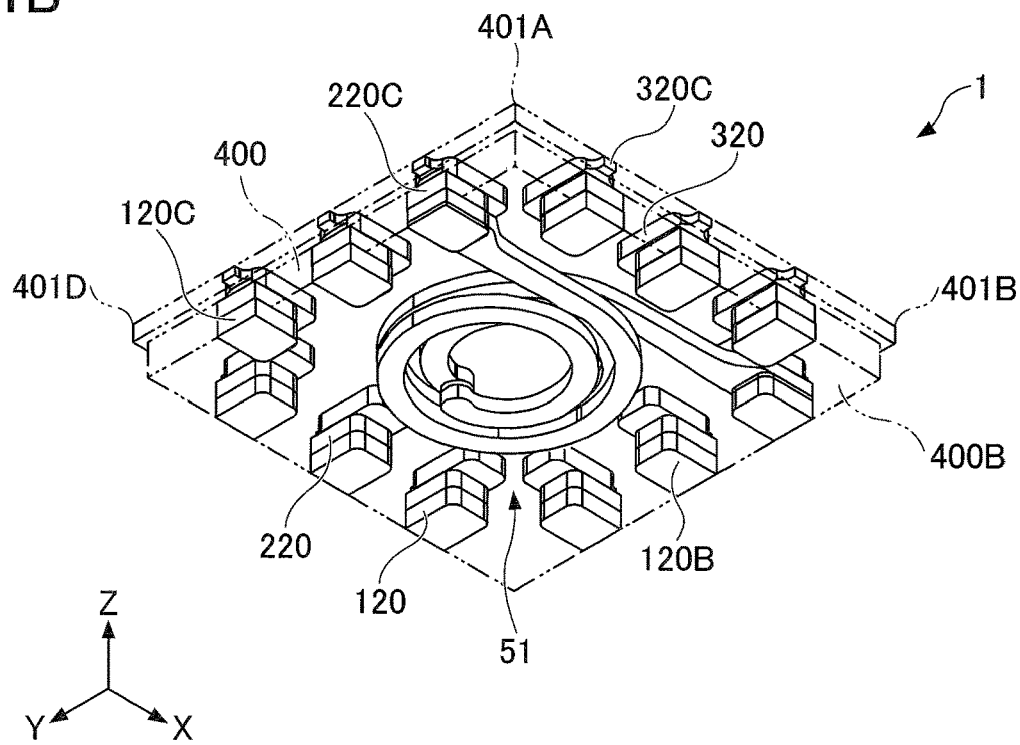
Figure 2:
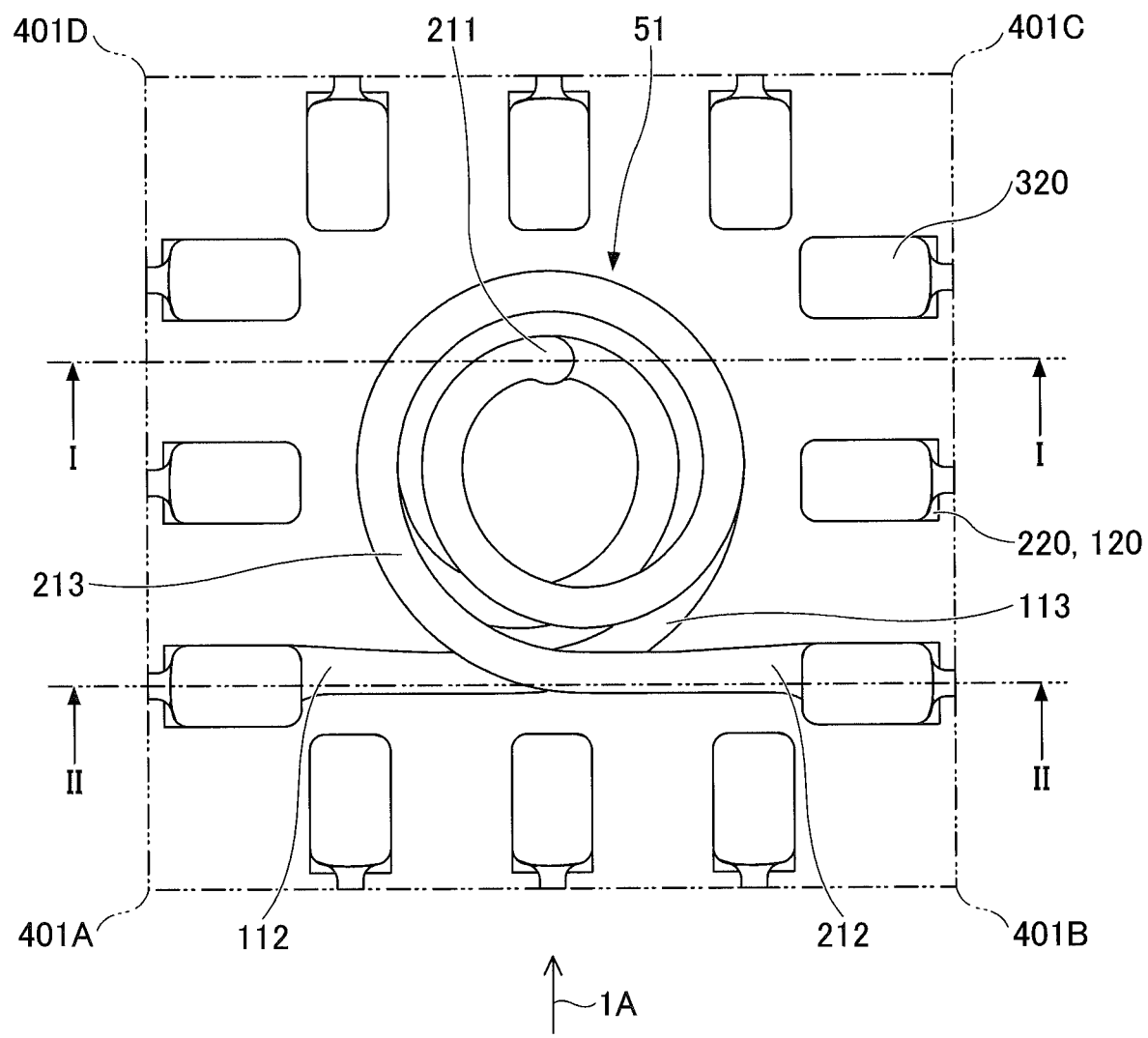
FIG. 2 is a top view illustrating the structure of the laminated circuit board according to the first embodiment.
Figure 3A:
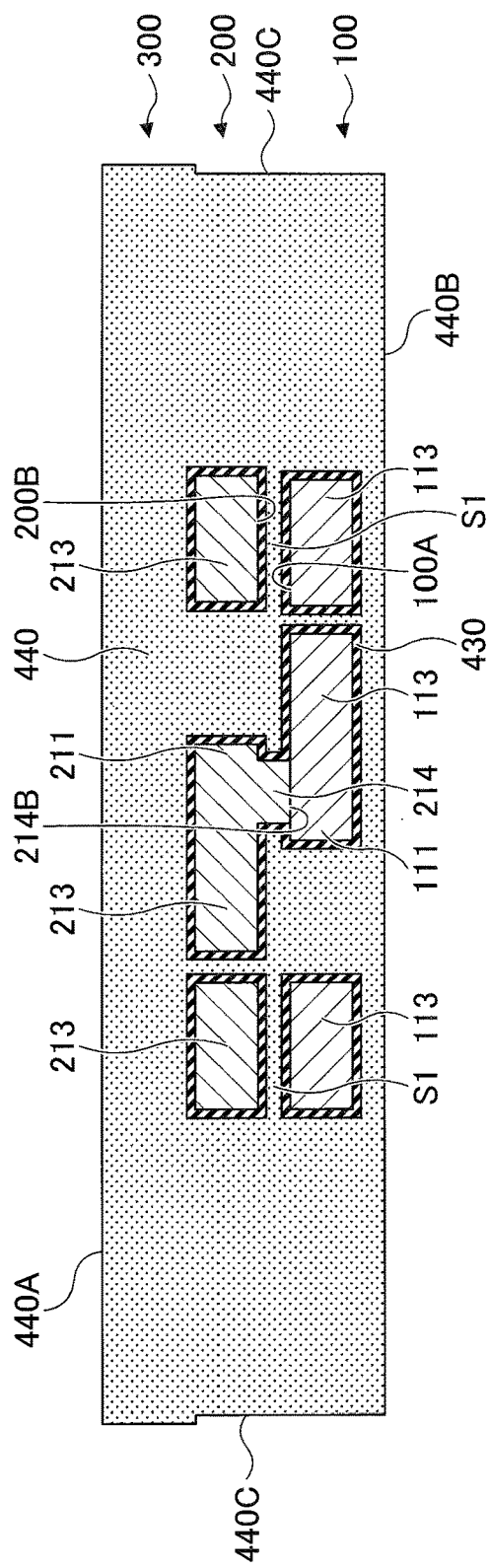
FIG. 3A and FIG. 3B are cross sectional views illustrating the structure of the laminated circuit board according to the first embodiment.
Figure 3B:
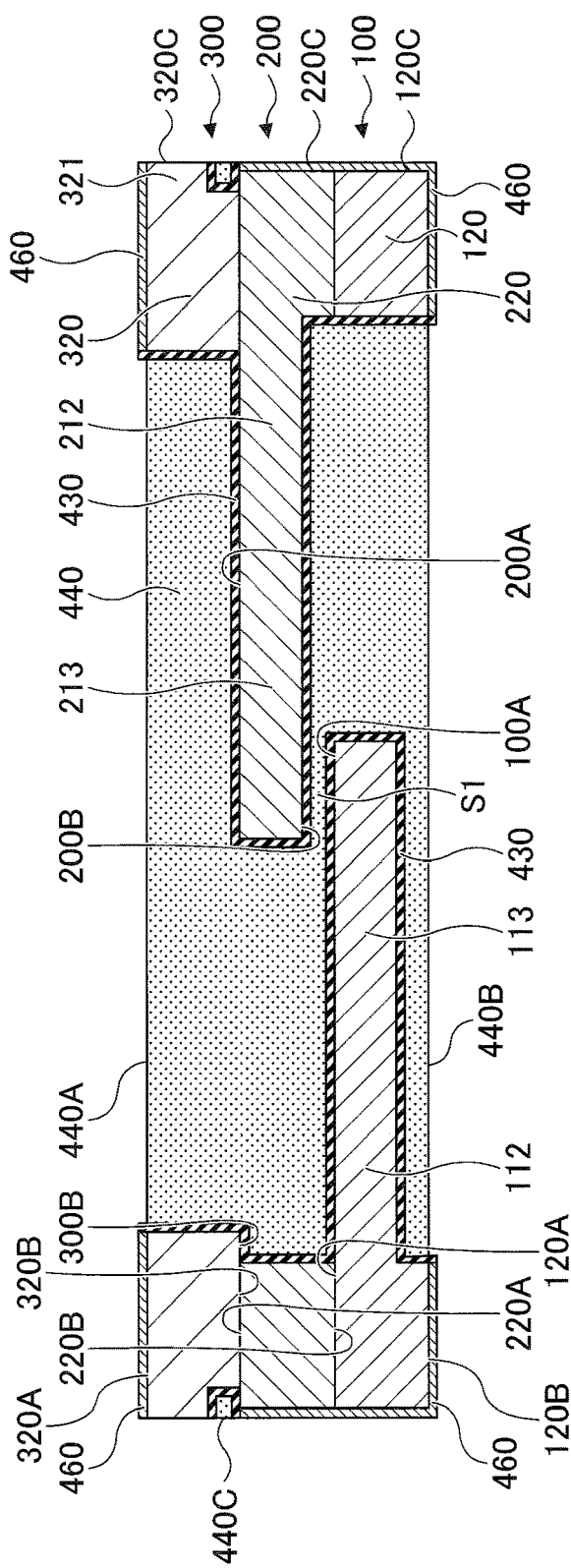

First, a structure of the laminated circuit board will be described. FIG. 1A and FIG. 1B are perspective views illustrating the structure of the laminated circuit board 1 according to the first embodiment. FIG. 1A is the perspective view of the laminated circuit board 1 viewed from above, and FIG. 1B is the perspective view of the laminated circuit board 1 viewed from below. FIG. 2 is a top view illustrating the structure of the laminated circuit board 1 according to the first embodiment. In FIG. 1A, FIG. 1B, and FIG. 2, metal layers included in the laminated circuit board 1 are illustrated by a solid line. FIG. 3A and FIG. 3B are cross sectional views illustrating the structure of the laminated circuit board 1 according to the first embodiment. FIG. 3A corresponds to the cross sectional view along a line I-I in FIG. 2, and FIG. 3B corresponds to the cross sectional view along a line II-II in FIG. 2. FIG. 4 is a side view illustrating the structure of the laminated circuit board 1 according to the first embodiment. FIG. 4 illustrates a part of the metal layers, visible in a direction indicated by an arrow 1A in FIG. 2, by a solid line.

As illustrated in FIG. 1A through FIG. 4, the laminated circuit board 1 according to the first embodiment includes a base 400, and metal layers 100, 200, and 300.

The base 400 includes a lower surface 400B and an upper surface 400A. The base 400 is formed to an approximate hexahedron shape. The base 400 may be formed to an approximate rectangular parallelepiped shape, for example, and have a thickness of approximately 300 μm to approximately 600 μm, for example. The upper surface 400A of the base 400 may have a planar shape that is a rectangular shape having sides with lengths of approximately 5 mm to approximately 10 mm, and 4 vertexes 401A, 401B, 401C, and 401D. A direction from the vertex 401A toward the vertex 401B is referred to as a X-direction, a direction from the vertex 401A toward the vertex 401D is referred to as a Y-direction, and a direction from the lower surface 400B of the base 400 toward the upper surface 400A is referred to as the Z-direction. In FIG. 4, the illustration of electrodes provided along the side between the vertexes 401A and 401B, and electrodes provided along the side between the vertexes 401C and 401D, is omitted for the sake of convenience.

The metal layer 200 is provided on the metal layer 100, and is electrically connected to the metal layer 100. The metal layer 300 is provided on the metal layer 200, and is electrically connected to the metal layer 200. The metal layers 100, 200, and 300 are provided in the base 400. The metal layers 100, 200, and 300 may be made of a metal material such as copper (Cu), Cu alloys, or the like, for example. The metal layers 100, 200, and 300 may be made of iron-nickel (Fe—Ni) alloys, such as a 42-alloy, for example.

[Structure of Metal Layer 100]

Figure 5A:
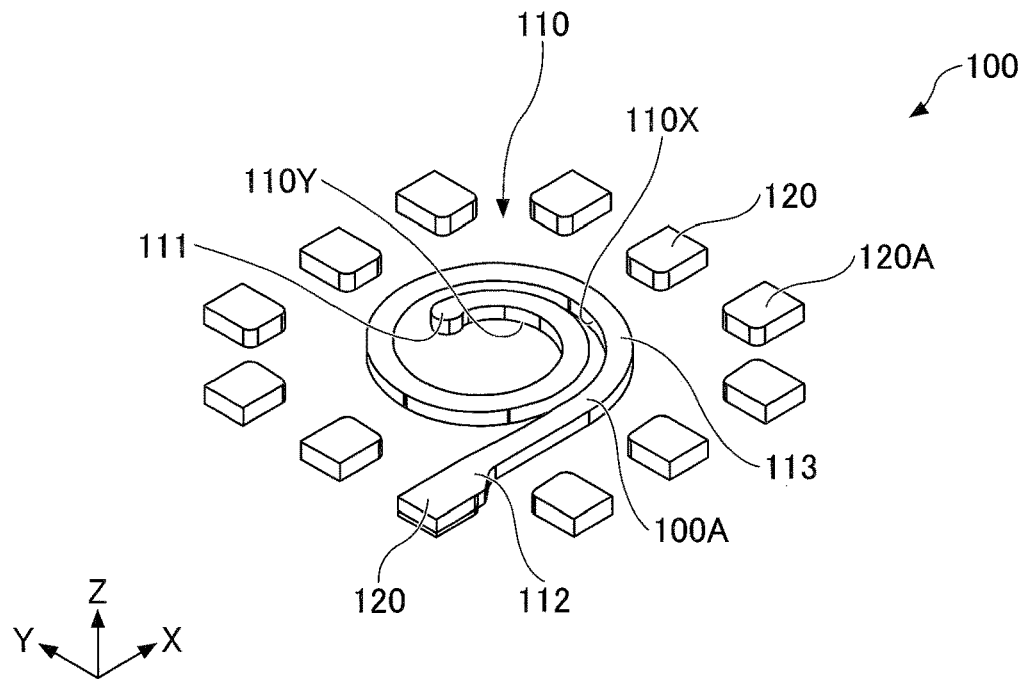
FIG. 5A and FIG. 5B are perspective views illustrating a structure of a metal layer.
Figure 5B:
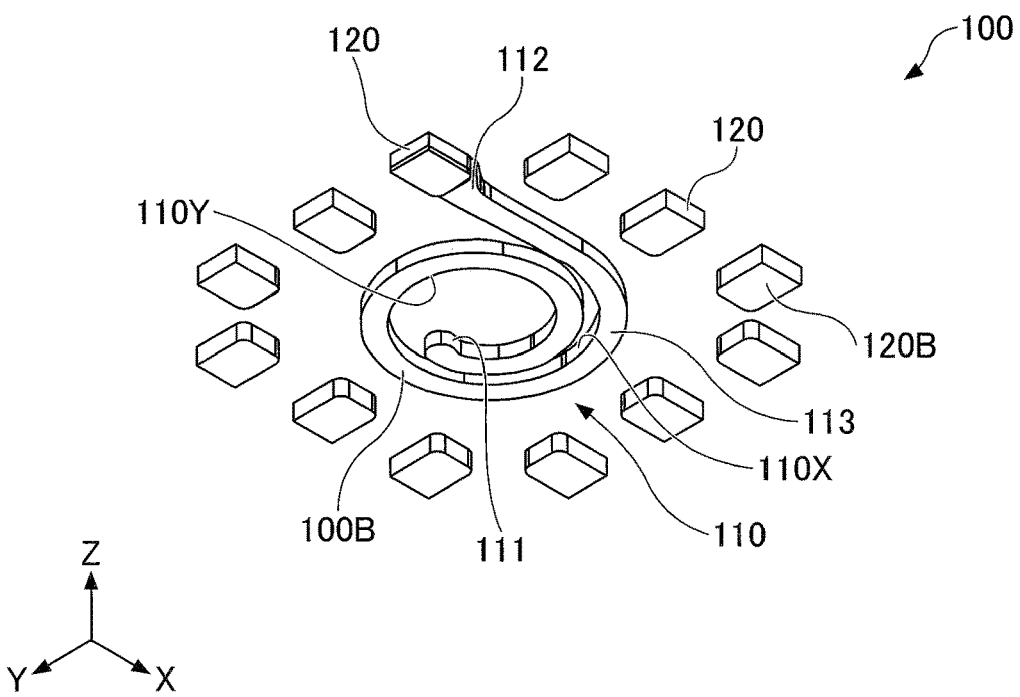

A structure of the metal layer 100 will be described. FIG. 5A and FIG. 5B are perspective views illustrating the structure of the metal layer 100. FIG. 5A is the perspective view of the metal layer 100 viewed from above, and FIG. 5B is the perspective view of the metal layer 100 viewed from below.

The metal layer 100 includes a plurality of electrode parts 120 provided along the 4 sides of the base 400, and a winding part 110 provided on an inner side of the 4 sides of the base 400 and electrically connected to one of the electrode parts 120.

As illustrated in FIG. 5A and FIG. 5B, the winding part 110 is formed to a spiral shape within the same plane (on the same plane). The winding part 110 may be formed to a circular spiral shape within the same plane, for example. In this specification, a direction along the spiral shape of the winding part 110 is referred to as a longitudinal direction, a direction perpendicular to the longitudinal direction in the plan view is referred to as a transverse direction (or width direction), and a direction perpendicular to both the longitudinal direction and the transverse direction is referred to as a thickness direction. The winding part 110 may have a rectangular spiral shape within the same plane.

An end surface of the winding part 110, that is, a cross sectional shape of the winding part 110 cut along a plane perpendicular to the longitudinal direction of the winding part 110, is formed to a rectangular shape, for example. The cross sectional shape of the winding part 110 may have a rectangular shape having short sides and long sides, for example. The winding part 110 is formed so that the short side of the rectangular cross section extends along the thickness direction, and the long side of the rectangular cross section extends along the transverse direction.

The winding part 110 includes an end part 111 on an inner periphery, an end part 112 on an outer periphery, and a conductor part 113 that extends in the spiral shape from the end part 111 toward the end part 112. The end part 111, the end part 112, and the conductor part 113 of the winding part 111 are integrally formed as a single component.

The spiral shape of the conductor part 113 is formed so that the end part 111 is located near a center of the spiral shape, and the conductor part 113 is located further away from the center of the spiral shape toward the end part 112. The spiral shape of the conductor part 113 in the plan view has right-handed (or clockwise) turns that extend toward the outer periphery relative to the center of the spiral shape. The conductor part 113 has an approximately circular spiral shape including approximately 1.5 right-handed (or clockwise) turns from the end part 111 on the inner periphery toward the end part 112 on the outer periphery.

The conductor part 113 is formed to the spiral shape so that a predetermined gap is formed between adjacent turns of the spiral shape. In other words, a spiral slit 110X is formed between the adjacent turns of the spiral shape of the conductor part 113. In addition, an opening 110Y having an approximately circular shape is formed on the inner periphery of the end part 111, that is, at a central part of the spiral shape.

The size of the conductor part 113 along the transverse direction (or width direction) may be approximately 200 µm to approximately 300 µm, for example. The size of the conductor part 113 along the thickness direction may be approximately 100 µm to approximately 200 µm, for example. The size of the slit 110X along the transverse direction may be approximately 100 µm to approximately 200 µm, for example.

The end part 111 forms a connection part that connects to the metal layer 200. The upper surface 100A of the end part 111, that is, the surface of the end part 111 opposing the metal layer 200, connects to a lower surface 214B of a projecting part 214 which will be described later. The upper surface 100A of the end part 111 is formed on the same plane as the upper surface 100A of other parts of the metal layer 100, such as the conductor part 113, the end part 112, or the like.

The plurality of electrode parts 120 are provided in an island-like arrangement on the same plane as the winding part 110. The electrode parts 120 are formed to be thicker than the winding part 110. A difference between the thickness of the electrode parts 120 and the thickness of the winding part 110 may be approximately 50 µm to approximately 100 µm, for example. An upper surface 120A of the electrode parts 120 lies on the same plane as the upper surface 100A of the winding part 110, and a lower surface 120B of the electrode parts 120 lies on a plane lower than a lower surface 100B of the winding part 110. In other words, the electrode parts 120 are formed to project below the winding part 110 within the metal layer 100.

The end part 112 of the winding part 110 is electrically connected to one of the plurality of electrode parts 120.

[Structure of Metal Layer 200]

Figure 6A:
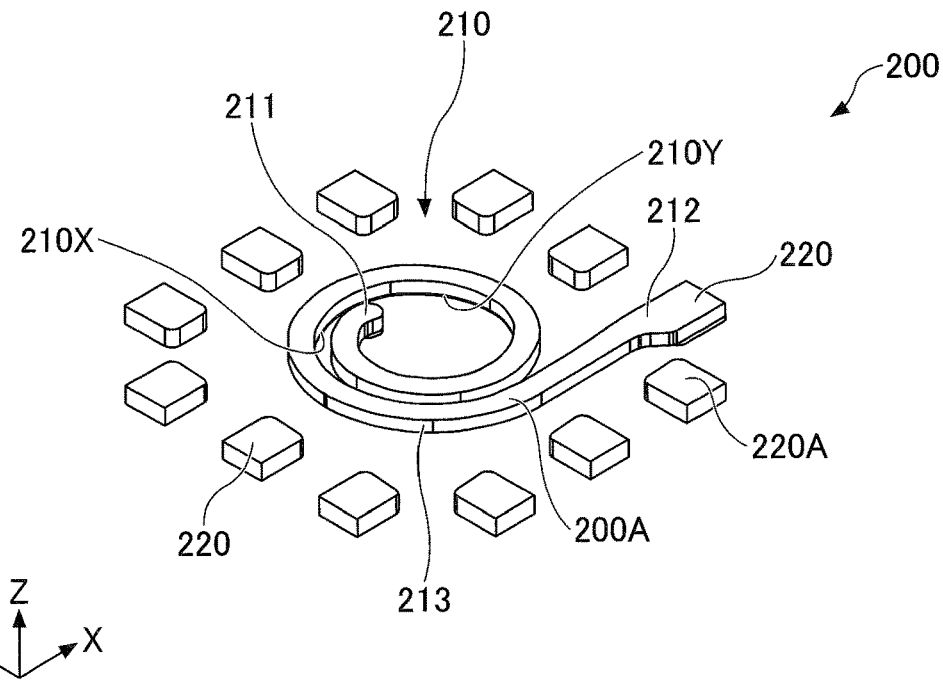
FIG. 6A and FIG. 6B are perspective views illustrating a structure of another metal layer.
Figure 6B:
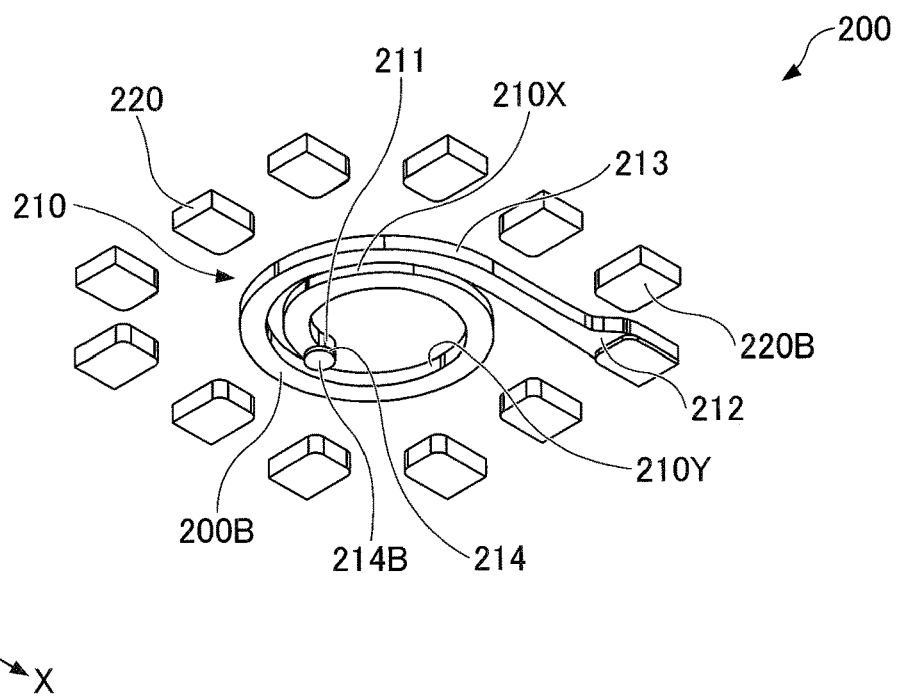

A structure of the metal layer 200 will be described. FIG. 6A and FIG. 6B are perspective views illustrating the structure of the metal layer 200. FIG. 6A is the perspective view of the metal layer 200 viewed from above, and FIG. 6B is the perspective view of the metal layer 200 viewed from below.

The metal layer 200 includes a plurality of electrode parts 220 provided along the 4 sides of the base 400, and a winding part 210 provided on the inner side of the 4 sides of the base 400 and electrically connected to one of the electrode parts 220.

As illustrated in FIG. 6A and FIG. 6B, the winding part 210 is formed to a spiral shape within the same plane (on the same plane). The winding part 210 may be formed to a circular spiral shape within the same plane, for example. In this specification, a direction along the spiral shape of the winding part 210 is referred to as a longitudinal direction, a direction perpendicular to the longitudinal direction in the plan view is referred to as a transverse direction (or width direction), and a direction perpendicular to both the longitudinal direction and the transverse direction is referred to as a thickness direction. The winding part 210 may have a rectangular spiral shape within the same plane.

An end surface of the winding part 210, that is, a cross sectional shape of the winding part 210 cut along a plane perpendicular to the longitudinal direction of the winding part 210, is formed to a rectangular shape, for example. The cross sectional shape of the winding part 210 may have a rectangular shape having short sides and long sides, for example. The winding part 210 is formed so that the short side of the rectangular cross section extends along the thickness direction, and the long side of the rectangular cross section extends along the transverse direction.

The winding part 210 includes an end part 211 on an inner periphery, an end part 212 on an outer periphery, and a conductor part 213 that extends in the spiral shape from the end part 211 toward the end part 212. The end part 211, the end part 212, and the conductor part 213 of the winding part 211 are integrally formed as a single component.

The spiral shape of the conductor part 213 is formed so that the end part 211 is located near a center of the spiral shape, and the conductor part 213 is located further away from the center of the spiral shape toward the end part 212. The spiral shape of the conductor part 213 in the plan view has left-handed (or counterclockwise) turns that extend toward the outer periphery relative to the center of the spiral shape. The conductor part 213 has an approximately circular spiral shape including approximately 1.5 left-handed (or counterclockwise) turns from the end part 211 on the inner periphery toward the end part 212 on the outer periphery.

The conductor part 213 is formed to the spiral shape so that a predetermined gap is formed between adjacent turns of the spiral shape. In other words, a spiral slit 210X is formed between the adjacent turns of the spiral shape of the conductor part 213. In addition, an opening 210Y having an approximately circular shape is formed on the inner periphery of the end part 211, that is, at a central part of the spiral shape.

The size of the conductor part 213 along the transverse direction (or width direction) may be approximately 200 µm to approximately 300 µm, for example. The size of the conductor part 213 along the thickness direction may be approximately 100 µm to approximately 200 µm, for example. The size of the slit 210X along the transverse direction may be approximately 100 µm to approximately 200 µm, for example.

The end part 211 forms a connection part that connects to the metal layer 100. The end part 211 includes the projecting part 214 that connects to the metal layer 100. The projecting part 214 is formed on the lower surface 200B of the metal layer 200, that is, the surface of the end part 211 opposing the metal layer 100, and projects toward other parts of the metal layer 200, such as the conductor part 213, the end part 212, or the like. The projecting part 214 is formed integrally on the other parts of the metal layer 200, such as the conductor layer 213, the end part 212, or the like. For example, the projecting part 214 may be formed by thinning a peripheral part of the projecting part 214 of the metal layer 200, such as the conductor part 213 or the like.

As illustrated in FIG. 6A and FIG. 6B, the projecting part 214 is formed in a columnar shape extending from the lower surface 200B of the end part 211 toward the metal layer 100. A height (or thickness) of the projecting part 214 may be approximately 50 µm to approximately 100 µm, for example. The projecting part 214 may be formed to an arbitrary planar shape having an arbitrary size. The projecting part 214 may have a planar shape that is a circular shape having a diameter of approximately 200 µm to approximately 400 µm, for example.

The lower surface 214B of the projecting part 214 is formed to a flat surface, for example. The lower surface 214B of the projecting part 214 becomes a connection surface that connects to the metal layer 100.

The plurality of electrode parts 220 are provided in an island-like arrangement on the same plane as the winding part 210, to overlap the plurality of electrode parts 120 in the plan view. The electrode parts 220 are formed to the same height (or thickness) as the projecting part 214. In other words, the electrode parts 220 are formed be thicker than the winding part 210. A difference between the thickness of the electrode parts 220 and the thickness of the winding part 210 may be approximately 50 µm to approximately 100 µm, for example. An upper surface 220A of the electrode parts 220 lies on the same plane as the upper surface 200A of the winding part 210, and a lower surface 220B of the electrode parts 220 lies on the same plane as the lower surface 214B of the projecting part 214, which is lower than the lower surface 200B of the winding part 210. In other words, the electrode parts 220 are formed to project below the winding part 210 within the metal layer 200, similar to the projecting part 214.

The metal layer 200 connects to the metal layer 100 in a state where the metal layer 200 is laminated on the metal layer 100. More particularly, the projecting part 214 that is formed on the end part 211 on the inner periphery of the metal layer 200, connects to the end part 111 on the inner periphery of the metal layer 100 on which the metal layer 200 is laminated in the vertical direction (or thickness direction). In addition, the electrode parts 220 connect to the electrode parts 120. In this state, the winding parts 110 and 210 that are vertically adjacent to each other have the spiral shapes with turns in mutually opposite directions. Hence, the winding parts 110 and 210 that are vertically adjacent to each other are connected in series, so that a current flows in the same direction through the winding parts 110 and 210. Further, as illustrated in FIG. 1A and FIG. 1B, a spiral inductor 51 that extends from the end part 112 on the outer periphery of the winding part 110 to the end part 212 on the outer periphery of the winding part 210, is formed. In other words, the end part 112 that connects to the electrode part 120 is provided on one end of the spiral inductor 51, and the end part 212 that connects to the electrode part 220 is provided on the other end of the spiral inductor 51.

As illustrated in FIG. 3A and FIG. 3B, a predetermined gap S1 is famed between the metal layer 100 and the metal layer 200 that are vertically adjacent to each other. More particularly, the gap S1, corresponding to the thickness of the projecting part 214, is formed between the upper surface 100A of the winding part 110 and the lower surface 200B of the winding part 210.

[Structure of Metal Layer 300]

Figure 7A:
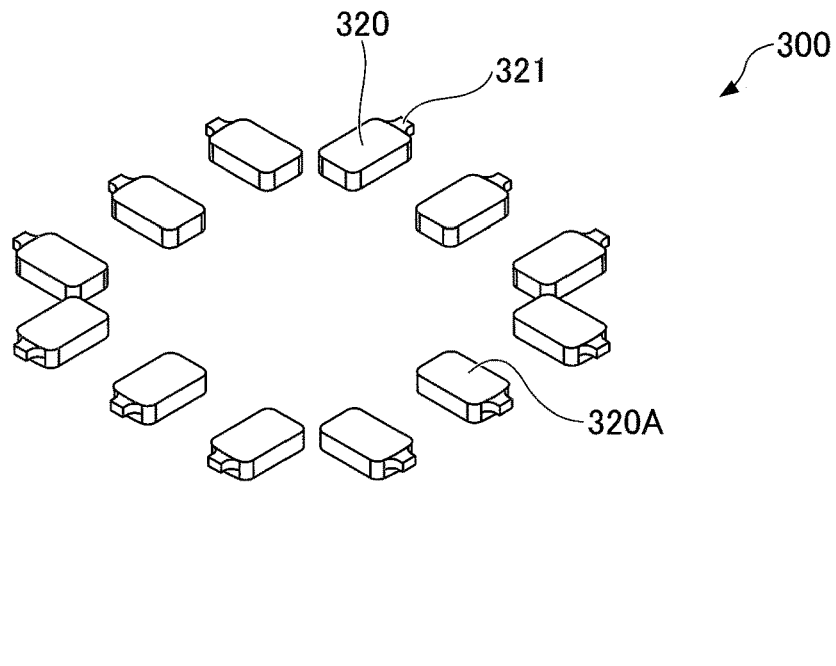
FIG. 7A and FIG. 7B are perspective views illustrating a structure of still another metal layer.
Figure 7B:
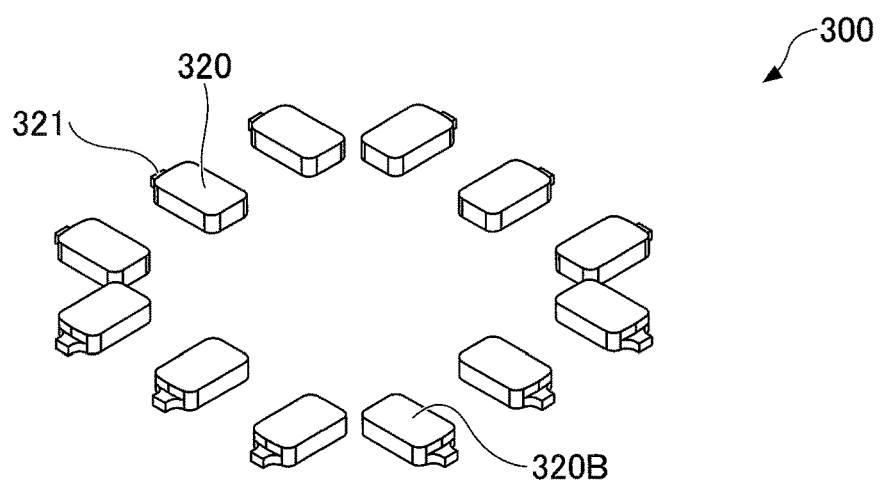

A structure of the metal layer 300 will be described. FIG. 7A and FIG. 7B are perspective views illustrating the structure of the metal layer 300. FIG. 7A is the perspective view of the metal layer 300 viewed from above, and FIG. 7B is the perspective view of the metal layer 300 viewed from below.

The metal layer 300 includes a plurality of electrode parts 320 provided along the 4 sides of the base 400. Each electrode part 320 includes a horizontal projection 321 that projects from an electrode base of the electrode part 320 toward the outer side of the base 400.

The plurality of electrode parts 320 are provided in an island-like arrangement on the same plane, to overlap the plurality of electrode parts 120 and the plurality of electrode parts 220 in the plan view. The horizontal projection 321 is formed thinner and narrower than the electrode base of the electrode part 320. An upper surface 320A of the electrode parts 320 is formed to a flat surface, and a lower surface 320B of the electrode parts 320 at the electrode base is lower than the horizontal projections 321. The horizontal projections 321 may have a thickness of approximately 100 µm to approximately 200 µm, for example. A difference between the thickness of the electrode base of the electrode parts 320 and the thickness of the horizontal projections 321 may be approximately 50 µm to approximately 100 µm, for example.

The metal layer 300 connects to the metal layer 200 in a state where the metal layer 300 is laminated on the metal layer 200. More particularly, the electrode parts 320 connect to the electrode parts 220.

[Structure of Base 400]

A structure of the base 400 will be described. As illustrated in FIG. 3A and FIG. 3B, the base 400 includes an insulating layer 430 covering the surfaces of the metal layers 100, 200, and 300, and a magnetic body 440 covering a surface of the insulating layer 430.

The insulating layer 430 and the magnetic body 440 are formed to cover the surfaces of the metal layers 100, 200, and 300, except for the following parts. In other words, the parts exposed from the insulating layer 430 and the magnetic body 440 include the lower surface 120B of the electrode parts 120, the upper surface 320A of the electrode parts 320, an end surface 120C of the electrode parts 120, an end surface 220C of the electrode parts 220, and an end surface 320C of the electrode parts 320, as illustrated in FIGS. 3A and 3B, for example.

The insulating layer 430 includes a function to reduce a short-circuit between the metal layers 100 and 200 that are vertically adjacent to each other, via a conductive material included in the magnetic body 440.

The insulating layer 430 may be made of an insulating resin, such as epoxy resins, polyimide resins, or the like, for example. The insulating layer 430 may include a filler, such as silica, alumina, or the like, for example. The insulating layer 430 may have a thickness of approximately 10 μm to approximately 30 μm, for example.

The magnetic body 440 is formed to encapsulate the inductor 51, the electrode parts 120, 220, and 320, and the insulating layer 430, as a whole. The magnetic body 440 is formed to directly cover the surface of the insulating layer 430 that covers the surfaces of the metal layers 100, 200, and 300. In other words, the magnetic body 440 covers the surfaces of the metal layers 100, 200, and 300 via the insulating layer 430. The magnetic body 440 is formed so that the metal layers 100, 200, and 300 become embedded in the magnetic body 440. That is, the metal layers 100, 200, and 300 are embedded in the magnetic body 440. For this reason, the magnetic body 440 is formed to fill the slit 110X and the opening 110Y illustrated in FIGS. 5A and 5B, and to fill the slit 210X and the opening 210Y illustrated in FIG. 6A and FIG. 6B.

An upper surface 440A of the magnetic body 440 is formed to lie on the same plane as the upper surface 320A of the electrode parts 320 and an end surface of the insulating layer 430 that covers side surfaces of the electrode parts 320, for example. An end surface 440C of the magnetic body 440 is formed to lie on the same plane as the end surface 320C of the electrode parts 320 and the end surface of the insulating layer 430 that covers the side surfaces of the electrode parts 320, at the side of the metal layer 300, for example. The end surface 440C of the magnetic body 440 is formed to lie on the same plane as the end surface 220C of the electrode parts 220 and the end surface of the insulating layer 430 that covers the side surfaces of the electrode parts 120 and 220, at the sides of the metal layers 100 and 200, for example. A lower surface 440B of the magnetic body 440 is formed to lie on the same plane as the lower surface 120B of the electrode parts 120 and the end surface of the insulating layer 430 that covers the side surfaces of the electrode parts 120, for example.

Inside the base 400, the winding parts 110 and 210 are electrically connected via the projecting part 214, to form the inductor 51. In addition, the end part 112 of the winding part 110 is electrically connected to one electrode part 120, and the end part 212 of the winding part 210 is electrically connected to another electrode part 120 via one electrode part 220. The lower surface 120B of each of these 2 electrode parts 120 is exposed from the lower surface 400B of the base 400. A laminated structure formed by the metal layers 100 and 200 forms an example of a first metal layer, and the 2 electrode parts 120 form an example of first electrodes. As will be described later in conjunction with a second embodiment, the first electrodes may be used as external electrodes of an electronic component. The electrode part 120 that is not electrically connected to the inductor 51 may also be used as an example of the external electrode.

In addition, the electrode parts 320 of the metal layer 300 are electrically connected to the electrode parts 220 of the metal layer 200, and the upper surface 320A of the electrode parts 320 is exposed from the upper surface 400A of the base 400. The metal layer 300 forms an example of a second metal layer, and the electrode parts 320 form an example of second electrodes. As will be described later in conjunction with the second embodiment, the second electrodes may be used as internal electrodes of the electronic component.

As illustrated in FIG. 3B, a plated layer 460 is formed on the lower surface 120B and the end surface 120C of the electrode parts 120, the end surface 220C of the electrode parts 220, and the upper surface 320A of the electrode parts 320. The plated layer 460 has a structure in which a nickel (Ni) layer, a palladium (Pd) layer, and a gold (Au) layer are laminated in this order, for example. The plated layer 460 may have a structure in which the Ni layer and the Au layer are laminated in this order, for example. The plated layer 460 may have a structure in which the Ni layer and a silver (Ag) layer are laminated in this order, for example. The plated layer 460 may have a structure in which the Ni layer and a tin (Sn) layer are laminated in this order, for example.

[Method of Manufacturing Laminated Circuit Board 1]

Next, a method of manufacturing the laminated circuit board 1 will be described. For the sake of convenience, parts forming constituent elements of the final, completed laminated circuit board 1 will be designated by the reference numerals of the final constituent elements.

[Method of Forming Metal Layer 100]

Figure 8A:
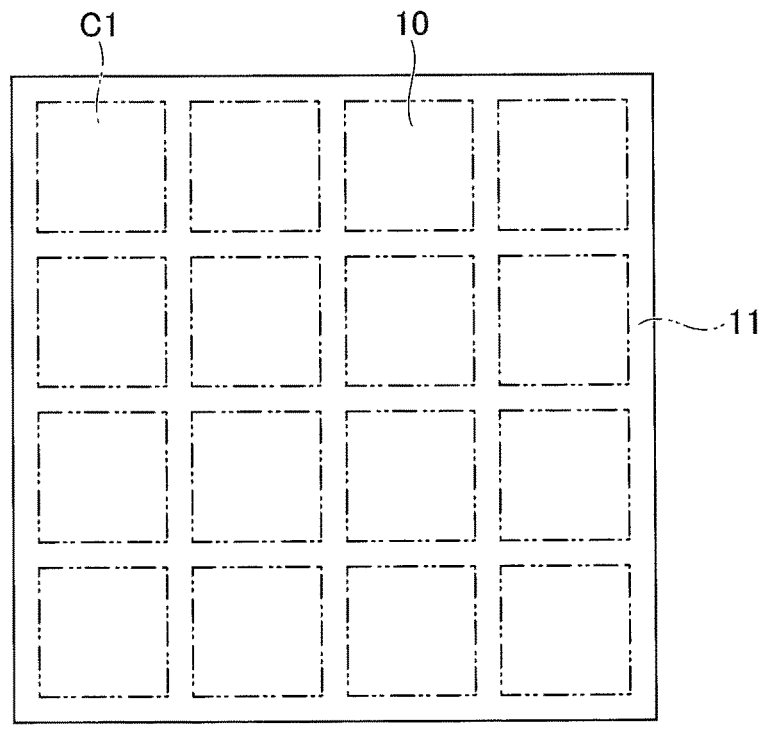
FIG. 8A and FIG. 8B are diagrams for generally explaining a method of forming the metal layer illustrated in FIG. 5A and FIG. 5B.
Figure 8B:
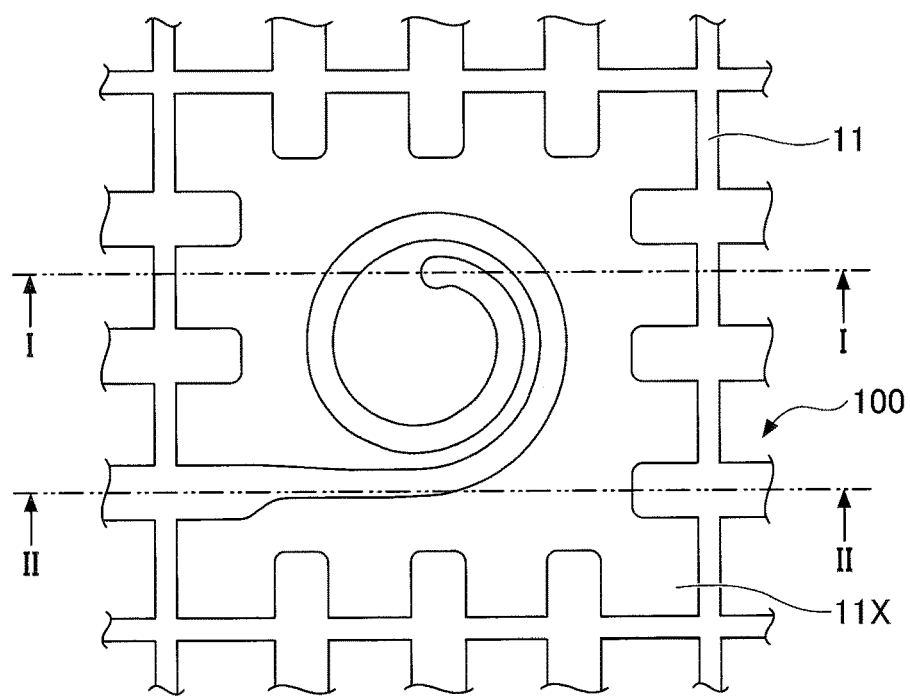

First, a method of forming the metal layer 100 will be described. FIG. 8A and FIG. 8B are diagrams for generally explaining the method of forming the metal layer 100 illustrated in FIG. 5A and FIG. 5B.

In a process illustrated in FIG. 8A, a metal plate 10 is prepared. The metal plate 10 includes a plurality of individual regions C1. The plurality of individual regions C1 are arranged in a matrix arrangement (4×4 matrix arrangement), for example. As illustrated in FIG. 8B, the metal layer 100 is formed by performing the following manufacturing process on each of the individual regions C1. The metal layer 100 formed in each of the individual regions C1 is electrically connected to a connecting part 11 that is provided between 2 mutually adjacent individual regions C1, for example. In addition, an opening 11X that defines each metal layer 100 is formed between adjacent connecting parts 11. The individual regions C1 are segmented into individual pieces by removing the connecting part 11, and the individual pieces form the individual metal layers 100. The plurality of individual regions C1 may be arranged at predetermined intervals, as illustrated in FIG. 8A, or may be arranged adjacent to each other.

The metal plate 10 may be formed by a Cu plate having a thickness of approximately 150 μm to approximately 250 μm, for example. Of course, the material used for the metal plate 10 is not limited to Cu, and materials such as Cu alloys, Fe—Ni alloys such as the 42-alloy, or the like, for example, may be used for the metal plate 10.

Next, a method of forming the metal layer 100 in each individual region C1 will be described. FIG. 9A through FIG. 12C are cross sectional views for explaining the method of forming the metal layer 100 illustrated in FIG. 5A and FIG. 5B. FIG. 9A through FIG. 10C are cross sectional views along a line I-I in FIG. 8B, and FIG. 11A through FIG. 12C are cross sectional views along a line II-II in FIG. 8B. For the sake of convenience, the following description focuses on one individual region C1.

Figure 9A:
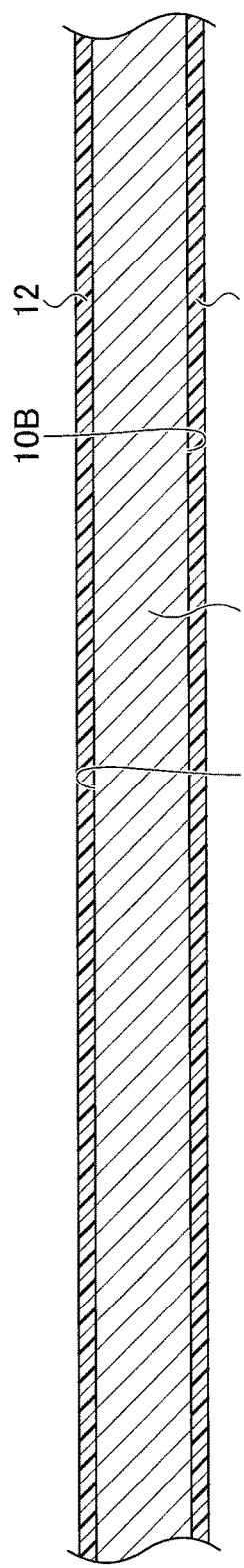
FIG. 9A, FIG. 9B, FIG. 9C, and FIG. 9D are cross sectional views for explaining the method of forming the metal layer illustrated in FIG. 5A and FIG. 5B.
Figure 11A:
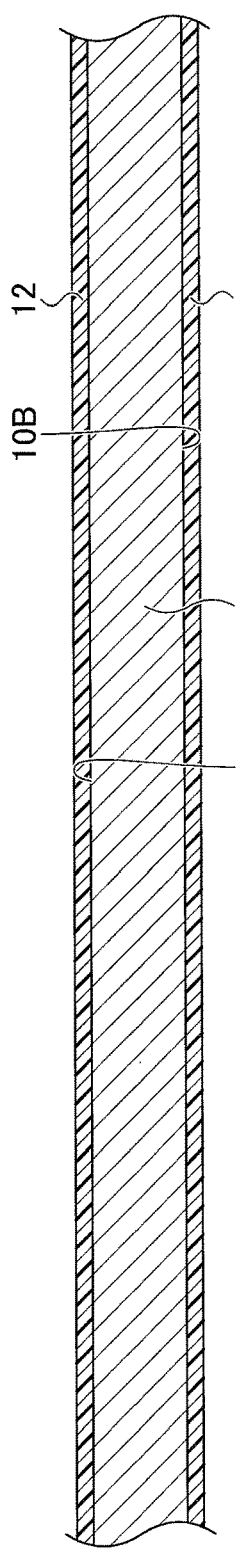
FIG. 11A, FIG. 11B, FIG. 11C, and FIG. 11D are cross sectional views for explaining the method of forming the metal layer illustrated in FIG. 5A and FIG. 5B.

In a process illustrated in FIG. 9A and FIG. 11A, a resist layer 12 is formed to cover an entire upper surface 10A of the metal plate 10 that is prepared in a process illustrated in FIG. 8A, and a resist layer 13 is formed to cover an entire lower surface 10B of the metal plate 10. The material used for the resist layer 12 may be a material having an etching resistance with respect to an etching process of a next process, for example. Examples of materials that may be used for the resist layer 12 include photosensitive dry film resists, liquid photoresists, or the like, for example. The photosensitive dry film resists may include dry film resists of novolac reins, acrylic resins, or the like, for example. In addition, the liquid photoresists may include liquid photoresists of novolac reins, acrylic resins, or the like, for example. When using the photosensitive dry film resist for the resist layer 12, the resist layer 12 may be formed by laminating the photosensitive dry film on the upper surface 10A of the metal plate 10 by thermocompression bonding, for example. The material used for the resist layer 13 may be similar to the material used for the resist layer 12. When using the photosensitive dry film resist for the resist layer 13, the resist layer 13 may be formed by laminating the photosensitive dry film on the lower surface 10B of the metal plate 10 by thermocompression bonding, for example.

Figure 9B:
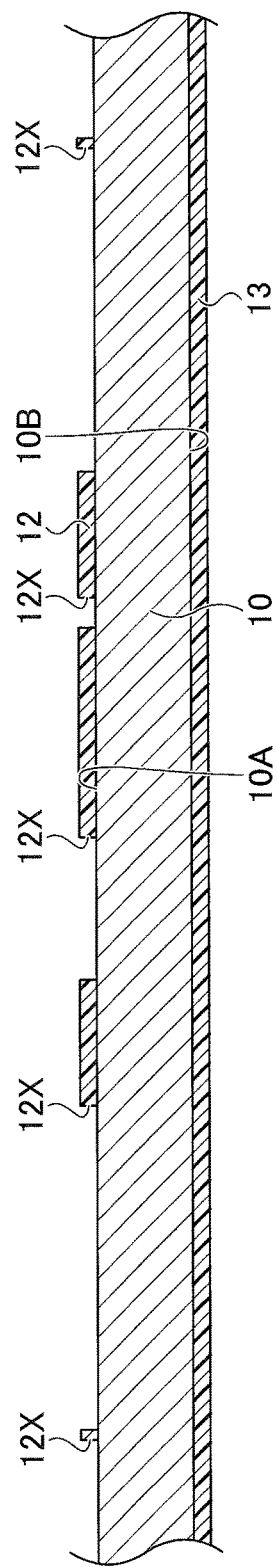
Figure 11B:
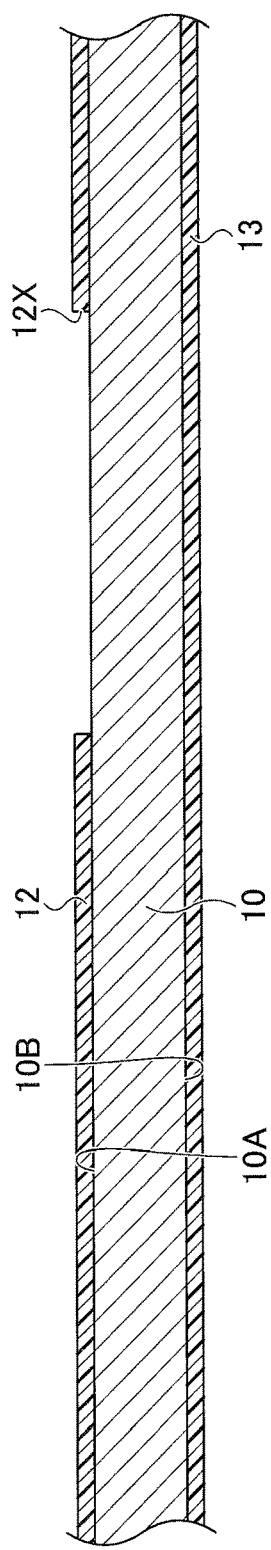

Next, in a process illustrated in FIG. 9B and FIG. 11B, the resist layer 12 is patterned using the photolithography technique, for example, to form an opening pattern 12X in the resist layer 12. The opening pattern 12X is formed to expose the upper surface 10A of the metal plate 10 at parts corresponding to other than the connecting part 11, the winding part 110, and the electrode parts 120. In other words, the resist layer 12 including the opening pattern 12X is formed to cover the upper surface 10A of the metal plate 10 at parts corresponding to the connecting part 11, the winding part 110, and the electrode parts 120. When using the liquid photoresist for the resist layer 12, the resist layer 12 including the opening 12X may be formed by a process similar to the above described process.

Figure 9C:
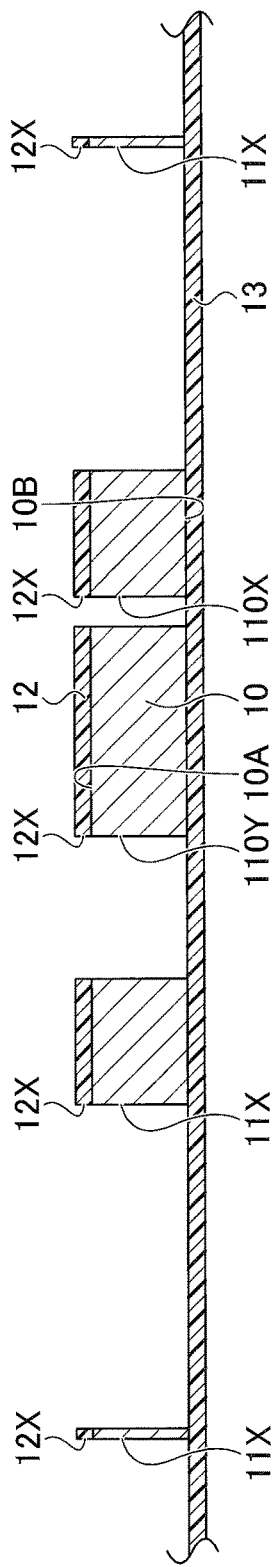
Figure 9D:
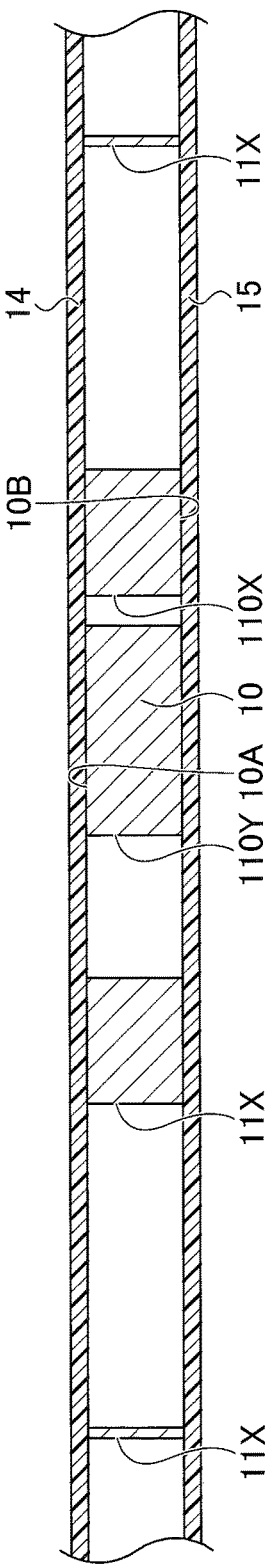
Figure 11C:
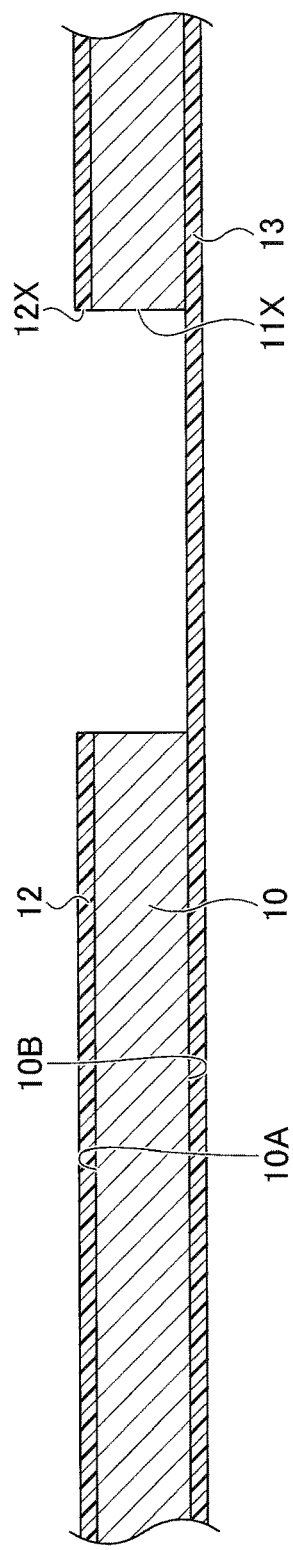
Figure 11D:
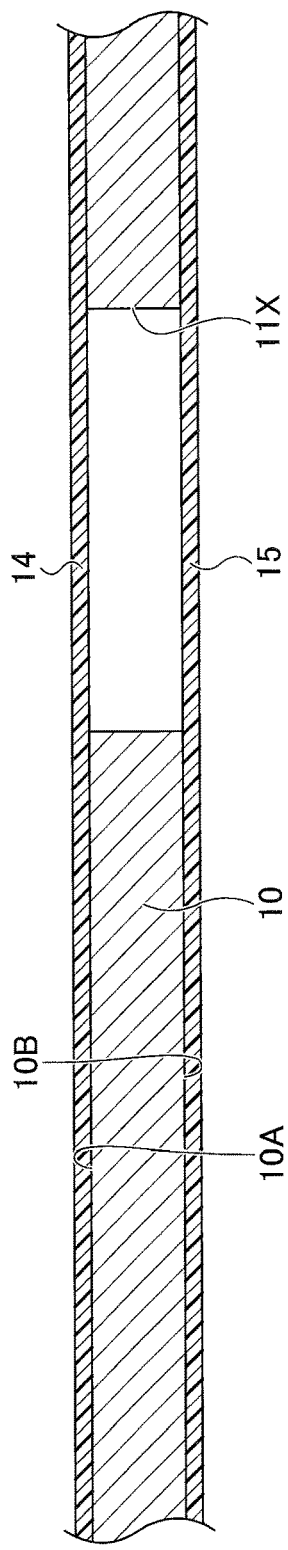

Next, in a process illustrated in FIG. 9C and FIG. 11C, the resist layers 12 and 13 are used as etching masks, to etch the metal plate 10 from the upper surface 10A, and form the connecting part 11, the winding part 110, and the electrode parts 120. More particularly, the metal plate 10 is etched from the upper surface 10A exposed via the opening pattern 12X in the resist layer 12, to form the spiral slit 110X, the circular opening 110Y, and the opening 11X in the metal plate 10. Accordingly, the winding part 110 and the electrode parts 120 are demarcated in each individual region C1, and the connecting part 11 connecting the adjacent metal layers 100 is demarcated. When patterning the metal plate 10 by a wet etching, such as an isotropic etching, an etchant used for the set etching may be appropriately selected according to the material used for the metal plate 10. In a case where Cu is used for the metal plate 10, for example, a ferric chloride solution, a copper chloride solution, or the like may be used for the etchant, and the metal plate 10 may be patterned by spray etching from the upper surface 10A of the metal plate 10.

In this example, the metal plate 10 is patterned by the etching process, to form the slit 110X, the opening 110Y, and the opening 11X. However, the metal plate 10 may be patterned by a pressing process, for example.

Next, the resist layers 12 and 13 are removed by an alkali stripping solution, such as stripping solutions made of organic amine, sodium hydroxide, acetone, ethanol, or the like, for example. Next, in a process illustrated in FIG. 9D and FIG. 11D, a resist layer 14 is formed to cover the entire upper surface 10A of the metal plate 10, and a resist layer 15 is formed to cover the entire lower surface 10B of the metal plate 10. The material used for the resist layers 14 and 15 may be similar to the material used for the resist layers 12 and 13 illustrated in FIG. 9A, for example. The resist layers 14 and 15 may be formed by a method similar to the method used to form the resist layers 12 and 13, for example.

Next, in a process illustrated in FIG. 10A and FIG. 12A, the resist layer 15 is patterned using the photolithography technique, for example, to form an opening pattern 15X in the resist layer 15. The opening pattern 15X is formed to expose the lower surface 10B of the metal plate 10 at a part corresponding to the winding part 110. In other words, the resist layer 15 including the opening pattern 15X is formed to cover the lower surface 10B of the metal plate 10 at parts other than the part corresponding to the winding part 110.

Next, in a process illustrated in FIG. 10B and FIG. 12B, the resist layers 14 and 15 are used as etching masks, to etch (or half-etch) the metal plate 10 from the lower surface 10B, and thin the metal plate 10 exposed via the opening pattern 15X in the resist layer 15. As a result, the winding part 110 that is thinner than the electrode parts 120 is formed. The etching process performed during this process illustrated in FIG. 10B and FIG. 12B may be a wet etching, such as an isotropic etching, for example. Such a wet etching may be performed similar to the wet etching performed in the process illustrated in FIG. 9C and FIG. 11C. In the process illustrated in FIG. 10B and FIG. 12B, the metal plate 10 is thinned so that a difference between the thickness of the winding part 110 and the thickness of the electrode parts 120 is approximately 50 μm to approximately 100 μm, for example.

In this example, the metal plate 10 is thinned by the etching (or half-etching). However, the metal plate 10 may be thinned by a pressing process, for example.

Next, in a process illustrated in FIG. 10O and FIG. 12C, the resist layers 14 and 15 are removed by an alkali stripping solution, such as stripping solutions made of organic amine, sodium hydroxide, acetone, ethanol, or the like, for example.

Accordingly, the metal layer 100, including the winding part 110 and the electrode parts 120, can be formed in each of the individual regions C1.

When the wet etching described above is performed on the metal plate 10, the etching progresses in an in-plane direction of the metal plate 10. For this reason, strictly speaking, the side surface of the metal plate 10 after the etching becomes inclined from the thickness direction. However, in order to simplify the drawings, the side surface of the metal plate 10 is illustrated as being parallel to the thickness direction in FIG. 9A through FIG. 12C, as well as in FIG. 1A and FIG. 1B, for example.

[Method of Forming Metal Layer 200]

Figure 13A:
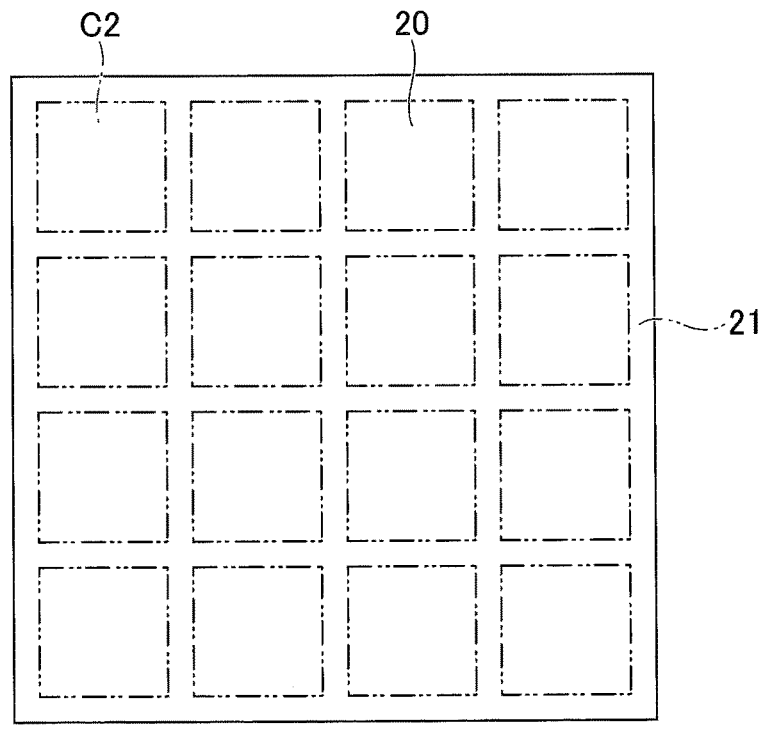
FIG. 13A and FIG. 13B are diagrams for generally explaining a method of forming the metal layer illustrated in FIG. 6A and FIG. 6B.
Figure 13B:
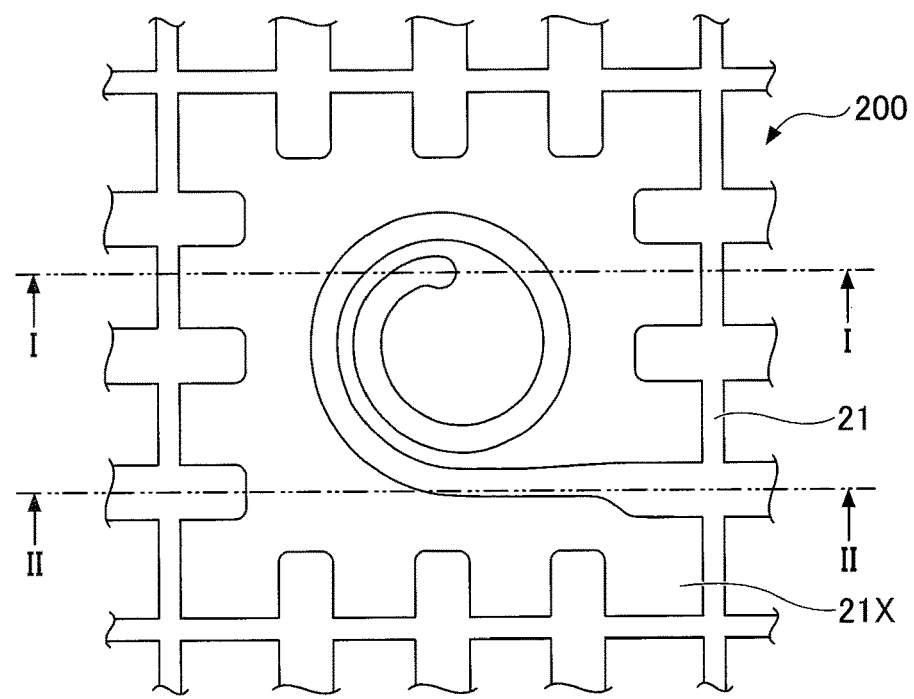

Next, a method of forming the metal layer 200 will be described. FIG. 13A and FIG. 13B are diagrams for generally explaining the method of forming the metal layer 200 illustrated in FIG. 6A and FIG. 6B.

In a process illustrated in FIG. 13A, a metal plate 20 is prepared. The metal plate 20 includes a plurality of individual regions C2. The plurality of individual regions C2 are arranged in a matrix arrangement (4×4 matrix arrangement), for example. As illustrated in FIG. 13B, the metal layer 200 is formed by performing the following manufacturing process on each of the individual regions C2. The metal layer 200 formed in each of the individual regions C2 is electrically connected to a connecting part 21 that is provided between 2 mutually adjacent individual regions C2, for example. In addition, an opening 21X that defines each metal layer 200 is formed between adjacent connecting parts 21. The individual regions C2 are segmented into individual pieces by removing the connecting part 21, and the individual pieces form the individual metal layers 200. The plurality of individual regions C2 may be arranged at predetermined intervals, as illustrated in FIG. 13A, or may be arranged adjacent to each other.

The metal plate 20 may be formed by a Cu plate having a thickness of approximately 150 μm to approximately 250 μm, for example. Of course, the material used for the metal plate 20 is not limited to Cu, and materials such as Cu alloys, Fe—Ni alloys such as the 42-alloy, or the like, for example, may be used for the metal plate 20.

Next, a method of forming the metal layer 200 in each individual region C2 will be described. FIG. 14A through FIG. 17C are cross sectional views for explaining the method of forming the metal layer 200 illustrated in FIG. 6A and FIG. 6B. FIG. 14A through FIG. 15C are cross sectional views along a line I-I in FIG. 13B, and FIG. 16A through FIG. 17C are cross sectional views along a line II-II in FIG. 13B. For the sake of convenience, the following description focuses on one individual region C2.

In a process illustrated in FIG. 14A and FIG. 16A, a resist layer 22 is formed to cover an entire upper surface 20A of the metal plate 20 that is prepared in a process illustrated in FIG. 13A, and a resist layer 23 is formed to cover an entire lower surface 20B of the metal plate 20. The material used for the resist layers 22 and 23 may be similar to the material used for the resist layers 12 and 13 illustrated in FIG. 9A, for example. The resist layers 22 and 23 may be formed by a method similar to the method used to form the resist layers 12 and 13, for example.

Next, in a process illustrated in FIG. 14B and FIG. 16B, the resist layer 22 is patterned using the photolithography technique, for example, to form an opening pattern 22X in the resist layer 22. The opening pattern 22X is formed to expose the upper surface 20A of the metal plate 20 at parts corresponding to other than the connecting part 21, the winding part 210, and the electrode parts 220. In other words, the resist layer 22 including the opening pattern 22X is formed to cover the upper surface 20A of the metal plate 20 at parts corresponding to the connecting part 21, the winding part 210, and the electrode parts 220. When using the liquid photoresist for the resist layer 22, the resist layer 22 including the opening 22X may be formed by a process similar to the above described process.

Next, in a process illustrated in FIG. 14C and FIG. 16C, the resist layers 22 and 23 are used as etching masks, to etch the metal plate 20 from the upper surface 20A, and form the connecting part 21, the winding part 210, and the electrode parts 220. More particularly, the metal plate 20 is etched from the upper surface 20A exposed via the opening pattern 22X in the resist layer 22, to form the spiral slit 210X, the circular opening 210Y, and the opening 21X in the metal plate 20. Accordingly, the winding part 210 and the electrode parts 220 are demarcated in each individual region C2, and the connecting part 21 connecting the adjacent metal layers 200 is demarcated. The metal plate 20 may be patterned by a method using a wet etching or the like, similar to the method used to pattern the metal plate 10.

Next, the resist layers 22 and 23 are removed by an alkali stripping solution, such as stripping solutions made of organic amine, sodium hydroxide, acetone, ethanol, or the like, for example. Next, in a process illustrated in FIG. 14D and FIG. 16D, a resist layer 24 is formed to cover the entire upper surface 20A of the metal plate 20, and a resist layer 25 is formed to cover the entire lower surface 20B of the metal plate 20. The material used for the resist layers 24 and 25 may be similar to the material used for the resist layers 12 and 13 illustrated in FIG. 9A, for example. The resist layers 24 and 25 may be formed by a method similar to the method used to form the resist layers 12 and 13, for example.

Next, in a process illustrated in FIG. 15A and FIG. 17A, the resist layer 25 is patterned using the photolithography technique, for example, to form an opening pattern 25X in the resist layer 25. The opening pattern 25X is formed to expose the lower surface 20B of the metal plate 20 at a part corresponding to the winding part 210 but excluding a part corresponding to the projecting part 214. In other words, the resist layer 25 including the opening pattern 25X is formed to cover the lower surface 20B of the metal plate 20 at parts other than the part corresponding to the winding part 210 but excluding the projecting part 214.

Next, in a process illustrated in FIG. 15B and FIG. 17B, the resist layers 24 and 25 are used as etching masks, to etch (or half-etch) the metal plate 20 from the lower surface 20B, and thin the metal plate 20 exposed via the opening pattern 25X in the resist layer 25. As a result, the projecting part 214 that has the same thickness as the electrode parts 220, and the winding part 210 that is thinner than the electrode parts 220, are formed. The metal plate 20 may be thinned by a method similar to the method used to thin the metal plate 10, such as a wet etching or the like, for example. In the process illustrated in FIG. 15B and FIG. 17B, the metal plate 20 is thinned so that a difference between the thickness of the winding part 210 and the thickness of the electrode parts 220 is approximately 50 μm to approximately 100 μm, for example, and a height of the projecting part 214 is approximately 50 μm to approximately 100 μm, for example.

Next, in a process illustrated in FIG. 15C and FIG. 17C, the resist layers 24 and 25 are removed by an alkali stripping solution, such as stripping solutions made of organic amine, sodium hydroxide, acetone, ethanol, or the like, for example. Hence, the lower surface 214B of the projecting part 214 becomes exposed to the outside.

Accordingly, the metal layer 200, including the winding part 210 having the projecting part 214, and the electrode parts 220, can be formed in each of the individual regions C2.

[Method of Forming Metal Layer 300]

Figure 18A:
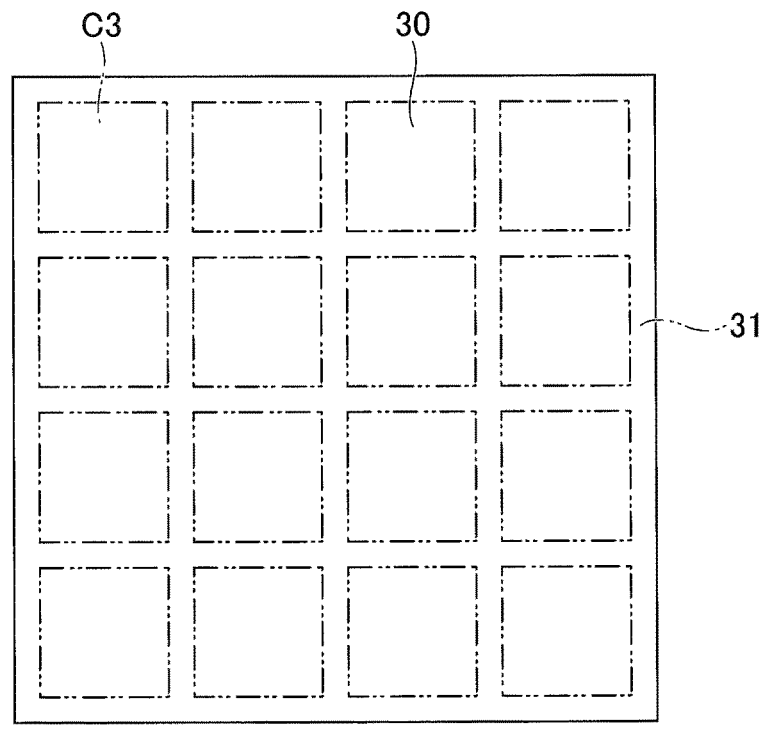
FIG. 18A and FIG. 18B are diagrams for generally explaining a method of forming the metal layer illustrated in FIG. 7A and FIG. 7B.
Figure 18B:
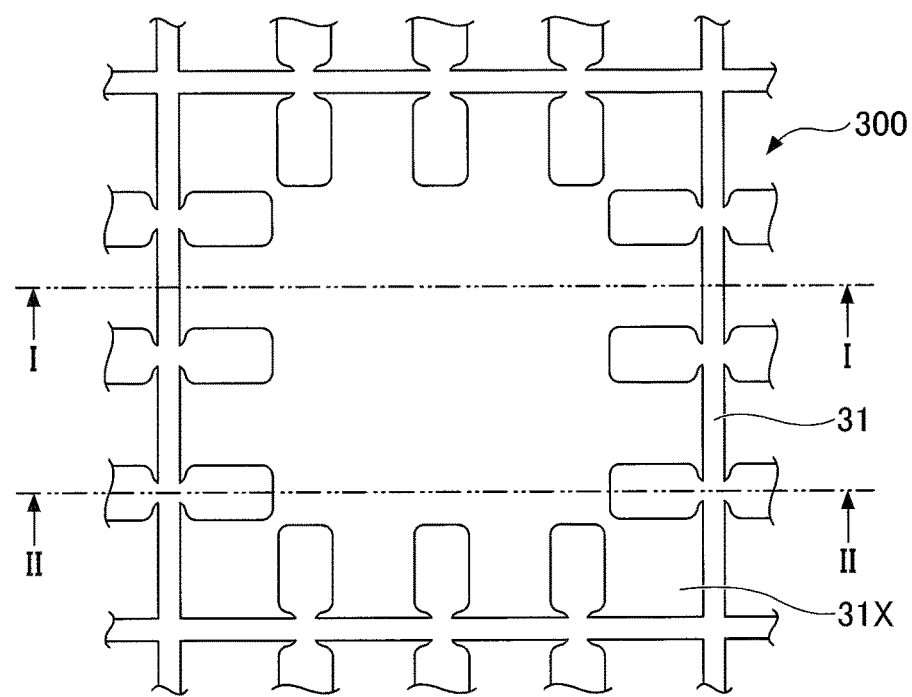

Next, a method of forming the metal layer 300 will be described. FIG. 18A and FIG. 18B are diagrams for generally explaining a method of forming the metal layer 300 illustrated in FIG. 7A and FIG. 7B.

In a process illustrated in FIG. 18A, a metal plate 30 is prepared. The metal plate 30 includes a plurality of individual regions C3. The plurality of individual regions C3 are arranged in a matrix arrangement (4×4 matrix arrangement), for example. As illustrated in FIG. 18B, the metal layer 300 is formed by performing the following manufacturing process on each of the individual regions C3. The metal layer 300 formed in each of the individual regions C3 is electrically connected to a connecting part 31 that is provided between 2 mutually adjacent individual regions C3, for example. In addition, an opening 31X that defines each metal layer 300 is formed between adjacent connecting parts 31. The individual regions C3 are segmented into individual pieces by removing the connecting part 31, and the individual pieces form the individual metal layers 300. The plurality of individual regions C3 may be arranged at predetermined intervals, as illustrated in FIG. 18A, or may be arranged adjacent to each other.

The metal plate 30 may be formed by a Cu plate having a thickness of approximately 150 μm to approximately 250 μm, for example. Of course, the material used for the metal plate 30 is not limited to Cu, and materials such as Cu alloys, Fe—Ni alloys such as the 42-alloy, or the like, for example, may be used for the metal plate 30.

Next, a method of forming the metal layer 300 in each individual region C3 will be described. FIG. 19A through FIG. 22C are cross sectional views for explaining the method of forming the metal layer 300 illustrated in FIG. 7A and FIG. 7B. FIG. 19A through FIG. 20C are cross sectional views along a line I-I in FIG. 18B, and FIG. 21A through FIG. 22C are cross sectional views along a line II-II in FIG. 18B. For the sake of convenience, the following description focuses on one individual region C3.

Figure 19A:
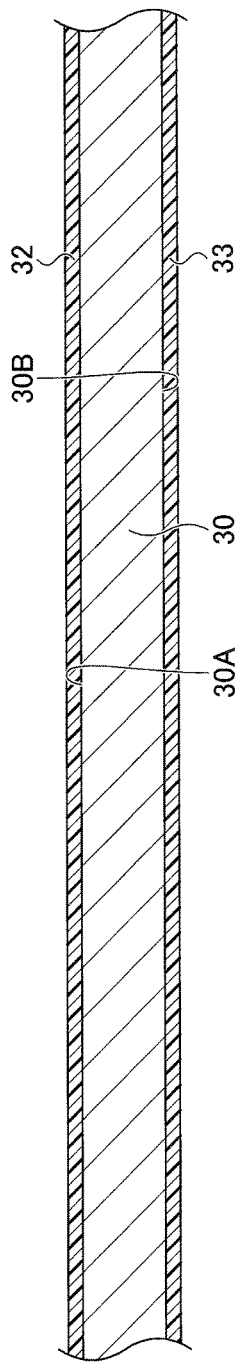
FIG. 19A, FIG. 19B, FIG. 19C, and FIG. 19D are cross sectional views for explaining the method of forming the metal layer illustrated in FIG. 7A and FIG. 7B.
Figure 21A:
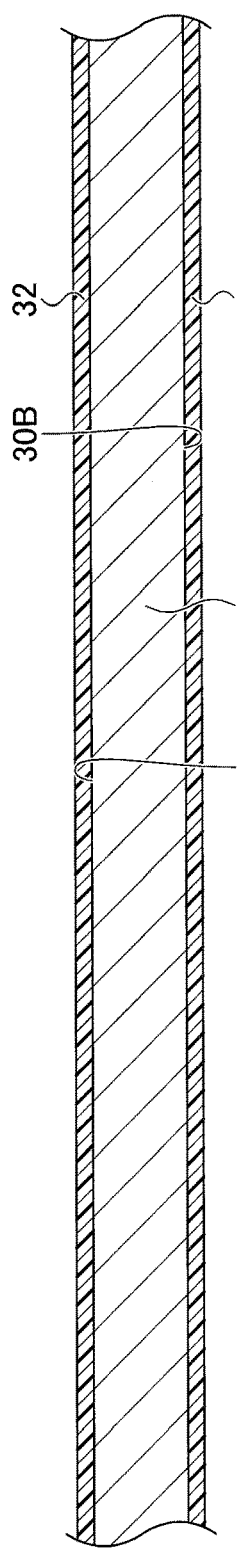
FIG. 21A, FIG. 21B, FIG. 21C, and FIG. 21D are cross sectional views for explaining the method of forming the metal layer illustrated in FIG. 7A and FIG. 7B.

In a process illustrated in FIG. 19A and FIG. 21A, a resist layer 32 is formed to cover an entire upper surface 30A of the metal plate 30 that is prepared in a process illustrated in FIG. 18A, and a resist layer 33 is formed to cover an entire lower surface 30B of the metal plate 30. The material used for the resist layers 32 and 33 may be similar to the material used for the resist layers 12 and 13 illustrated in FIG. 9A, for example. The resist layers 32 and 33 may be formed by a method similar to the method used to form the resist layers 12 and 13, for example.

Figure 19B:
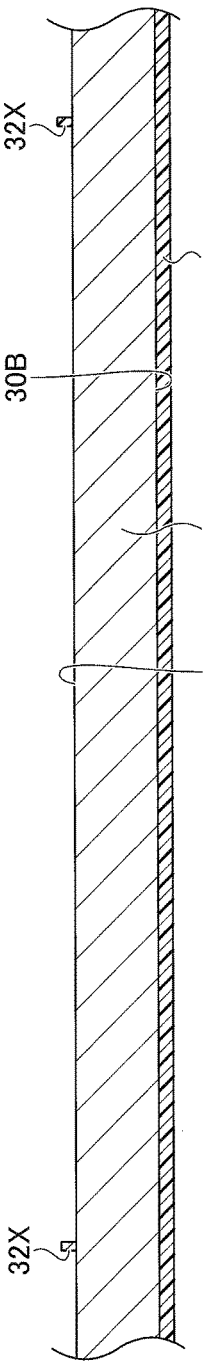
Figure 21B:
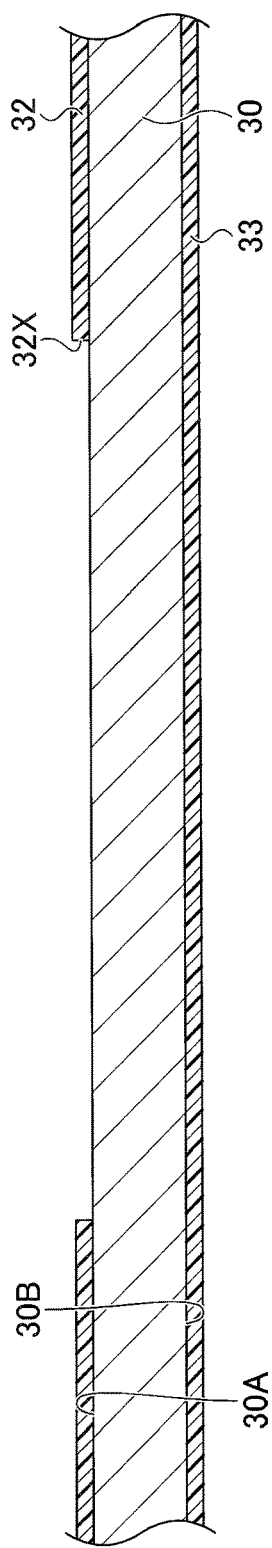

Next, in a process illustrated in FIG. 19B and FIG. 21B, the resist layer 32 is patterned using the photolithography technique, for example, to form an opening pattern 32X in the resist layer 32. The opening pattern 32X is formed to expose the upper surface 30A of the metal plate 30 at parts corresponding to other than the connecting part 31 and the electrode parts 320. In other words, the resist layer 32 including the opening pattern 32X is formed to cover the upper surface 30A of the metal plate 30 at parts corresponding to the connecting part 31 and the electrode parts 320. When using the liquid photoresist for the resist layer 32, the resist layer 32 including the opening 32X may be formed by a process similar to the above described process.

Figure 19C:
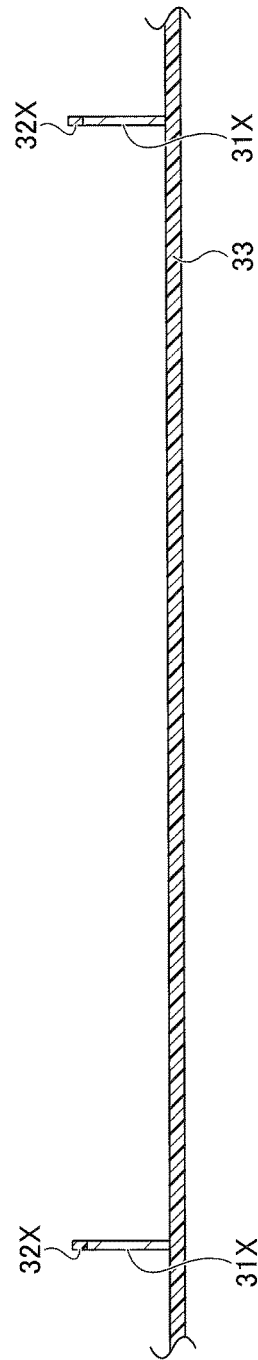
Figure 19D:
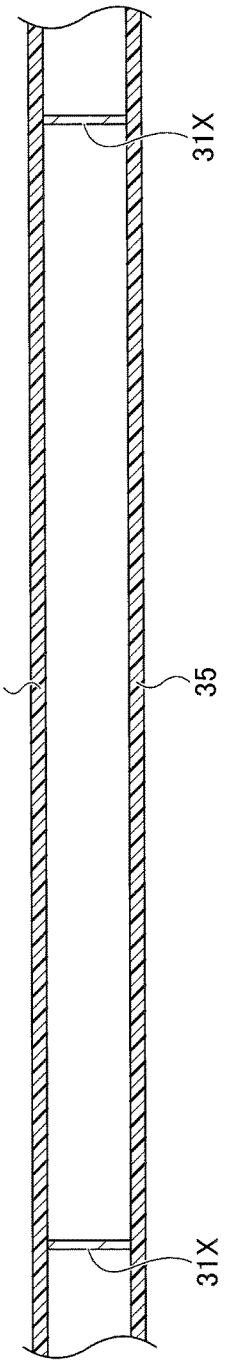
Figure 21C:
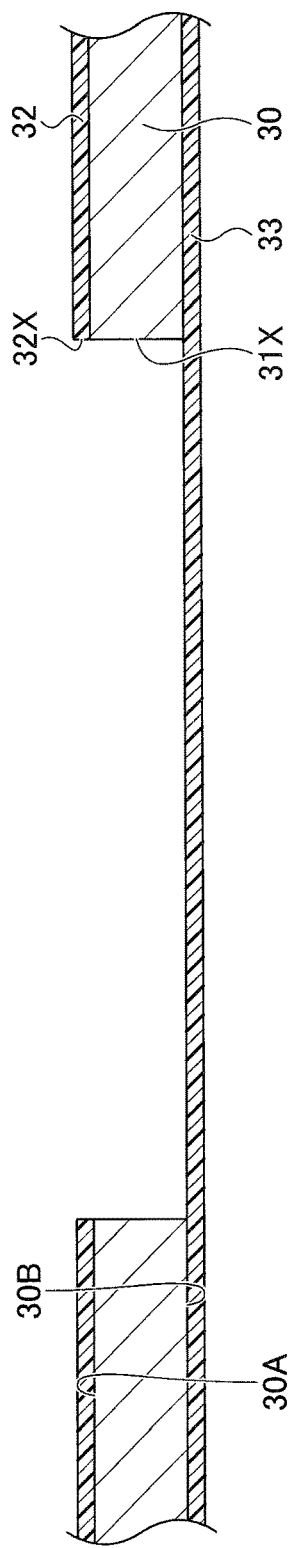
Figure 21D:
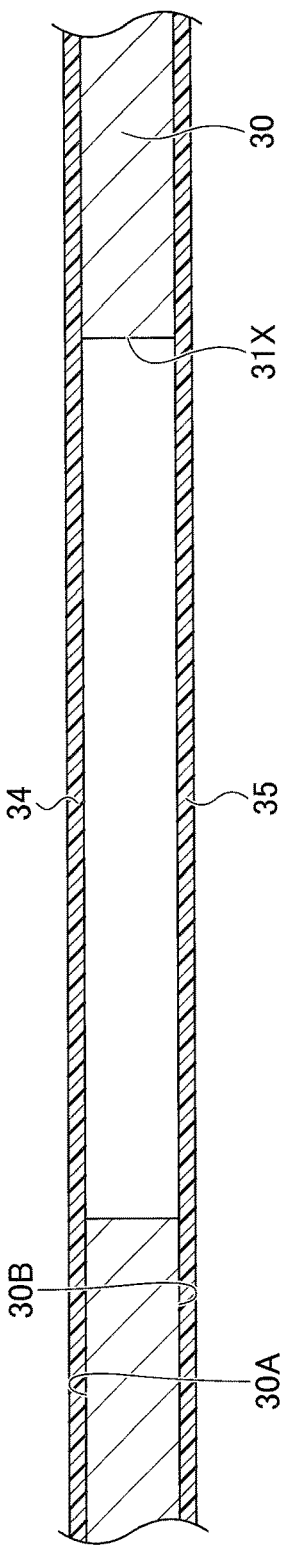

Next, in a process illustrated in FIG. 19C and FIG. 21C, the resist layers 32 and 33 are used as etching masks, to etch the metal plate 30 from the upper surface 30A, and form the connecting part 31 and the electrode parts 320. More particularly, the metal plate 30 is etched from the upper surface 30A exposed via the opening pattern 32X in the resist layer 32, to form the opening 31X in the metal plate 30. Accordingly, the electrode parts 320 are demarcated in each individual region C3, and the connecting part 31 connecting the adjacent metal layers 300 is demarcated. The metal plate 30 may be pattered by a method using a wet etching or the like, similar to the method used to pattern the metal plate 10.

Next, the resist layers 32 and 33 are removed by an alkali stripping solution, such as stripping solutions made of organic amine, sodium hydroxide, acetone, ethanol, or the like, for example. Next, in a process illustrated in FIG. 19D and FIG. 21D, a resist layer 34 is formed to cover the entire upper surface 30A of the metal plate 30, and a resist layer 35 is formed to cover the entire lower surface 30B of the metal plate 30. The material used for the resist layers 34 and 35 may be similar to the material used for the resist layers 12 and 13 illustrated in FIG. 9A, for example. The resist layers 34 and 35 may be formed by a method similar to the method used to form the resist layers 12 and 13, for example.

Next, in a process illustrated in FIG. 20A and FIG. 22A, the resist layer 35 is patterned using the photolithography technique, for example, to form an opening pattern 35X in the resist layer 35. The opening pattern 35X is formed to expose the lower surface 30B of the metal plate 30 at a part corresponding to the connecting part 31. In other words, the resist layer 35 including the opening pattern 35X is formed to cover the lower surface 30B of the metal plate 30 at parts other than the part corresponding to the connecting part 31.

Next, in a process illustrated in FIG. 20B and FIG. 22B, the resist layers 34 and 35 are used as etching masks, to etch (or half-etch) the metal plate 30 from the lower surface 30B, and thin the metal plate 30 exposed via the opening pattern 35X in the resist layer 35. As a result, the metal plate 30 is thinned at the part corresponding to the connecting part 31 and at the part corresponding to the horizontal projection 321. The metal plate 30 may be thinned by a method similar to the method used to thin the metal plate 10, such as a wet etching or the like, for example. In the process illustrated in FIG. 20B and FIG. 22B, the metal plate 30 is thinned so that a difference between the thickness of the connecting part 31 and the horizontal projection 321 and the thickness of the electrode parts 320 is approximately 50 μm to approximately 100 μm, for example.

Next, in a process illustrated in FIG. 20C and FIG. 22C, the resist layers 34 and 35 are removed by an alkali stripping solution, such as stripping solutions made of organic amine, sodium hydroxide, acetone, ethanol, or the like, for example.

Accordingly, the metal layer 300, including the electrode parts 320, can be formed in each of the individual regions C3.

[Finishing Laminated Circuit Board 1]

After forming the metal layers 100, 200, and 300, the laminated circuit board 1 is finished using the metal layers 100, 200, and 300. FIG. 23A through FIG. 29B are cross sectional views for explaining a method of manufacturing the laminated circuit board 1 according to the first embodiment. FIG. 23A, FIG. 24A, FIG. 25A, FIG. 26A, FIG. 27A, FIG. 28A, and FIG. 29A correspond to the cross sectional view along the line I-I in FIG. 2, and FIG. 23B, FIG. 24B, FIG. 25B, FIG. 26B, FIG. 27B, FIG. 28B, and FIG. 29B correspond to the cross sectional view along the line II-II in FIG. 2.

In a process illustrated in FIG. 23A and FIG. 23B, the metal layers 100, 200, and 300 are bonded to each other. For example, the lower surface 214B of the projecting part 214 is bonded to the upper surface 100A of the end part 111, the lower surface 220B of the electrode parts 220 is bonded to the upper surface 120A of the electrode parts 120, and the lower surface 320B of the electrode parts 320 is bonded to the upper surface 220A of the electrode parts 220. The metal layers 100, 200, and 300 may be bonded to each other by diffusion bonding, for example. The diffusion bonding places metal materials to be bonded, in contiguous contact, and applies pressure and heat within a vacuum environment, an inert gas environment, or the like, to utilize diffusion of atoms occurring at an interface of the metal materials and bond the metal materials to each other at an atomic level.

More particularly, first, the metal plate 20 is arranged on the metal plate 10 and the metal plate 30 is arranged on the metal plate 20, so that the 4×4 individual regions C1 provided in the metal plate 10, the 4×4 individual regions C2 provided in the metal plate 20, and the 4×4 individual regions C3 provided in the metal plate 30 are vertically aligned. In other words, the upper surface 100A of the metal layer 100 and the lower surface 200B of the metal layer 200 are arranged to oppose each other, to position the projecting part 214 to oppose the end part 11, and to position the electrode parts 220 to oppose the electrode parts 120. In addition, the upper surface 200A of the metal layer 200 and the lower surface 300B of the metal layer 300 are arranged to oppose each other, to position the electrode parts 320 to oppose the electrode parts 220.

In a case where Cu is used as the material forming the metal layers 100, 200, and 300, for example, the heating temperature may be set to approximately 500° C. to approximately 600° C., and the pressure may be set to approximately 0.005 kN/mm² to approximately 0.015 kN/mm², for example.

The projecting part 214 of the metal layer 200, and the metal layer 100, that are bonded by the diffusion bonding, are integrated in a state where the projecting part 214 and the metal layer 100 are in contiguous contact without a gap formed at an interface therebetween. Hence, the lower surface 214B of the projecting part 214 and the upper surface 100A of the end part 111 are directly bonded to each other.

Accordingly, the metal layer 100, and the metal layer 200 laminated on the metal layer 100 in the vertical direction, are electrically connected in series to form the inductor 51 having the winding of approximately 3 turns.

Figure 24A:
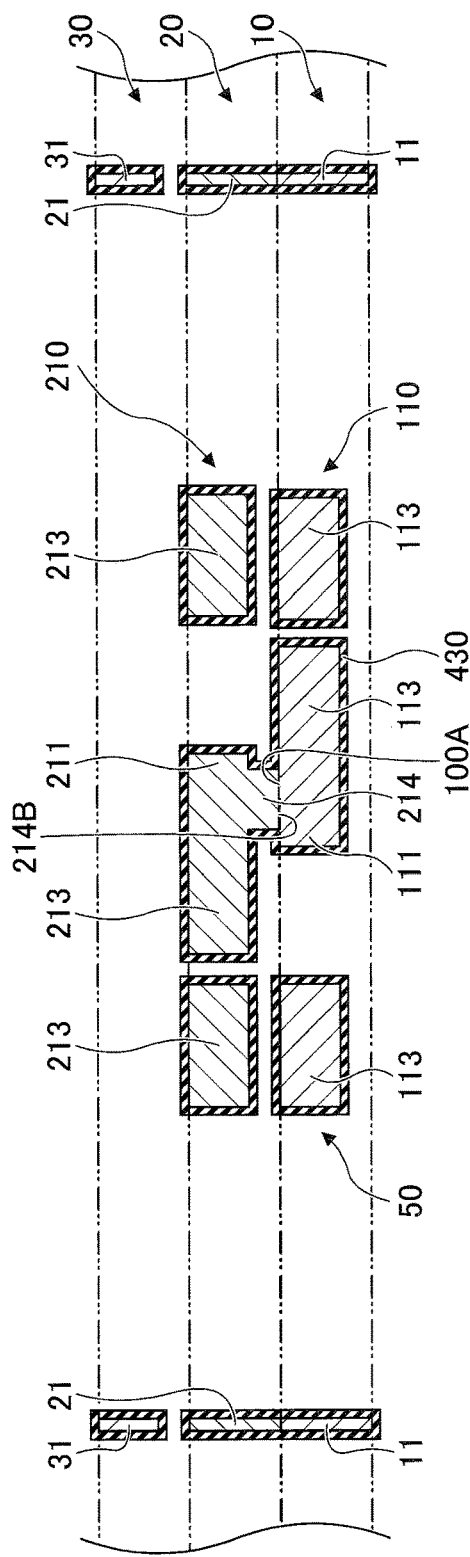
FIG. 24A and FIG. 24B are cross sectional views for explaining the method of manufacturing the laminated circuit board according to the first embodiment.
Figure 24B:
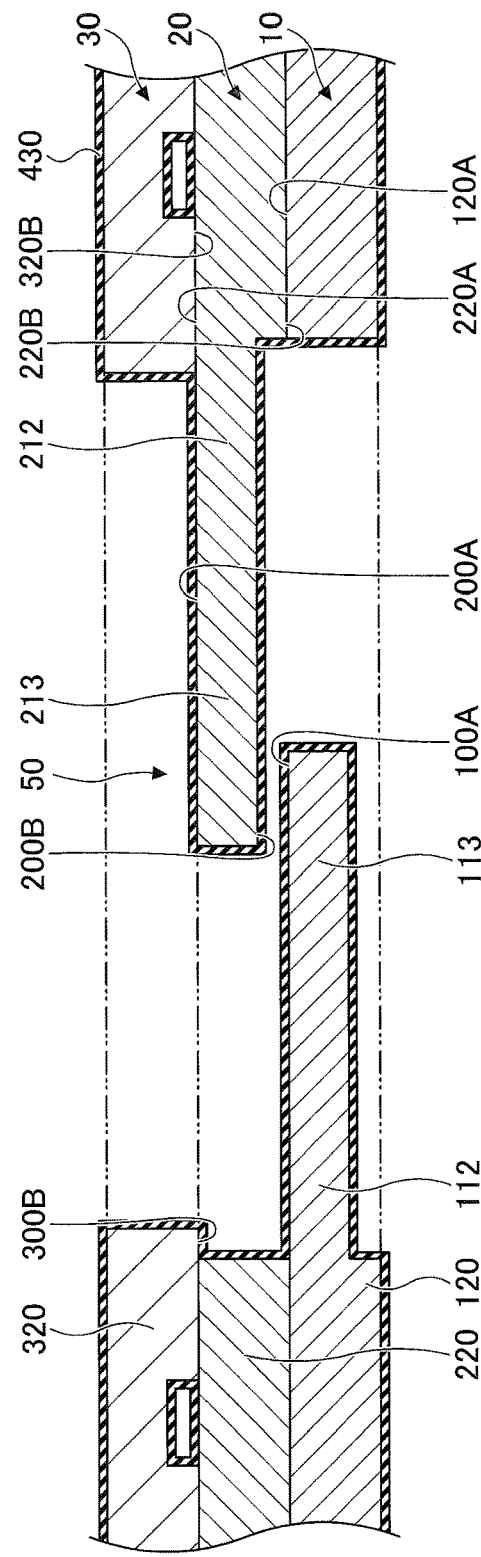

Next, in a process illustrated in FIG. 24A and FIG. 24B, the insulating layer 430 is formed to cover the entire surface of the metal layers 100, 200, and 300. The insulating layer 430 is formed to cover the entire surface of the connecting parts 11, 21, and 31. The insulating layer 430 may be formed by electrodeposition coating, using an epoxy resin, a polyimide resin, or the like, for example. In addition, the insulating layer 430 may be formed by spin-coating, spray-coating, or the like, for example. The insulating layer 430 is formed to a thickness of approximately 8 μm to approximately 15 μm, for example.

Figure 25A:
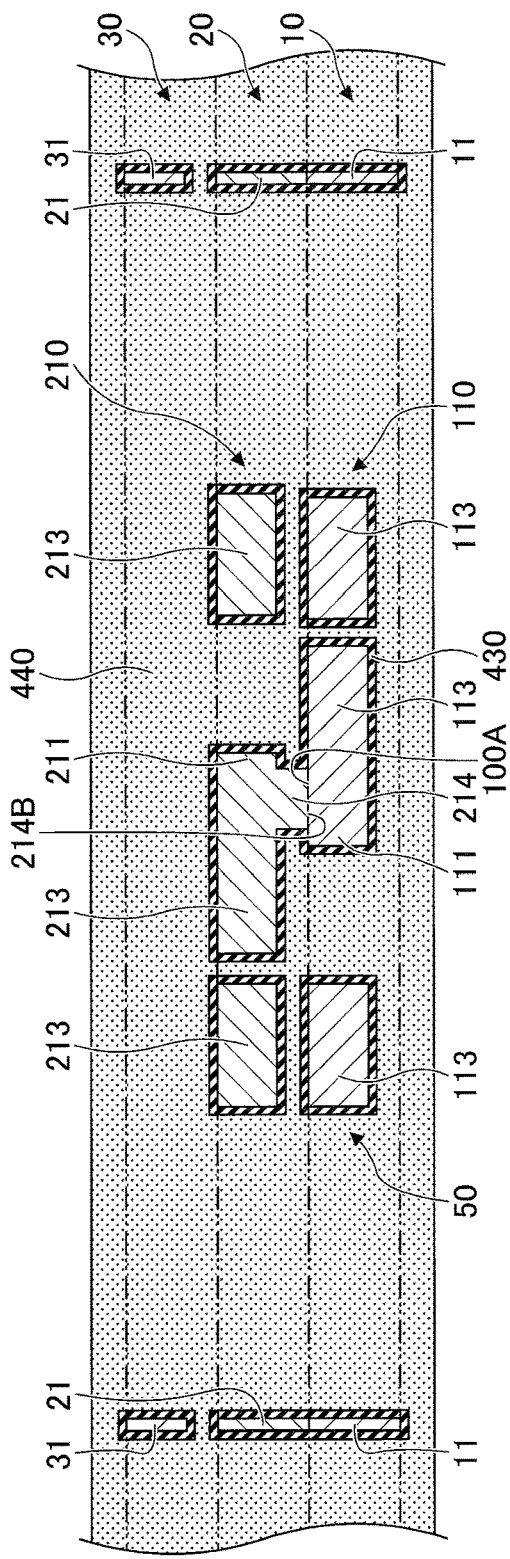
FIG. 25A and FIG. 25B are cross sectional views for explaining the method of manufacturing the laminated circuit board according to the first embodiment.
Figure 25B:
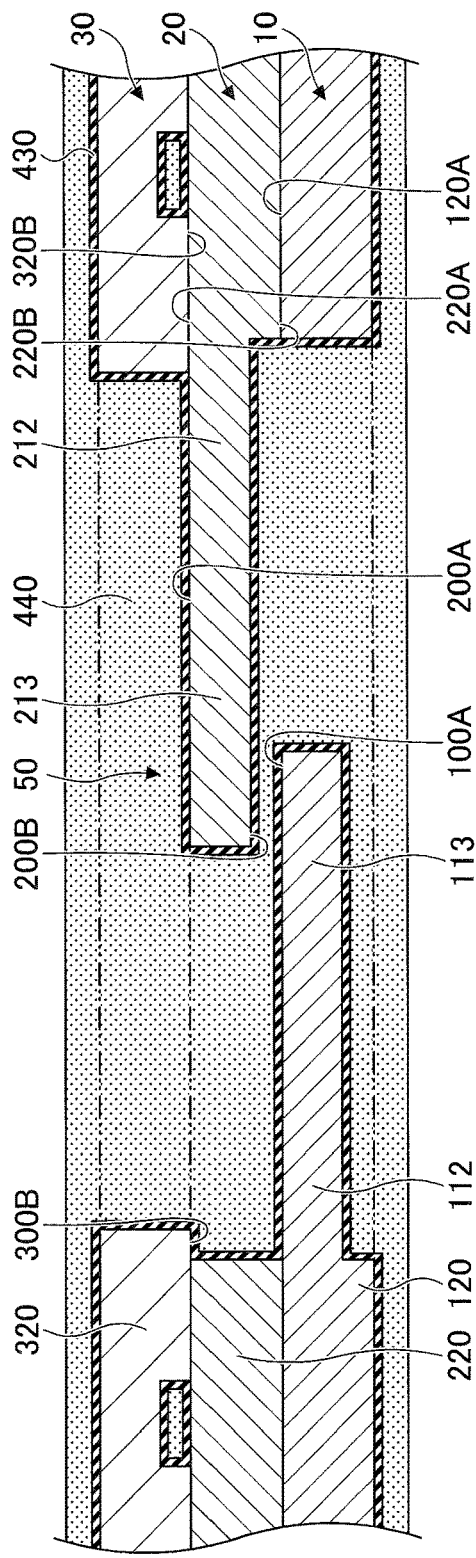

Next, in a process illustrated in FIG. 25A and FIG. 25B, the magnetic body 440 is formed to cover the surface of the insulating layer 430, to embed the metal layers 100, 200, and 300. For this reason, the metal layers 100, 200, and 300, and the insulating layer 430 that covers these metal layers 100, 200, and 300, are embedded in the magnetic body 440. In this example, the magnetic body 440 is formed to entirely embed the metal plates 10, 20, and 30. In addition, the connecting parts 11, 21, and 31, and the insulating layer 430 that covers these connecting parts 11, 21, and 31, are embedded in the magnetic body 440. Although not illustrated, the magnetic body 440 may be formed by placing a structure illustrated in FIG. 24A and FIG. 24B between a lower mold and an upper mold of a mold, and filling a periphery of the structure with a granular magnetic material that is a mixture of magnetic powder and insulating resin. In addition, by applying a pressure of approximately 200 MPa to approximately 250 MPa on the granular magnetic material, while heating the granular magnetic material to approximately 150° C. to approximately 160° C., the granular magnetic material can be molded to the magnetic body 440 by high-pressure molding.

In this example, the magnetic body 440 is formed by molding on the granular magnetic material by the high-pressure molding, however, the magnetic body 440 may be formed by other methods. The magnetic body 440 may be formed by transfer molding, compression molding, or the like, for example.

The material used for the magnetic body 440 may be a mixture of a binder and magnetic powder. The binder may be a thermosetting resin, such as epoxy resins or the like, for example. The magnetic powder may be Fe-based amorphous alloy powder subjected to an outer insulating treatment, carbonyl iron powder subjected to the outer insulating treatment, ferrite powder, an arbitrary combination of such powders, or the like, for example. A mixing ratio of the magnetic powder with respect to the binder is preferably adjusted according to a permeability of the magnetic powder, the method of molding the magnetic body 440, or the like.

Figure 26A:
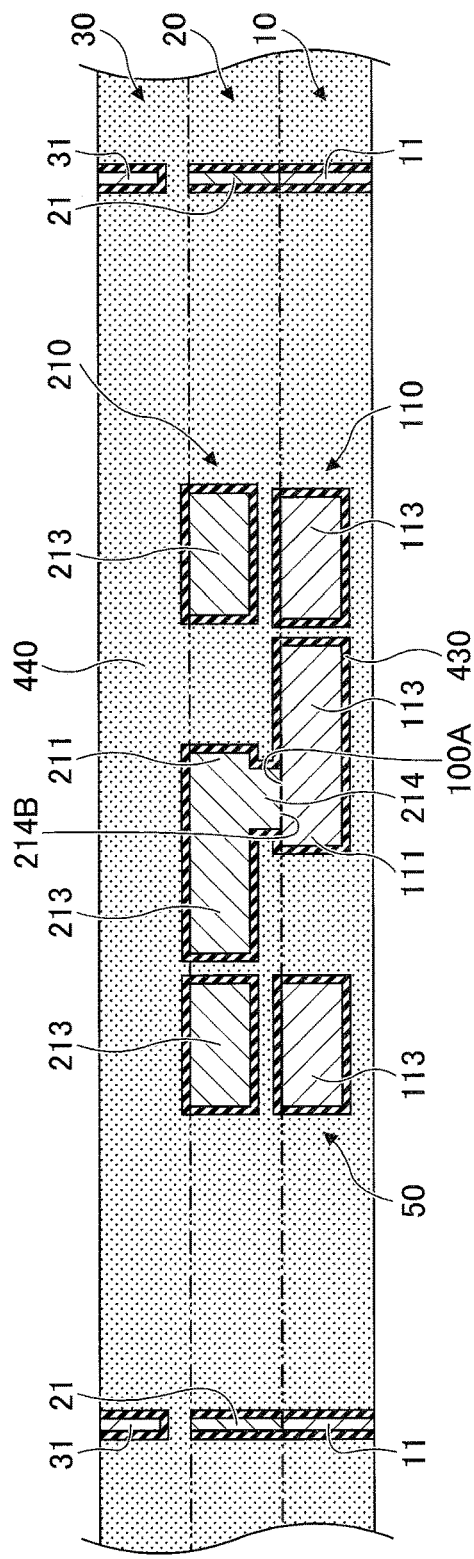
FIG. 26A and FIG. 26B are cross sectional views for explaining the method of manufacturing the laminated circuit board according to the first embodiment.
Figure 26B:
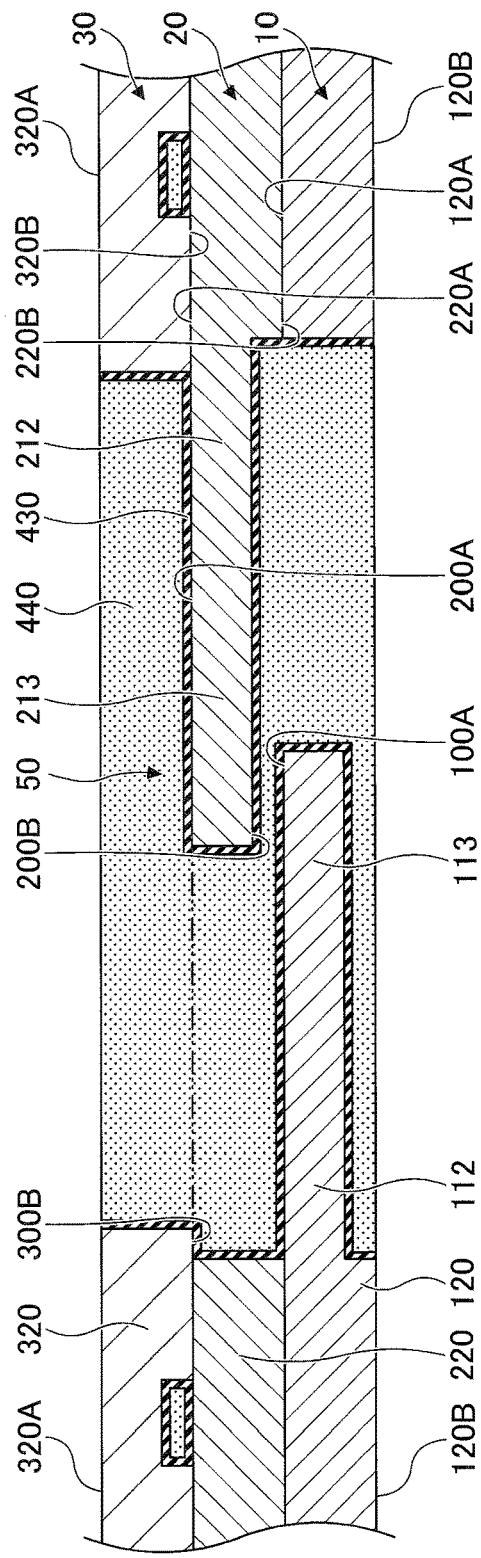

Next, in a process illustrated in FIG. 26A and FIG. 26B, the insulating layer 430 and the magnetic body 440 covering the lower surface 120B of the electrode parts 120 are removed, and the insulating layer 430 and the magnetic body 440 covering the upper surface 320A of the electrode parts 320 are removed. The insulating layer 430 and the magnetic body 440 may be removed by a polishing process, such as buffing or the like. As a result, the lower surface 120B of the electrode parts 120 and the upper surface 320A of the electrode parts 320 become exposed from the insulating layer 430 and the magnetic body 440.

Next, in a process illustrated in FIG. 27A and FIG. 27B, a groove 450 is formed in the connecting parts 11 and 21 of the metal plates 10 and 20, using a dicing saw or the like, while maintaining the connecting part 31 of the metal plate 30. As a result, the adjacent individual regions C1 are separated from each other, and the adjacent individual regions C2 are separated from each other.

Next, in a process illustrated in FIG. 28A and FIG. 28B, the plated layer 460 is formed on the exposed surfaces of the electrode parts 120, 220, and 320, by electroplating that uses the metal plate 30 as a plating power feed line.

Next, in a process illustrated in FIG. 29A and FIG. 29B, the connecting part 31 of the metal plate 30 is removed, using the dicing saw or the like. As a result, the adjacent individual regions C3 are separated from each other. Hence, the laminated structure of the metal layers 100, 200, and 300 is segmented into individual pieces each forming the laminated circuit board 1.

The laminated circuit board 1 is manufactured by the processes described above. Each laminated circuit board 1 that is obtained by segmenting the laminated structure into the individual pieces, may be used in an up-side-down state, or in an inclined state that is inclined by an arbitrary angle with respect to the horizontal state. In addition, the group of the laminated circuit boards 1 illustrated in FIG. 28A and FIG. 28B, before being segmented into the individual pieces, may be distributed instead of distributing the individual laminated circuit boards 1.

The laminated circuit board 1 according to the first embodiment may be used in an electronic component according to a second embodiment that will be described later. In this case, the electrode parts 120 may be used as the external electrodes of the electronic component, and the electrode parts 320 may be used as the internal electrodes of the electronic component. In addition, the external electrodes may be electrically connected to a mounting board or the like, and the internal electrodes may be electrically connected to a semiconductor chip, a plurality of passive elements, or the like in the electronic component.

The inductor 51 is formed using the metal layers 100 and 200 made of Cu or the like. In addition, the conductor parts 113 and 213 included in the inductor 51 have a thickness of approximately 100 μm to approximately 200 μm, for example. Accordingly, the resistance of the inductor 51 can be made low. Further, the conductor part 113 can be formed by etching the metal plate 10, and the conductor part 213 can be formed by etching the metal plate 20. Accordingly, the conductor parts 113 and 213 can be formed with ease. In addition, the conductor part 113 and the conductor part 213 can be bonded with ease via the projecting part 214. Hence, according to the first embodiment, it is possible to easily form a built-in low-resistance inductor 51 in the laminated circuit board 1.

Second Embodiment

Next, a second embodiment will be described. An electronic component 2 according to the second embodiment includes the laminated circuit board 1.

[Structure of Electronic Component]

Figure 30A:
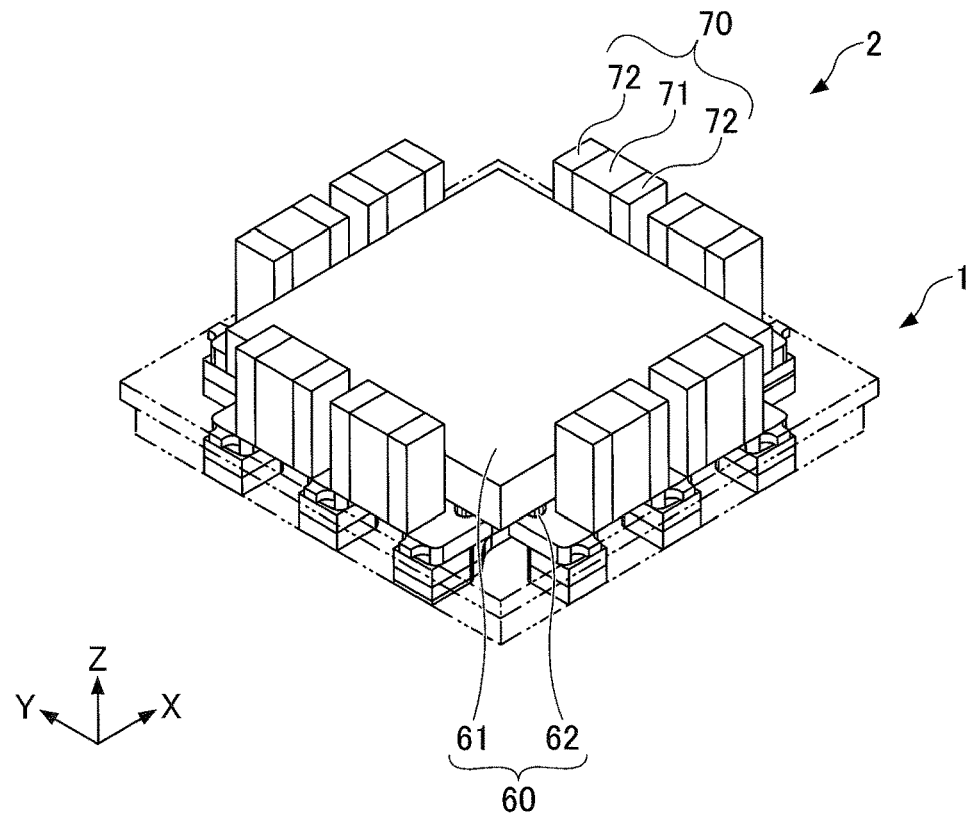
FIG. 30A and FIG. 30B are perspective views illustrating a structure of an electronic component according to a second embodiment.
Figure 30B:
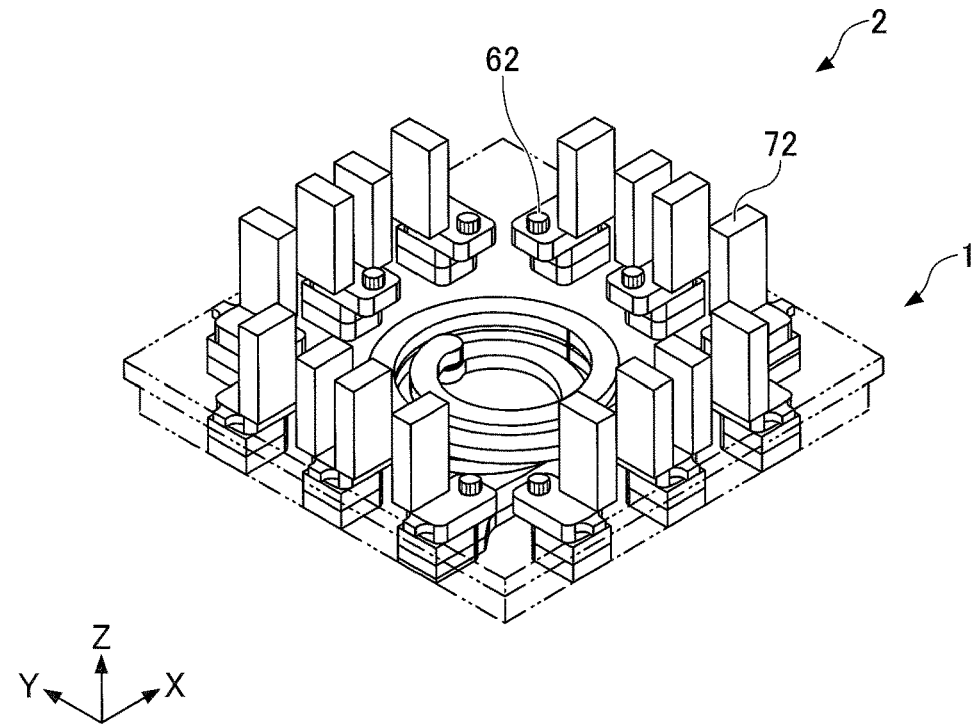

First, a structure of the electronic component 2 will be described. FIG. 30A and FIG. 30B are perspective views illustrating a structure of the electronic component 2 according to the second embodiment. FIG. 30A illustrates the entire electronic component 2, and FIG. 30B illustrates a relationship between the electrodes and the electrode parts of the semiconductor chip and the passive elements included in the electronic component 2.

As illustrated in FIG. 30A and FIG. 30B, the electronic component 2 according to the second embodiment includes the laminated circuit board 1, a semiconductor chip 60, and a plurality of passive elements 70. Each passive element 70 is a capacitor element or a resistor element, for example. The capacitor elements and the resistor elements may coexist among the plurality of passive elements 70.

The semiconductor chip 60 includes a main body 61, and a plurality of electrodes 62. As illustrated in FIG. 30B, each electrode 62 is electrically connected to the upper surface 320A of the electrode part 320 of the laminated circuit board 1. Each passive element 70 includes a main body 71, and 2 electrodes 72. As illustrated in FIG. 30B, each electrode 72 is electrically connected to the upper surface 320A of the electrode part 320 of the laminated circuit board 1. Although the illustration of a mold resin 80 and a plated layer 460 is omitted in FIG. 30A and FIG. 30B, the semiconductor chip 60 and the passive elements 70 are encapsulated by the mold resin 80, and the plated layer 460 is formed on the lower surface 120B and the end surface 120C of the electrode parts 120, the end surface 220C of the electrode part 220, and the upper surface 320A of the electrode parts 320, as will be described later in conjunction with FIG. 32.

In the second embodiment, the electrode parts 120 are used as the external electrodes of the electronic component 2, and the electrode parts 320 are used as the internal electrodes of the electronic component 2. The electrodes 62 of the semiconductor chip 60 and the electrodes 72 of the passive elements 70 are electrically connected to the internal electrodes. The mounting board or the like may be electrically connected to the external electrodes. The laminated circuit board 1 includes the built-in inductor 51 that is electrically connected to the external electrode and the internal electrode.

Accordingly, the electronic component 2 may be used as a DC-DC converter, for example.

When solder (not illustrated) is used to electrically connect the external electrodes and the mounting board, the solder wets and spreads from between the lower surface 400B of the base 400 and the mounting board, to the surface of the plated layer 460 on the end surface 120C of the electrode parts 120. Accordingly, it is easy to visually confirm the connection state between the electronic component 2 and the mounting board using the solder.

The electrode parts 120 (or first electrodes) may be used as the internal electrodes of the electronic component 2, and the electrode parts 320 (or second electrodes) may be used as the external electrodes of the electronic component 2.

[Method of Manufacturing Electronic Component 2]

Figure 31A:
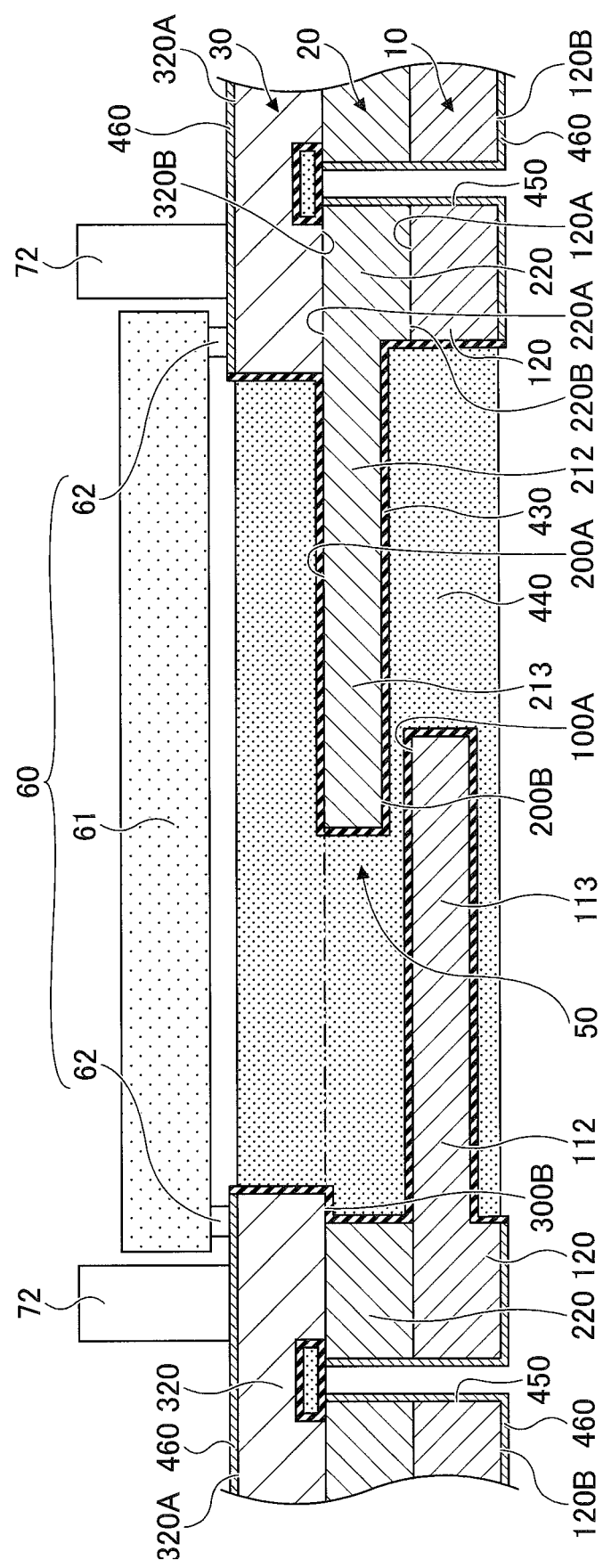
FIG. 31A and FIG. 31B are cross sectional views for explaining a method of manufacturing the electronic component according to the second embodiment.
Figure 31B:
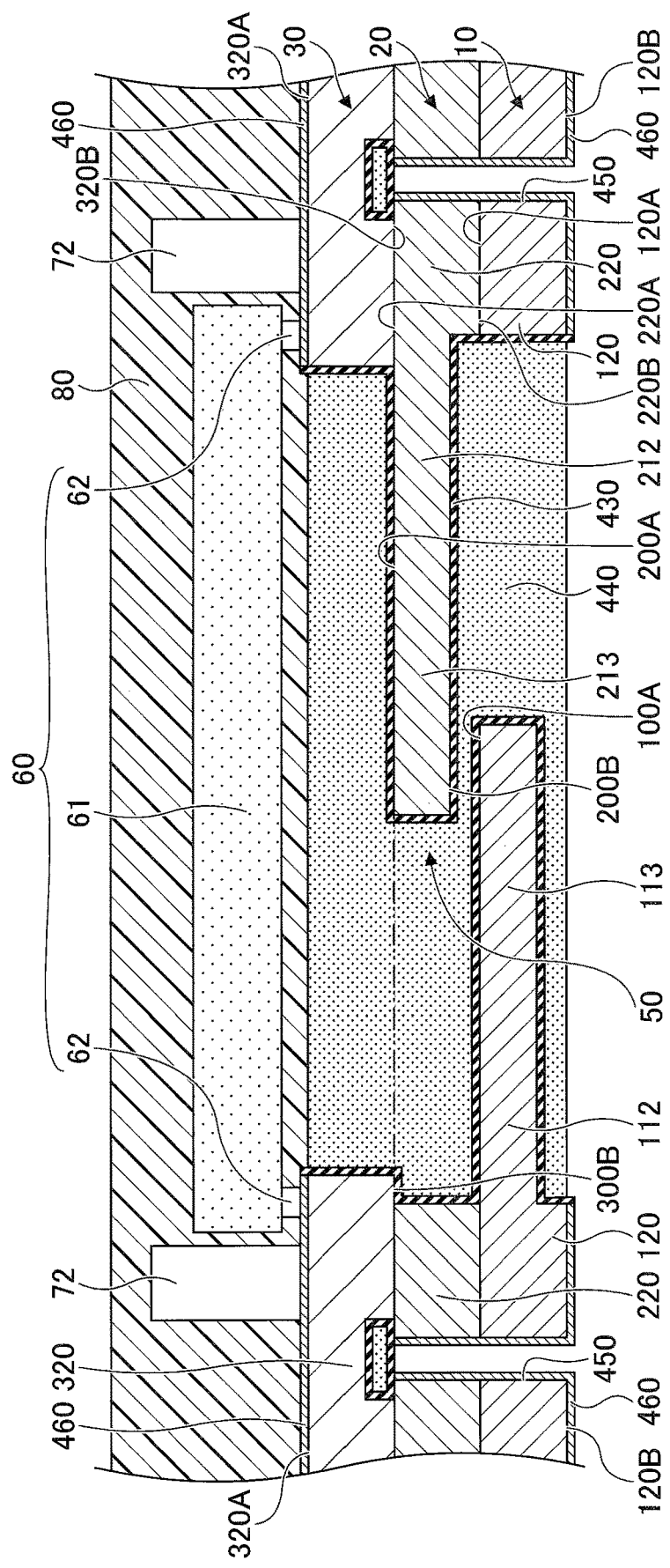
Figure 32:
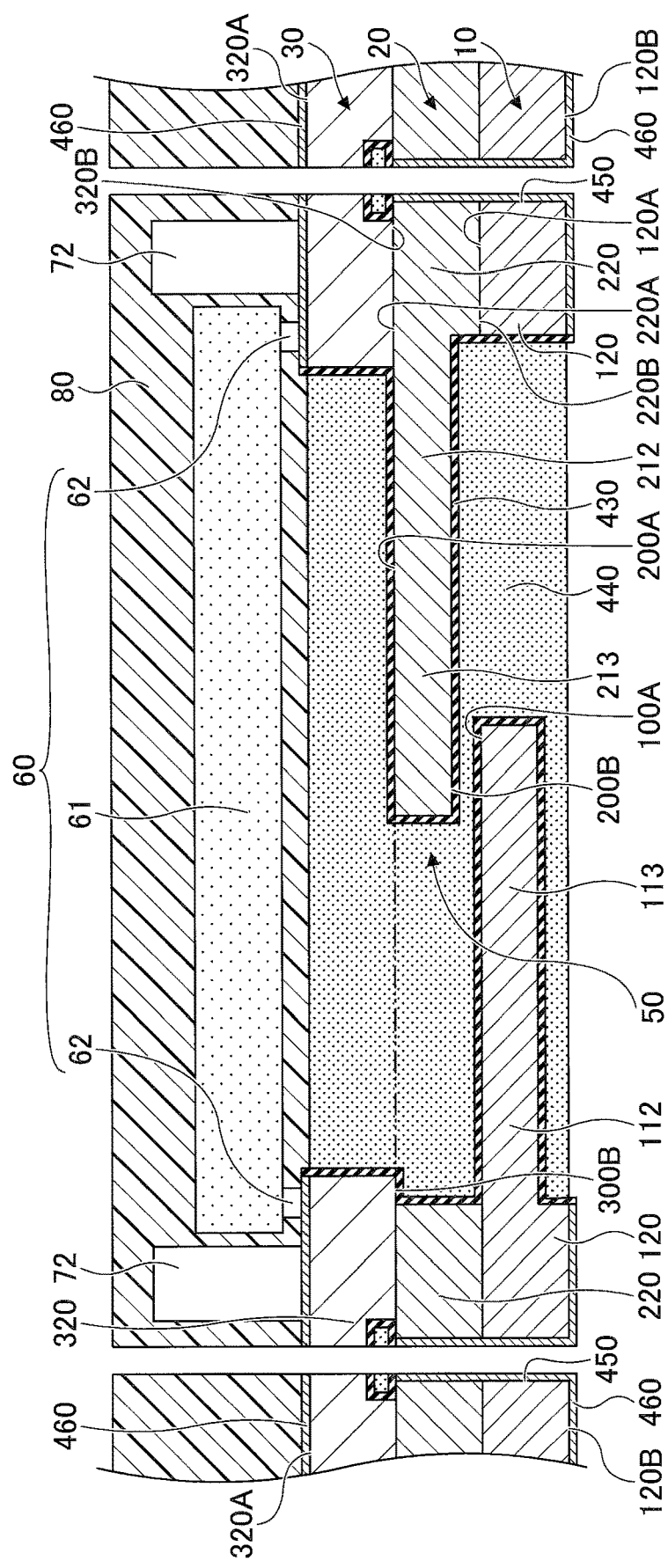
FIG. 32 is a cross sectional view for explaining the method of manufacturing the electronic component according to the second embodiment.

Next, a method of manufacturing the electronic component 2 will be described. For the sake of convenience, parts forming constituent elements of the final, completed electronic component 2 will be designated by the reference numerals of the final constituent elements. FIG. 31A, FIG. 31B, and FIG. 32 are cross sectional views for explaining the method of manufacturing the electronic component 2 according to the second embodiment.

In a process illustrated in FIG. 31A, the group of the laminated circuit boards 1 illustrated in FIG. 28A and FIG. 28B, before being segmented into the individual pieces, is prepared. In addition, the semiconductor chip 60 provided with the electrodes 62 such as solder bumps or the like, and the passive elements 70 provided with the electrodes 72, are mounted on each laminated circuit board 1. When mounting the semiconductor chip 60 and the passive elements 70 on each laminated circuit board 1, the electrodes 62 of the semiconductor chip 60 are bonded to the upper surface 320A of the electrode parts 320, and the electrodes 72 of the passive elements 70 are bonded to the upper surface 320A of the electrode parts 320 via the solder (not illustrated) or the like.

Next, in a process illustrated in FIG. 31B, the semiconductor chip 60 and the passive elements 70 are encapsulated by the mold resin 80. A thermosetting resin, such as epoxy resins or the like, for example, may be used for the mold resin 80.

Next, in a process illustrated in FIG. 32, the laminated structure of the metal layers 100, 200, and 300, and the mold resin 80, are cut using the dicing saw or the like, similar to the process illustrated in FIG. 29A and FIG. 29B, to obtain the individual pieces each corresponding to the electronic component 2.

The electronic component 2 is manufactured by the processes described above.

Because the upper surface 320A of the electrode parts 320 is exposed from the upper surface 400A of the base 400 of the laminated circuit board 1, it is possible to easily bond the semiconductor chip 60 and the passive elements 70.

Third Embodiment

Figure 33A:
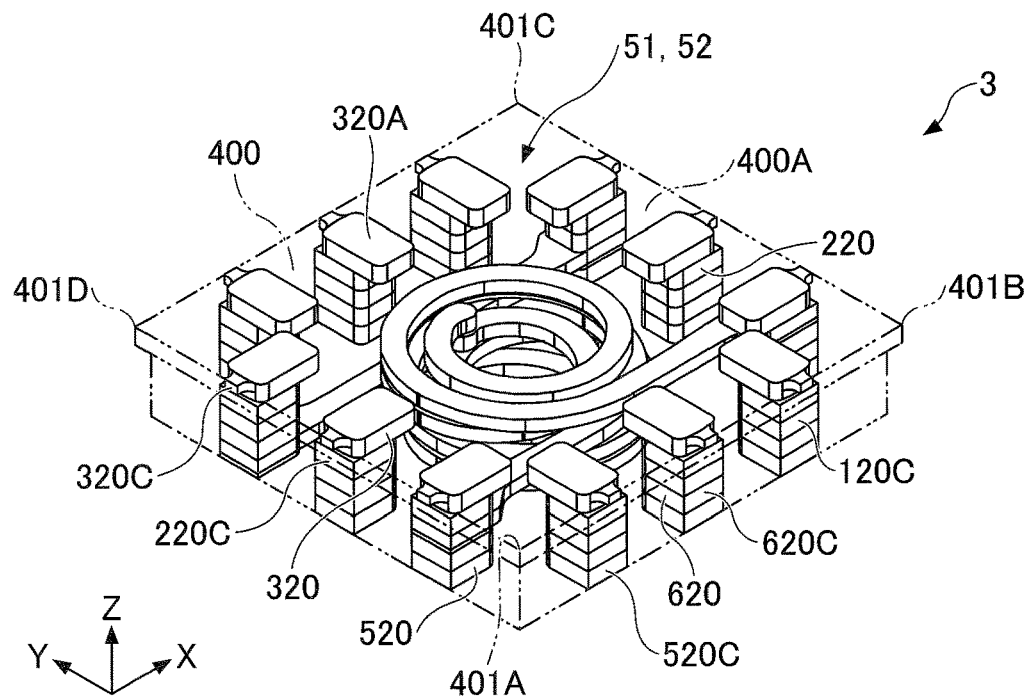
FIG. 33A and FIG. 33B are perspective views illustrating the structure of the laminated circuit board according to a third embodiment.
Figure 33B:
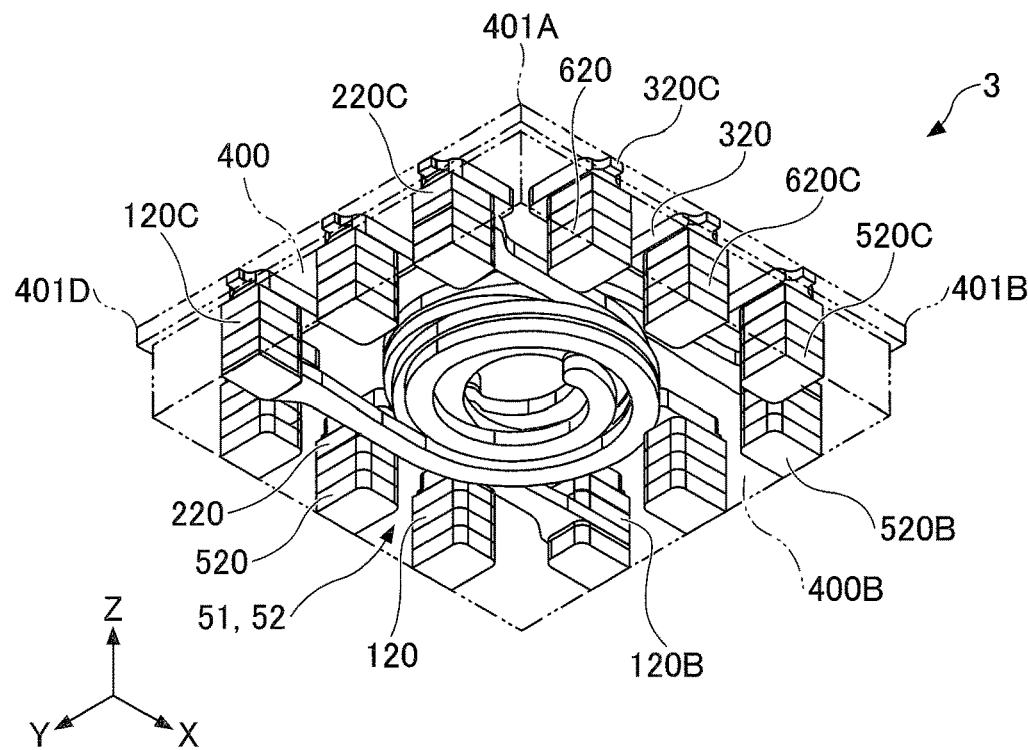
Figure 34:
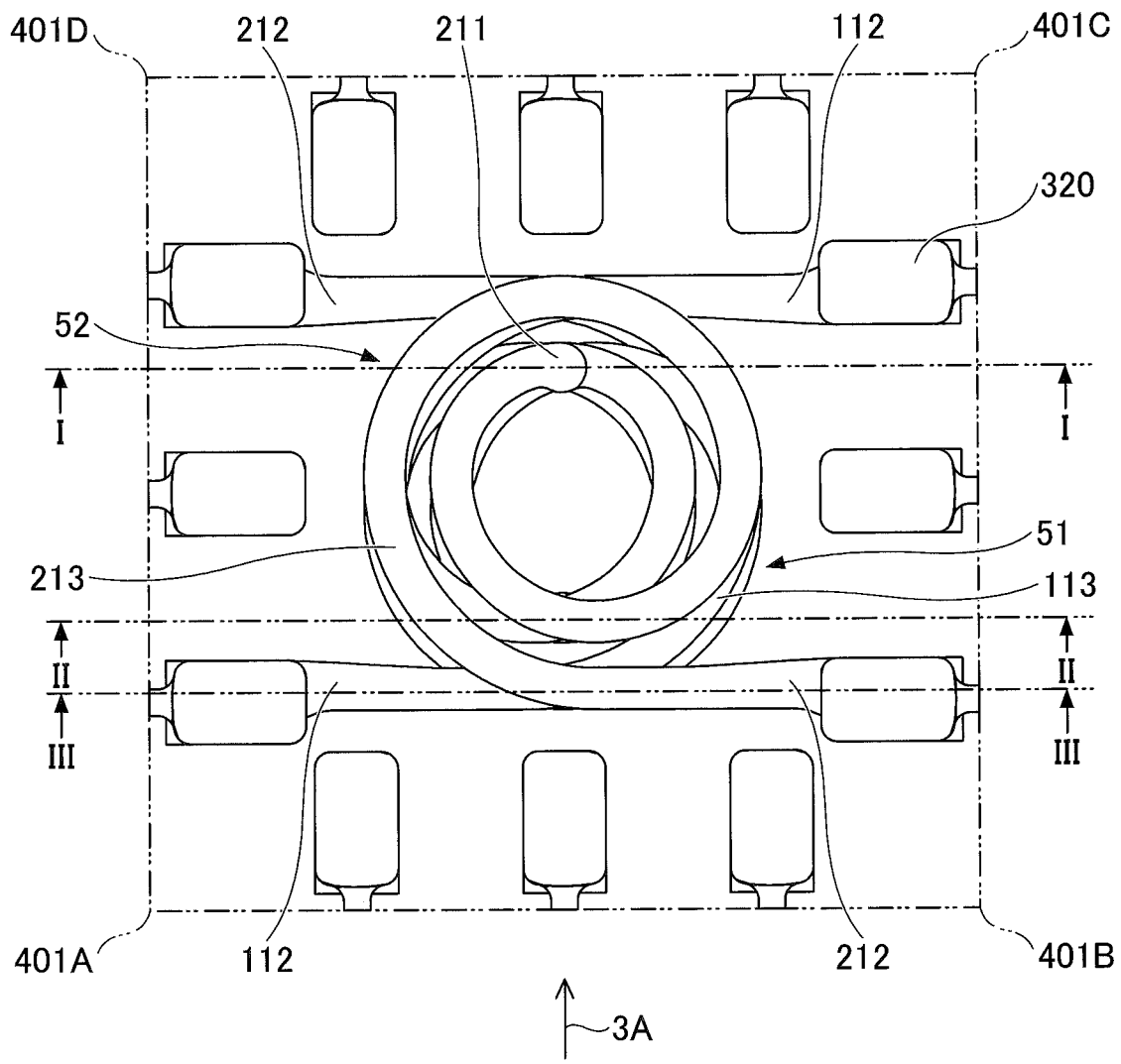
FIG. 34 is a top view illustrating the structure of the laminated circuit board according to the third embodiment.
Figure 35:
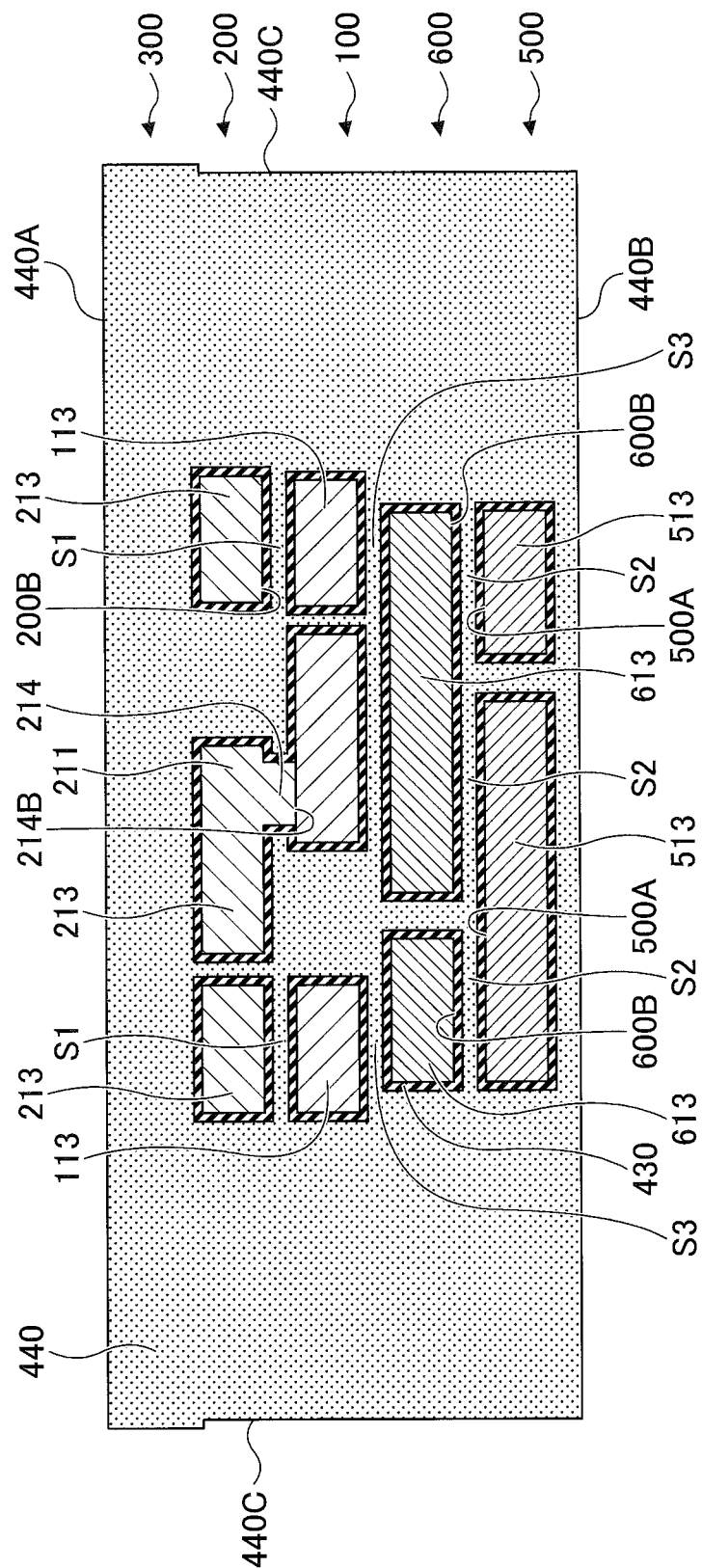
FIG. 35 is a cross sectional view illustrating the structure of the laminated circuit board according to the third embodiment.
Figure 36:
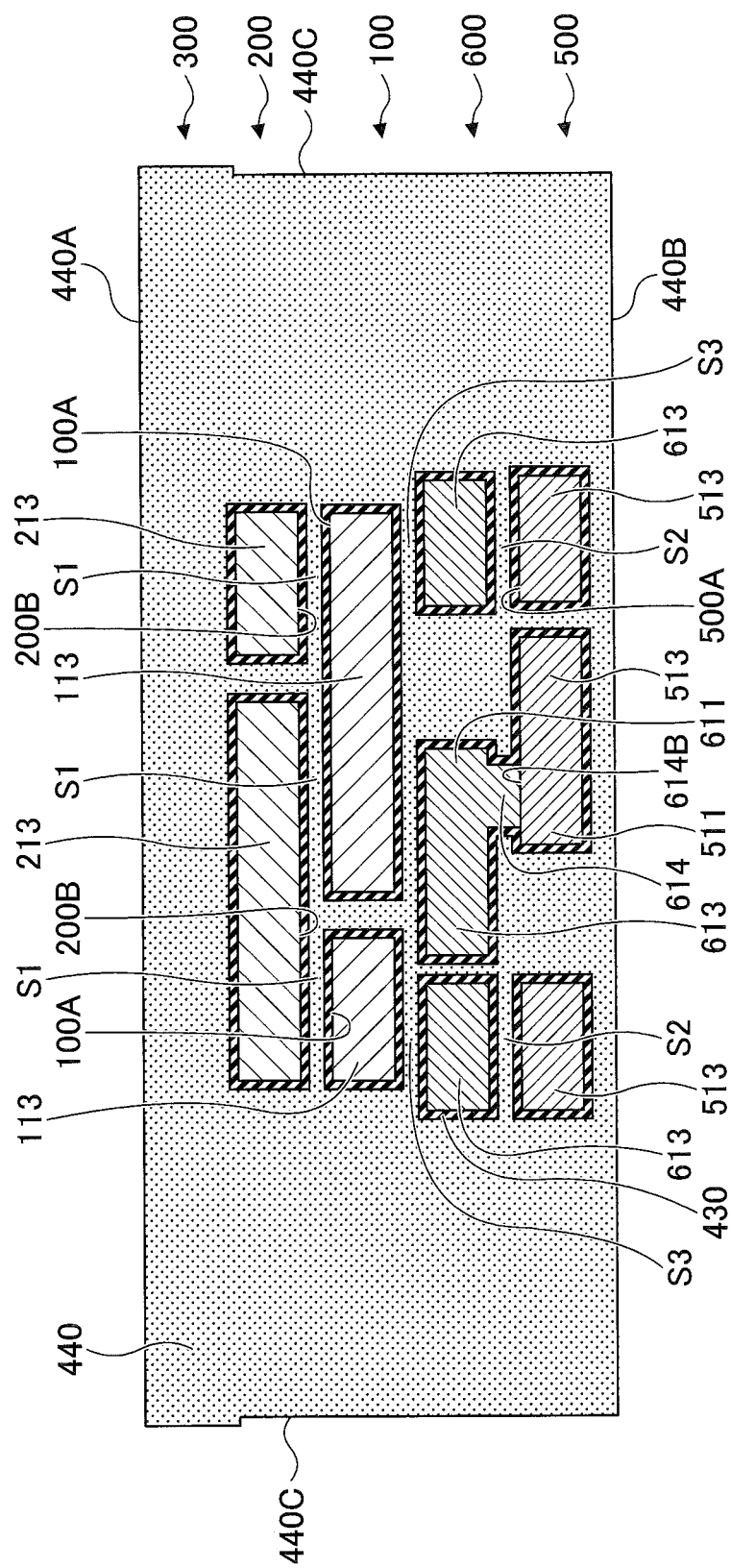
FIG. 36 is a cross sectional view illustrating the structure of the laminated circuit board according to the third embodiment.
Figure 37:
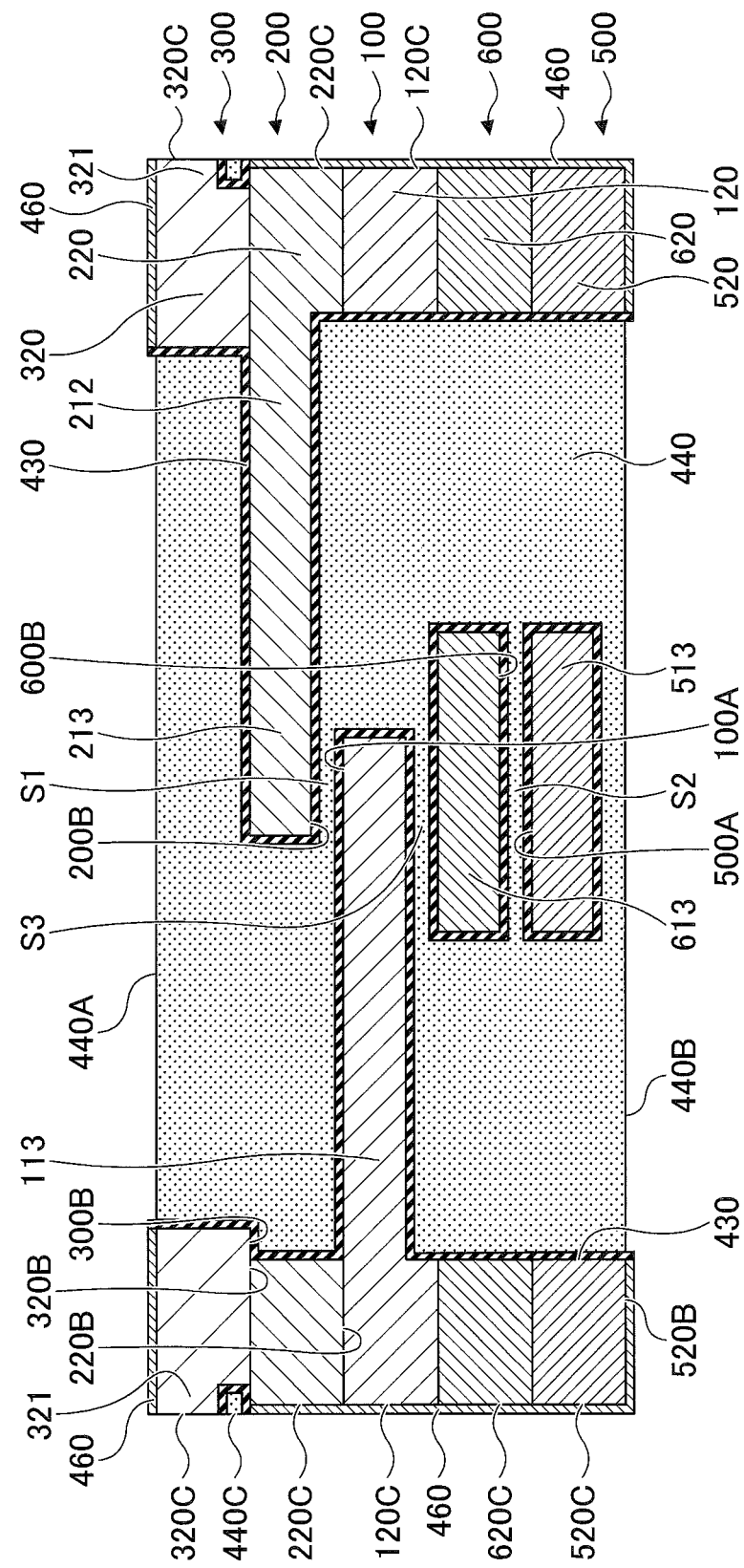
FIG. 37 is a cross sectional view illustrating the structure of the laminated circuit board according to the third embodiment.
Figure 38:
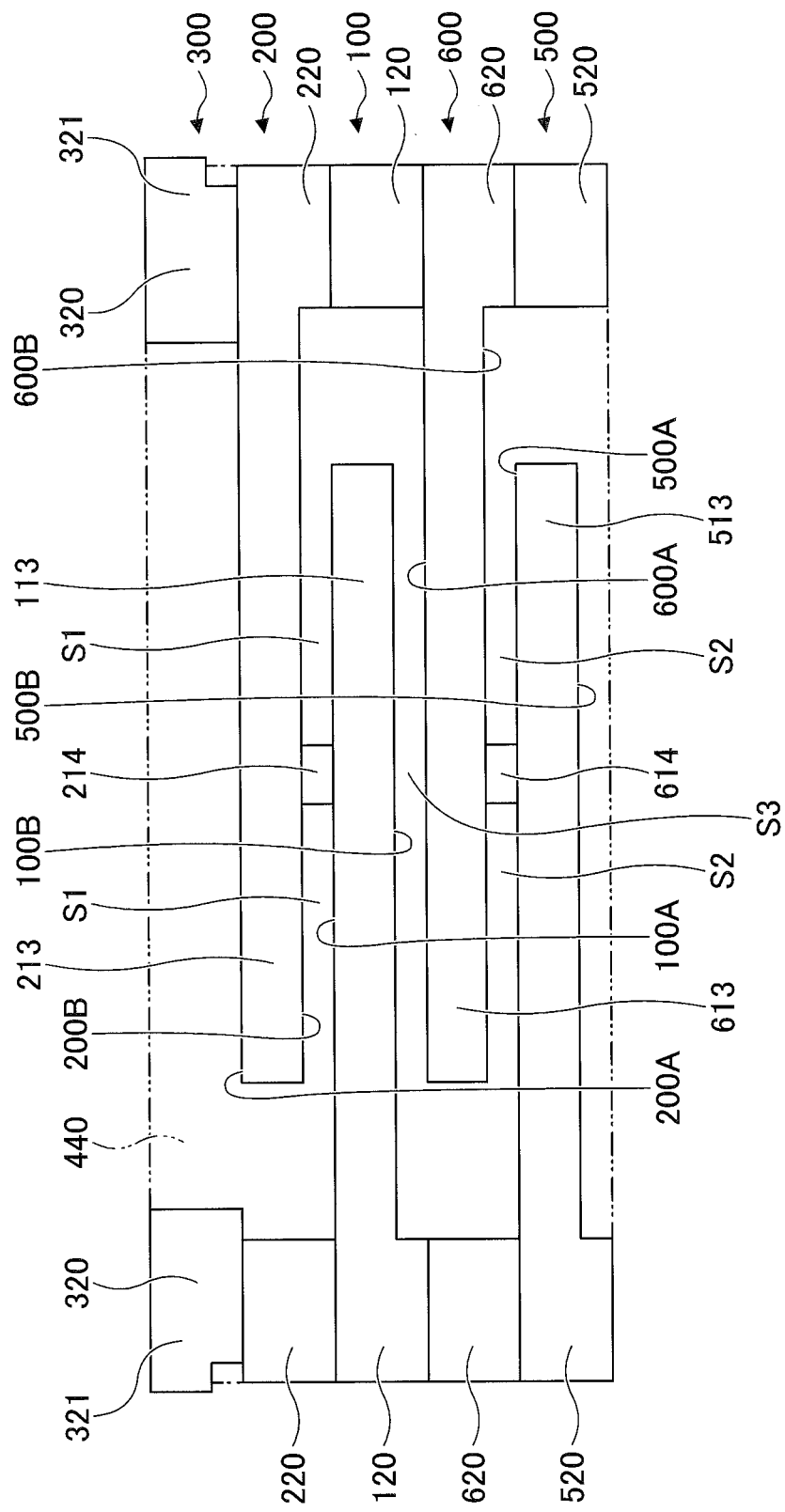
FIG. 38 is a side view illustrating the structure of the laminated circuit board according to the third embodiment.

Next, a third embodiment will be described. The third embodiment relates to a laminated circuit board 3. The third embodiment will be described by focusing on the differences from the first embodiment. FIG. 33A and FIG. 33B are perspective views illustrating the structure of the laminated circuit board 3 according to the third embodiment. FIG. 33A is the perspective view of the laminated circuit board 3 viewed from above, and FIG. 33B is the perspective view of the laminated circuit board 3 viewed from below. FIG. 34 is a top view illustrating the structure of the laminated circuit board 3 according to the third embodiment. In FIG. 33A, FIG. 33B, and FIG. 34, metal layers included in the laminated circuit board 3 are illustrated by a solid line. FIG. 35 through FIG. 37 are cross sectional views illustrating the structure of the laminated circuit board 3 according to the third embodiment. FIG. 35 corresponds to the cross sectional view along a line I-I in FIG. 34, and FIG. 36 corresponds to the cross sectional view along a line II-II in FIG. 34. FIG. 37 corresponds to the cross sectional view along a line in FIG. 34. FIG. 38 is a side view illustrating the structure of the laminated circuit board 3 according to the third embodiment. FIG. 38 illustrates a part of the metal layers, visible in a direction indicated by an arrow 3A in FIG. 34, by a solid line.

As illustrated in FIG. 33A through FIG. 38, the laminated circuit board 3 according to the third embodiment includes the base 400, and metal layers 100, 200, 300, 500, and 600.

The metal layer 600 is provided on the metal layer 500, and is electrically connected to the metal layer 500. The metal layer 100 is provided on the metal layer 600, and is electrically connected to the metal layer 600. Similar to the first embodiment, the metal layer 200 is provided on the metal layer 100, and is electrically connected to the metal layer 100. The metal layer 300 is provided on the metal layer 200, and is electrically connected to the metal layer 200. The metal layers 100, 200, 300, 500, and 600 are provided in the base 400. The metal layers 500 and 600 may be made of a metal material such as Cu, Cu alloys, or the like, for example. The metal layers 500 and 600 may be made of Fe—Ni alloys, such as a 42-alloy, for example.

[Structure of Metal Layer 500]

Figure 39A:
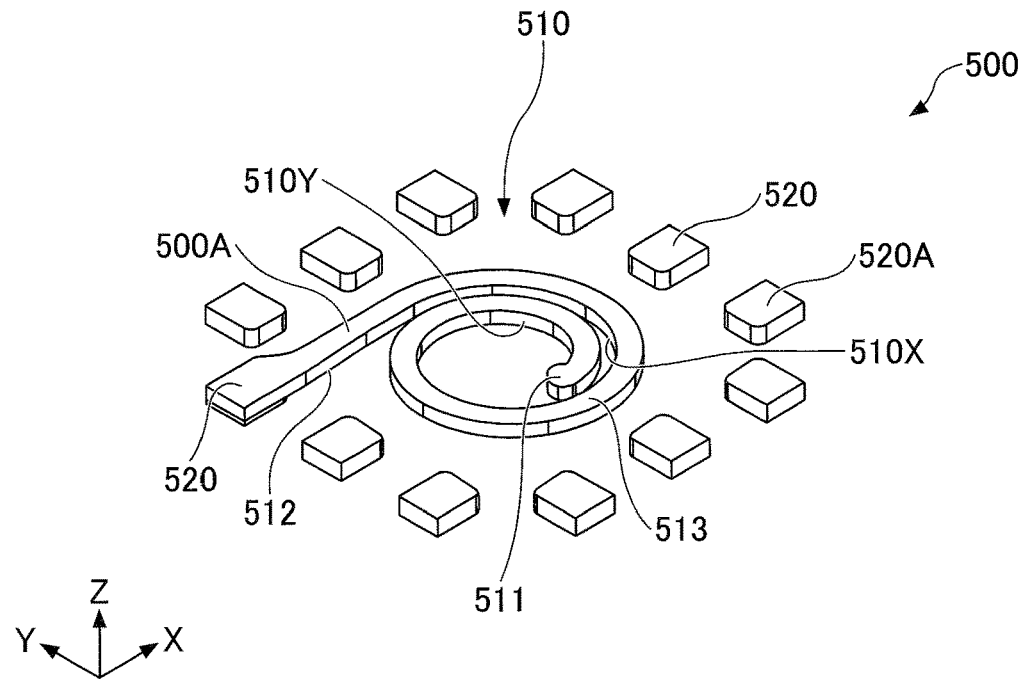
FIG. 39A and FIG. 39B are perspective views illustrating the structure of a metal layer included in the third embodiment.
Figure 39B:
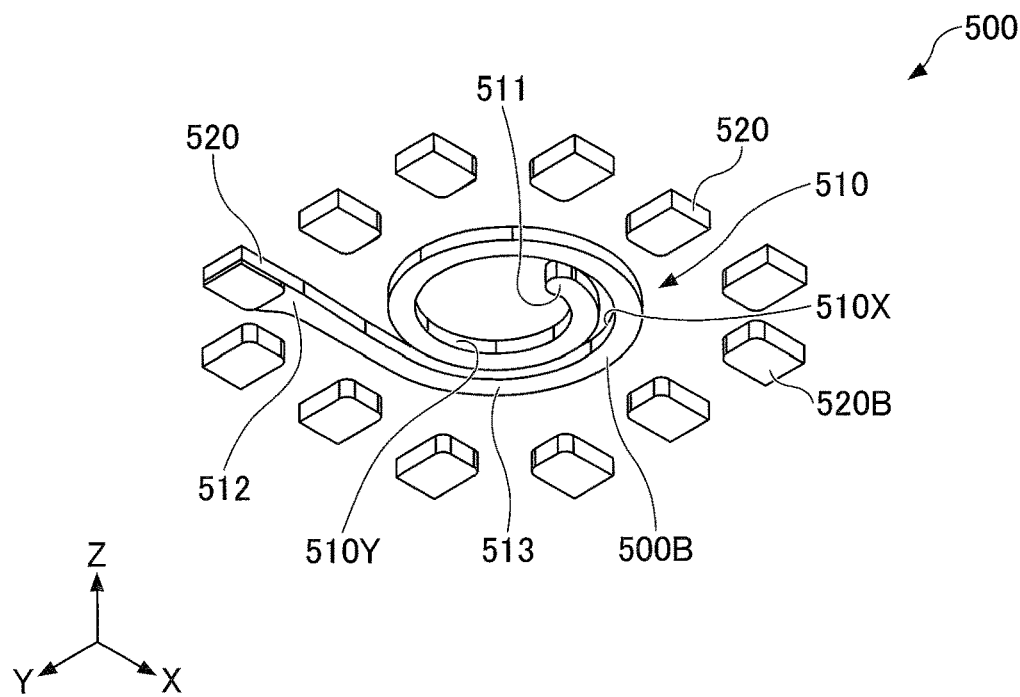

The metal layer 500 will be described. The metal layer 500 has a structure similar to the structure of the metal layer 100, however, a direction in which a conductor part 513 of the metal layer 500 is wound is opposite to the direction in which the conductor part 113 of the metal layer 100 is wound. FIG. 39A and FIG. 39B are perspective views illustrating the structure of the metal layer 500 included in the third embodiment. FIG. 39A is the perspective view of the metal layer 500 viewed from above, and FIG. 39B is the perspective view of the metal layer 500 viewed from below.

The metal layer 500 includes a plurality of electrode parts 520 similar to the electrode parts 120, and a winding part 510 similar to the winding part 110. The winding part 510 includes an end part 511 similar to the end part 111, an end part 512 similar to the end part 112, and the conductor part 513 similar to the conductor part 113. The direction in which the conductor part 513 of the winding part 510 is wound is opposite to the direction in which the conductor part 113 of the winding part 110 is wound. In other words, the spiral shape of the conductor part 513 in the plan view has left-handed (or counterclockwise) turns that extend toward the outer periphery relative to the center of the spiral shape. The conductor part 513 has an approximately circular spiral shape including approximately 1.5 left-handed (or counterclockwise) turns from the end part 511 on the inner periphery toward the end part 512 on the outer periphery. The winding part 510 may have a rectangular spiral shape within the same plane.

The conductor part 513 is formed to the spiral shape so that a predetermined gap is formed between adjacent turns of the spiral shape. In other words, a spiral slit 510X is formed between the adjacent turns of the spiral shape of the conductor part 513. In addition, an opening 510Y having an approximately circular shape is formed on the inner periphery of the end part 511, that is, at a central part of the spiral shape.

The plurality of electrode parts 520 are provided in an island-like arrangement on the same plane as the winding part 510. The electrode parts 520 are formed to be thicker than the winding part 510. A difference between the thickness of the electrode parts 520 and the thickness of the winding part 510 may be approximately 50 μm to approximately 100 μm, for example. An upper surface 520A of the electrode parts 520 lies on the same plane as the upper surface 500A of the winding part 510, and a lower surface 520B of the electrode parts 520 lies on a plane lower than a lower surface 500B of the winding part 510.

The end part 512 of the winding part 510 is electrically connected to one of the plurality of electrode parts 520.

[Structure of Metal Layer 600]

Figure 40A:
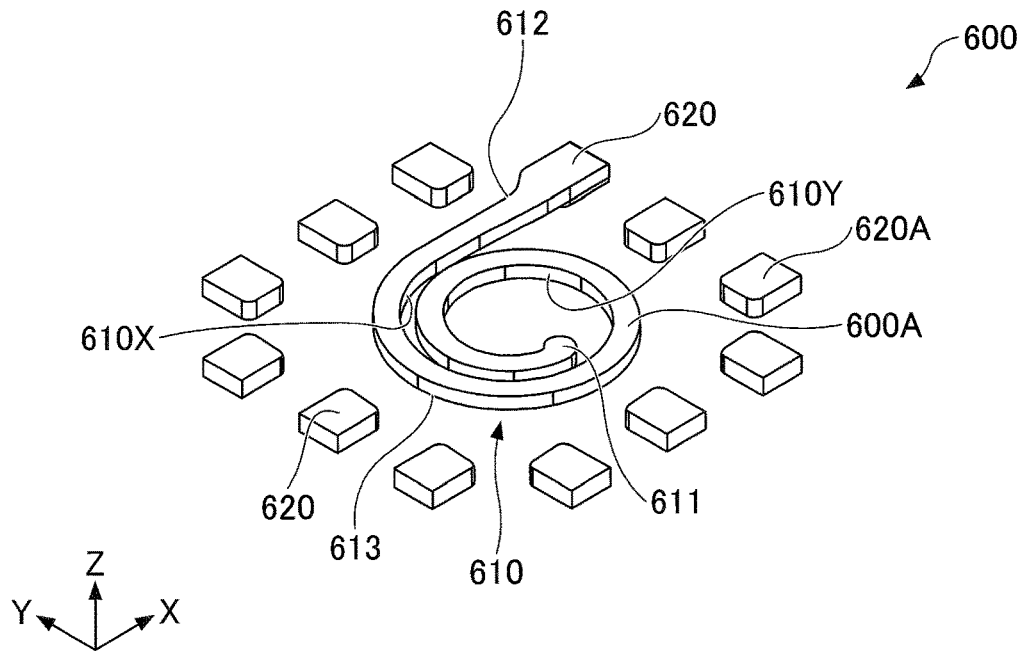
FIG. 40A and FIG. 40B are perspective views illustrating the structure of another metal layer included in the third embodiment.
Figure 40B:
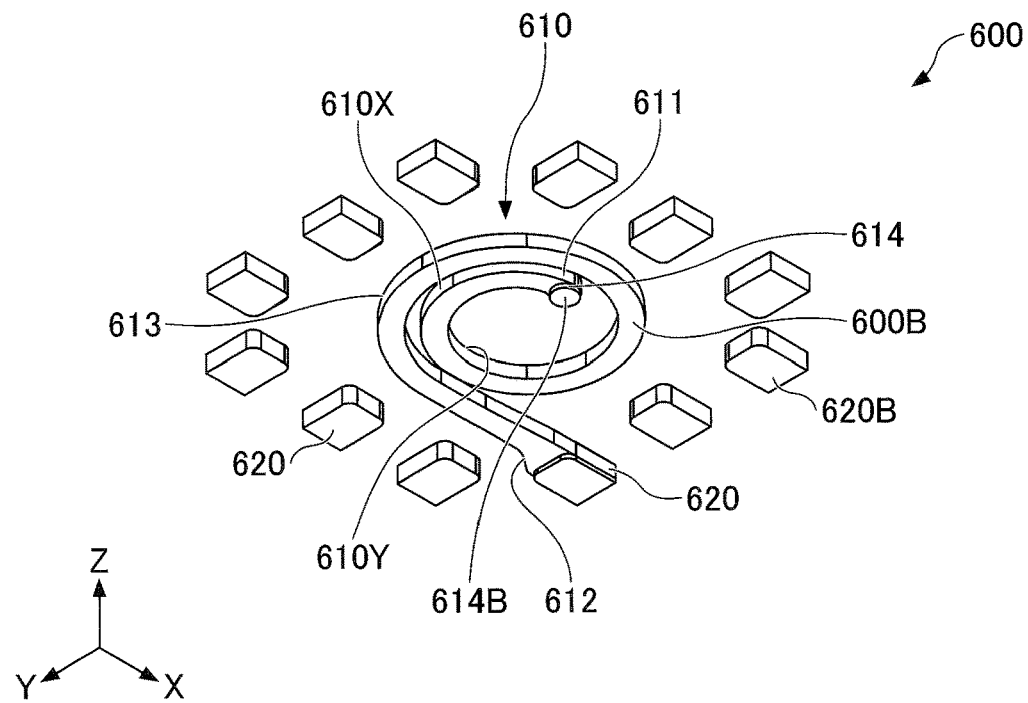

A structure of the metal layer 600 will be described. The metal layer 600 has a structure similar to the structure of the metal layer 200, however, a direction in which a conductor part 613 of the metal layer 600 is wound is opposite to the direction in which the conductor part 213 of the metal layer 200 is wound. FIG. 40A and FIG. 40B are perspective views illustrating the structure of the metal layer 600 included in the third embodiment. FIG. 40A is the perspective view of the metal layer 600 viewed from above, and FIG. 40B is the perspective view of the metal layer 600 viewed from below.

The metal layer 600 includes a plurality of electrode parts 620 similar to the electrode parts 220, and a winding part 610 similar to the winding part 210. The winding part 610 includes an end part 611 similar to the end part 211, an end part 612 similar to the end part 212, the conductor part 613 similar to the conductor part 213, and a projecting part 614 similar to the projecting part 214. The direction in which the conductor part 613 of the winding part 610 is wound is opposite to the direction in which the conductor part 213 of the winding part 210 is wound. In other words, the spiral shape of the conductor part 613 in the plan view has right-handed (or clockwise) turns that extend toward the outer periphery relative to the center of the spiral shape. The conductor part 613 has an approximately circular spiral shape including approximately 1.5 right-handed (or clockwise) turns from the end part 611 on the inner periphery toward the end part 612 on the outer periphery. The winding part 610 may have a rectangular spiral shape within the same plane.

The conductor part 613 is formed to the spiral shape so that a predetermined gap is formed between adjacent turns of the spiral shape. In other words, a spiral slit 610X is formed between the adjacent turns of the spiral shape of the conductor part 613. In addition, an opening 610Y having an approximately circular shape is formed on the inner periphery of the end part 611, that is, at a central part of the spiral shape.

The plurality of electrode parts 620 are provided in an island-like arrangement on the same plane as the winding part 610. The electrode parts 620 are formed to the same height (or thickness) as the projecting part 614. In other words, the electrode parts 620 are formed to be thicker than the winding part 610. A difference between the thickness of the electrode parts 620 and the thickness of the winding part 610 may be approximately 50 μm to approximately 100 μm, for example. An upper surface 620A of the electrode parts 620 lies on the same plane as the upper surface 600A of the winding part 610, and a lower surface 620B of the electrode parts 620 lies on the same plane as the lower surface 614B of the projecting part 614, which is lower than the lower surface 600B of the winding part 610.

The metal layer 600 connects to the metal layer 500 in a state where the metal layer 600 is laminated on the metal layer 500, similar to the metal layer 200 connecting to the metal layer 100. In the metal layers 500 and 600, the winding parts 510 and 610 that are vertically adjacent to each other are connected in series, so that a current flows in the same direction through the winding parts 510 and 610. Further, as illustrated in FIG. 33A and FIG. 33B, a spiral inductor 52 that extends from the end part 512 on the outer periphery of the winding part 510 to the end part 612 on the outer periphery of the winding part 610, is formed. In other words, the end part 512 that connects to the electrode part 520 is provided on one end of the spiral inductor 52, and the end part 612 that connects to the electrode part 620 is provided on the other end of the spiral inductor 52. The winding direction is opposite to each other between the inductor 51 and the inductor 52.

As illustrated in FIG. 35 through FIG. 37, a predetermined gap S2 is formed between the metal layer 500 and the metal layer 600 that are vertically adjacent to each other. More particularly, the gap S2, corresponding to the thickness of the projecting part 614, is formed between the upper surface 500A of the winding part 510 and the lower surface 600B of the winding part 610. In addition, between the inductors 51 and 52, a gap S3 is formed between the metal layer 600 and the metal layer 100 that are laminated vertically. More particularly, the gape S3, corresponding to the difference between the thickness of the electrode parts 120 and the thickness of the winding part 110, is formed between the upper surface 600A of the winding part 610 and the lower surface 100B of the winding part 110.

The base 400 is thicker than that of the first embodiment. The thickness of the base 400 according to the third embodiment may be approximately 500 μm to approximately 1000 μm, for example.

Inside the base 400, the winding parts 510 and 610 are electrically connected via the projecting part 614, to form the inductor 52. In addition, the end part 512 of the winding part 510 is electrically connected to one electrode part 520, and the end part 612 of the winding part 610 is electrically connected to another electrode part 520 via one electrode part 620. The lower surface 520B of each of these 2 electrode parts 520 is exposed from the lower surface 400B of the base 400. Further, similar to the first embodiment, the winding parts 110 and 210 are electrically connected via the projecting part 214, to form the inductor 51. The 2 electrode parts 120 of the metal layer 100 electrically connected to the inductor 51, are electrically connected to the 2 electrode parts 520 of the metal layer 500, via 2 electrode parts 620 of the metal layer 600. The lower surface 520B of each of the 2 electrode parts 520 of the metal layer 500 is exposed from the lower surface 400B of the base 400. The electrode parts 520, the electrode parts 620, the electrode parts 120, the electrode parts 220, and the electrode parts 320 are laminated in this order, and are bonded to each other. In the third embodiment, a laminated structure formed by the metal layers 500, 600, 100, and 200 forms an example of the first metal layer, and the 4 electrode parts 520 exposed from the lower surface 400B of the base 400 form an example of the external electrodes. The electrode parts 520 that are not electrically connected to the inductors 51 and 52 may also be used as an example of the external electrodes.

Similar to the first embodiment, the electrode parts 320 of the metal layer 300 are electrically connected to the electrode parts 220 of the metal layer 200, and the upper surface 320A of the electrode parts 320 is exposed from the upper surface 400A of the base 400. The metal layer 300 forms an example of the second metal layer, and the electrode parts 320 form an example of the internal electrodes.

As illustrated in FIG. 37, the plated layer 460 is formed on the lower surface 520B and the end surface 520C of the electrode parts 520 of the metal layer 500, the end surface 620C of the electrode parts 620 of the metal layer 600, the end surface 120C of the electrode parts 120 of the metal layer 100, the end surface 220C of the electrode parts 220 of the metal layer 200, and the upper surface 320A of the electrode parts 320 of the metal layer 300.

According to the third embodiment, it is possible to obtain advantageous effects similar to those obtainable by the first embodiment. In addition, because the built-in inductors 51 and 52 are provided in a single laminated circuit board 3, the laminated circuit board 3 may be used for a multi-phase power supply, such as a 2-phase power supply, for example, as will be described later in conjunction with a fourth embodiment.

When manufacturing the laminated circuit board 3, the metal layers 500 and 600 may be formed similar to the metal layers 100 and 200, and the metal layers 100, 200, and 300 and the metal layers 500 and 600 may be bonded to each other by diffusion bonding or the like, to integrally form the laminated structure of the metal layers 500, 600, 100, 200, and 300.

Fourth Embodiment

Figure 41A:
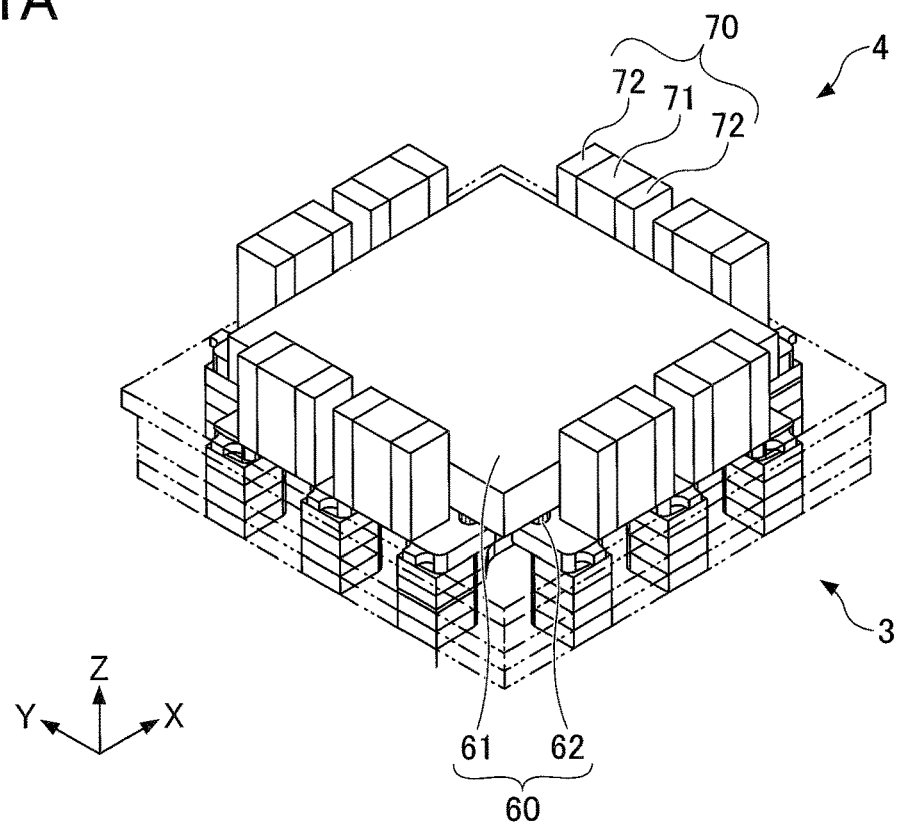
FIG. 41A and FIG. 41B are perspective views illustrating the structure of the electronic component according to a fourth embodiment.
Figure 41B:
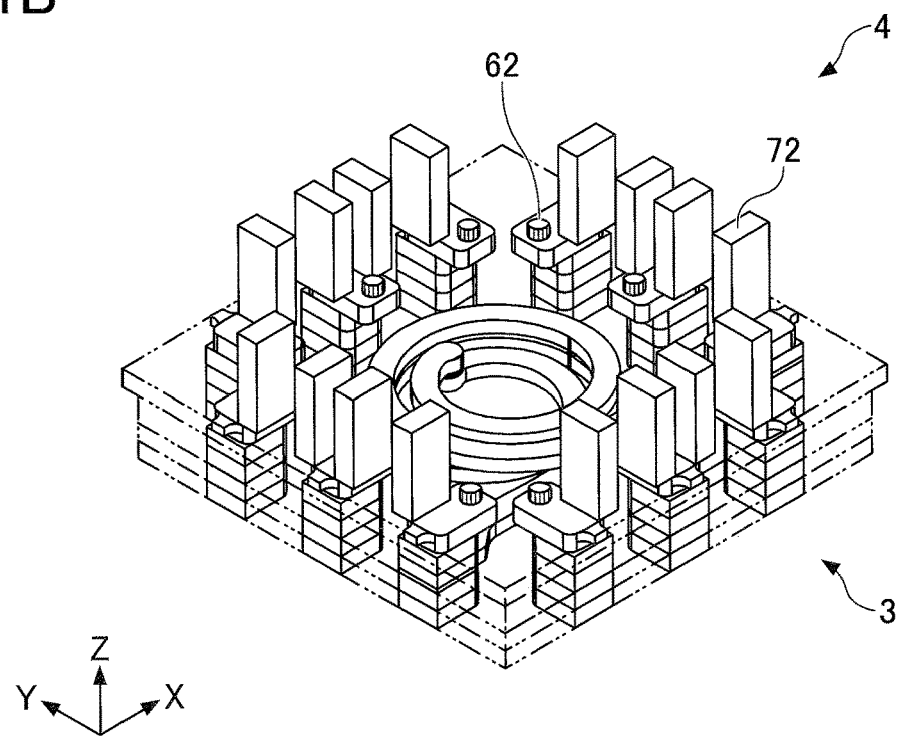

Next, the fourth embodiment will be described. The fourth embodiment relates to an electronic component 4 including the laminated circuit board 3. The fourth embodiment will be described by focusing on the differences from the second embodiment. FIG. 41A and FIG. 41B are perspective views illustrating the structure of the electronic component 4 according to the fourth embodiment. FIG. 41A illustrates the entire electronic component 4, and FIG. 41B illustrates a relationship between the electrodes and the electrode parts of the semiconductor chip and the passive elements included in the electronic component 4.

As illustrated in FIG. 41A and FIG. 41B, the electronic component 4 according to the fourth embodiment includes the laminated circuit board 3, the semiconductor chip 60, and the plurality of passive elements 70. Each electrode 62 of the semiconductor chip 60 is electrically connected to the upper surface 320A of the electrode part 320 of the laminated circuit board 3. Each electrode 72 of the passive element 70 is electrically connected to the upper surface 320A of the electrode part 320 of the laminated circuit board 3. Although the illustration of the mold resin 80 is omitted in FIG. 41A and FIG. 41B, the semiconductor chip 60 and the passive elements 70 are encapsulated by the mold resin 80.

In the fourth embodiment, the electrode parts 520 are used as external electrodes of the electronic component 4, and the electrode parts 320 are used as internal electrodes of the electronic component 4. The electrodes 62 of the semiconductor chip 60 and the electrodes 72 of the passive elements 70 are electrically connected to the internal electrodes. The mounting board or the like may be electrically connected to the external electrodes. The laminated circuit board 3 includes the built-in inductors 51 and 52 that are electrically connected to the external electrodes and the internal electrodes. Accordingly, the electronic component 4 may be used as the multi-phase power supply, such as the 2-phase power supply, for example. Further, the electronic component 4 can contribute to the size reduction of the 2-phase power supply.

When manufacturing the electronic component 4, the semiconductor chips 60 and the passive elements 70 are mounted on the group of the laminated circuit boards 3, before being segmented into the individual pieces, and the semiconductor chips 60 and the passive elements 70 are encapsulated by the mold resins 80. Then, the laminated structure of the metal layers 500, 600, 100, 200, and 300, and the mold resin 80, are cut using the dicing saw or the like, to obtain the individual pieces each corresponding to the electronic component 4.

Fifth Embodiment

Figure 42A:
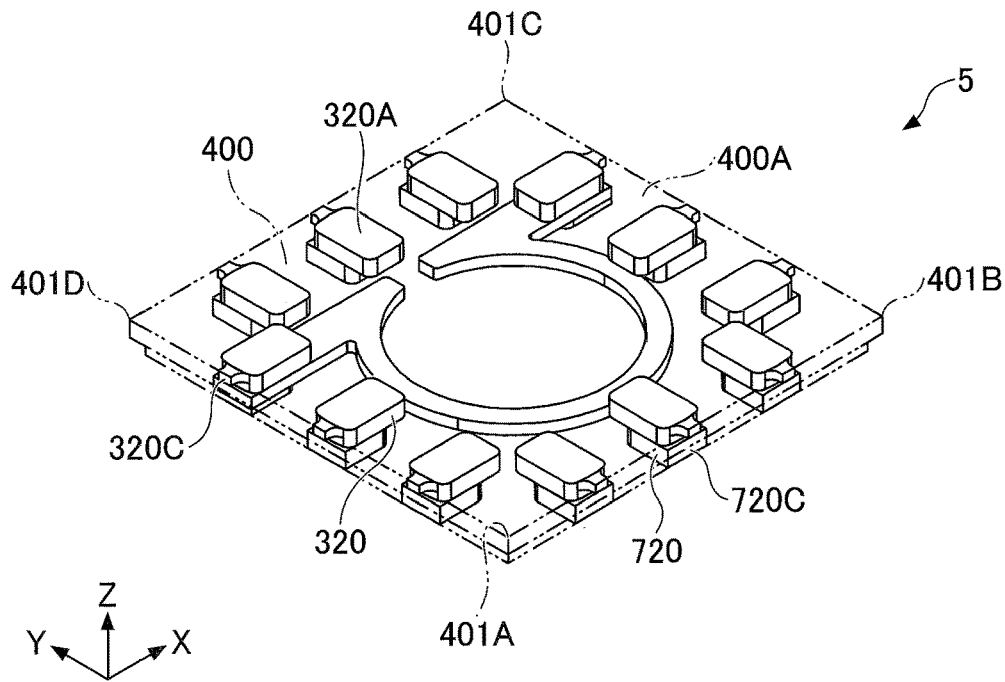
FIG. 42A and FIG. 42B are perspective views illustrating the structure of the laminated circuit board according to a fifth embodiment.
Figure 42B:
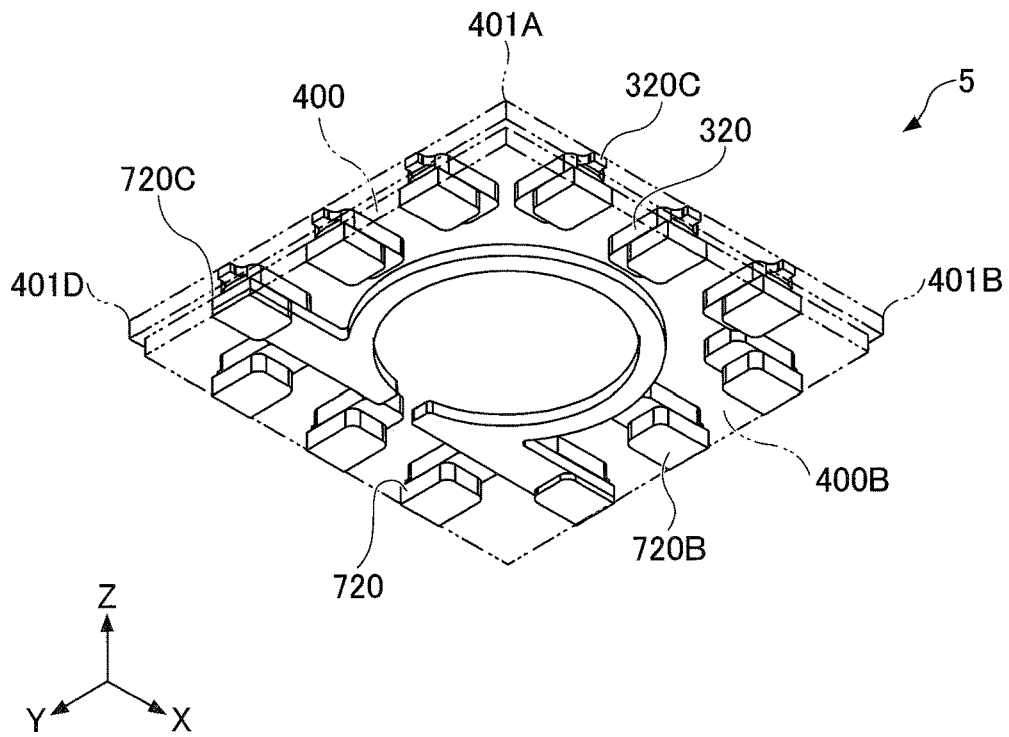
Figure 43:
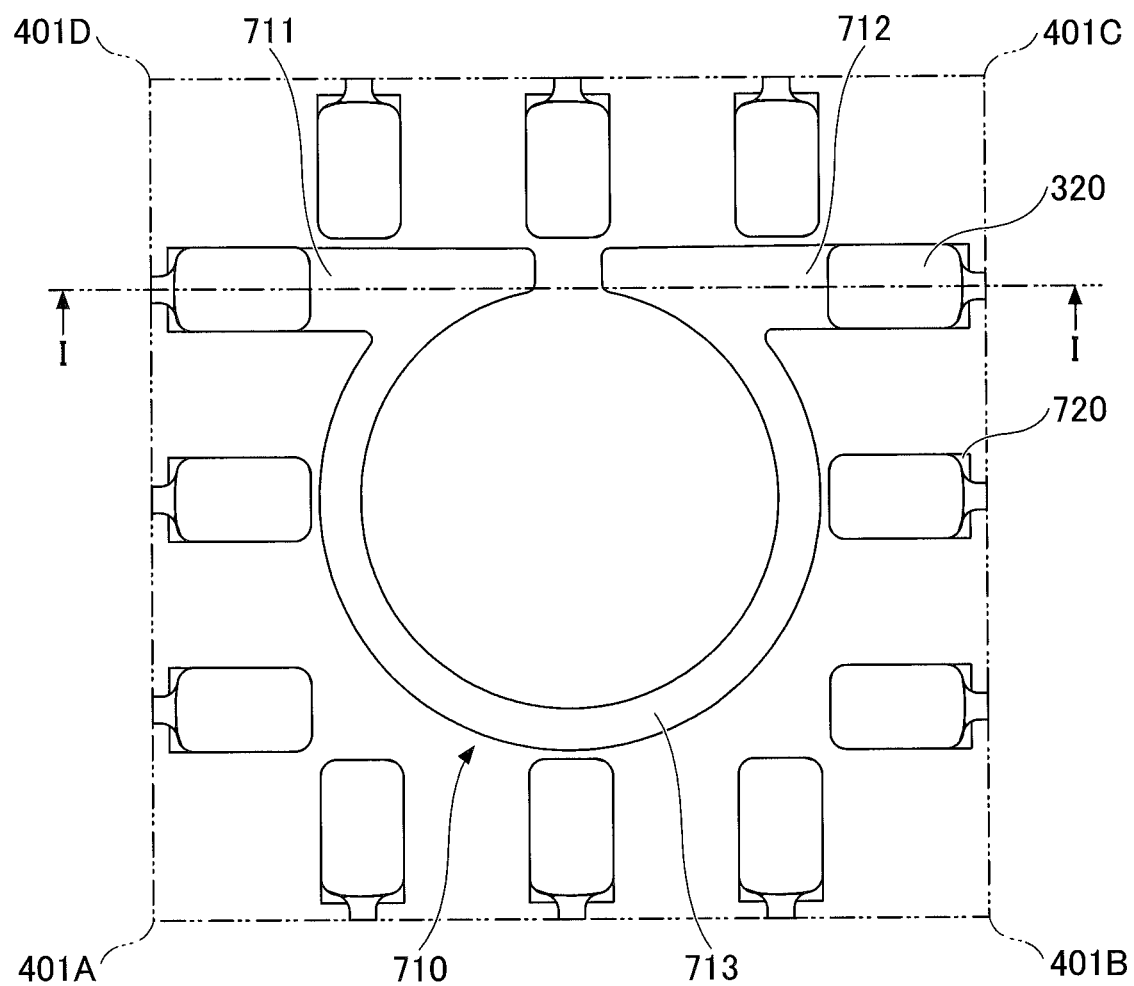
FIG. 43 is a top view illustrating the structure of the laminated circuit board according to the fifth embodiment.
Figure 44:
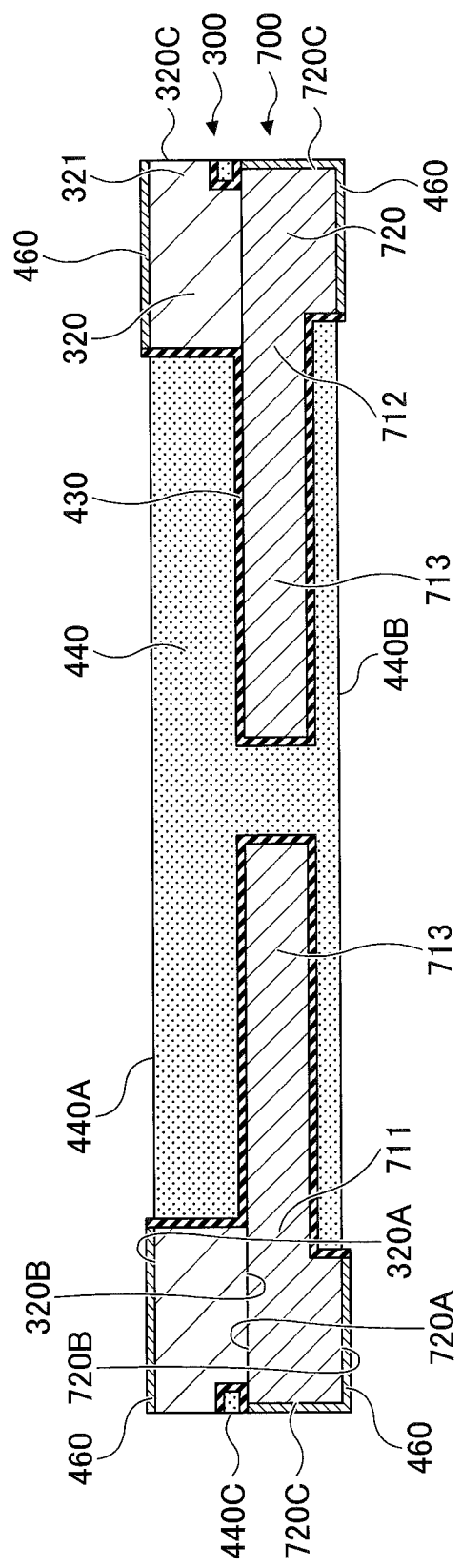
FIG. 44 is a cross sectional view illustrating the structure of the laminated circuit board according to the fifth embodiment.

Next, a fifth embodiment will be described. The fifth embodiment relates to a laminated circuit board 5. The fifth embodiment will be described by focusing on the differences from the first embodiment. FIG. 42A and FIG. 42B are perspective views illustrating the structure of the laminated circuit board 5 according to the fifth embodiment. FIG. 42A is the perspective view of the laminated circuit board 5 viewed from above, and FIG. 42B is the perspective view of the laminated circuit board 5 viewed from below. FIG. 43 is a top view illustrating the structure of the laminated circuit board 5 according to the fifth embodiment. In FIG. 42A, FIG. 42B, and FIG. 43, metal layers included in the laminated circuit board 5 are illustrated by a solid line. FIG. 44 is a cross sectional view illustrating the structure of the laminated circuit board 5 according to the fifth embodiment. FIG. 44 corresponds to the cross sectional view along a line I-I in FIG. 43.

As illustrated in FIG. 42A through FIG. 44, the laminated circuit board 5 according to the fifth embodiment includes the base 400, the metal layer 300, and a metal layer 700.

The metal layer 300 is provided on the metal layer 700, and is electrically connected to the metal layer 700. The metal layers 300 and 700 are provided in the base 400. The metal layer 700 may be made of a metal material such as Cu, Cu alloys, or the like, for example. The metal layer 700 may be made of Fe—Ni alloys, such as a 42-alloy, for example.

[Structure of Metal Layer 700]

Figure 45A:
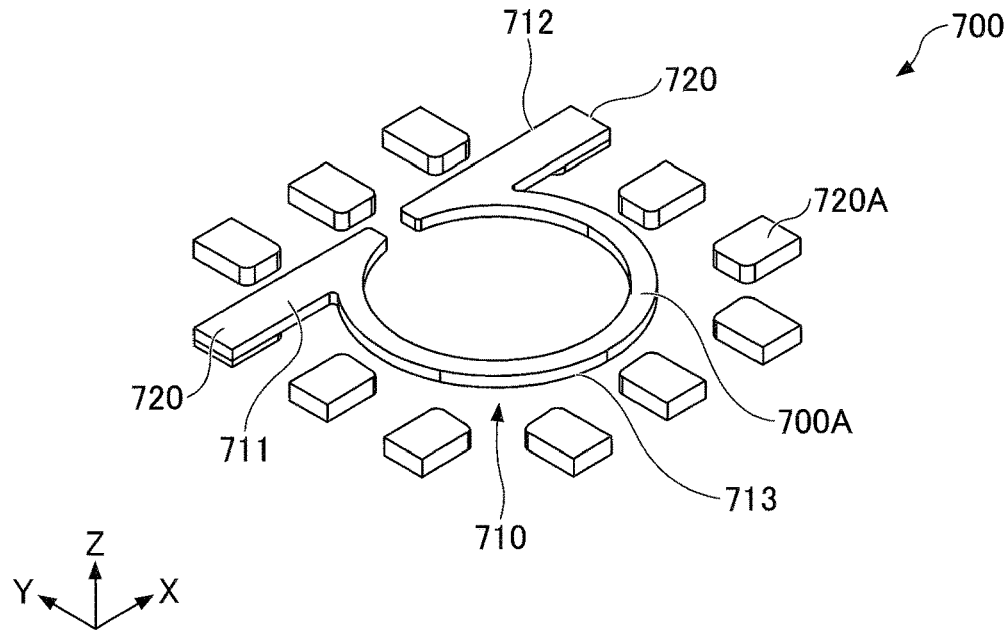
FIG. 45A and FIG. 45B are perspective views illustrating the structure of a metal layer included in the fifth embodiment.
Figure 45B:
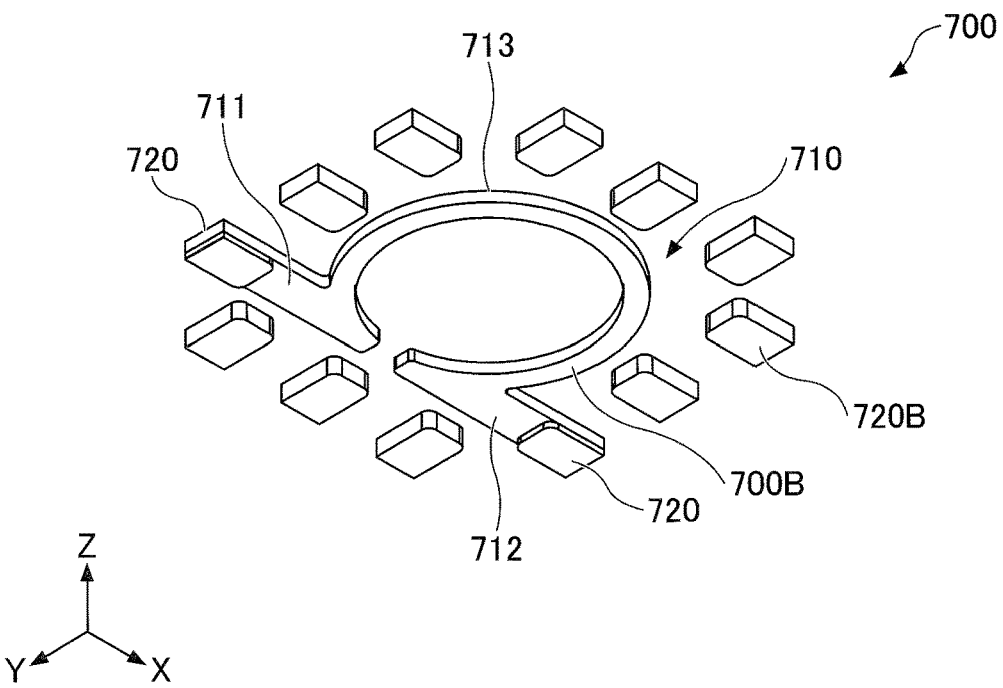

A structure of the metal layer 700 will be described. FIG. 45A and FIG. 45B are perspective views illustrating the structure of the metal layer 700 included in the fifth embodiment. FIG. 45A is the perspective view of the metal layer 700 viewed from above, and FIG. 45B is the perspective view of the metal layer 700 viewed from below.

The metal layer 700 includes a plurality of electrode parts 720 provided along the 4 sides of the base 400, and an omega-shaped (or Ω-shaped) part 710 provided on an inner side of the 4 sides of the base 400 and electrically connected to 2 of the electrode parts 720. The omega-shaped part 710 functions as an inductor.

As illustrated in FIG. 45A and FIG. 45B, the omega-shaped part 710 is formed to an omega-shape within the same plane (on the same plane). In this specification, a direction along the curve of the omega-shape of the omega-shaped part 710 is referred to as a longitudinal direction, a direction perpendicular to the longitudinal direction in the plan view is referred to as a transverse direction (or width direction), and a direction perpendicular to both the longitudinal direction and the transverse direction is referred to as a thickness direction. An end surface of the omega-shaped part 710, that is, a cross sectional shape of the omega-shaped part 710 cut along a plane perpendicular to the longitudinal direction of the omega-shaped part 710, is similar to the cross sectional shape of the winding part 210 or the like.

The omega-shaped part 710 includes one end part 711, another end part 712, and a conductor part 713 that extends in the omega-shape from the end part 711 toward the end part 712. The end part 711, the end part 712, and the conductor part 713 are integrally formed as a single component.

The end part 711 is electrically connected to one electrode part 720, and the end part 712 is electrically connected to another electrode part 720. An upper surface 700A of the end parts 711 and 712 is formed to lie on the same plane as the upper surface 700A of another part (the conductor part 713 or the like) of the metal layer 700.

The plurality of electrode parts 720 are provided in an island-like arrangement on the same plane as the omega-shaped part 710. The electrode parts 720 are formed to be thicker than the omega-shaped part 710. A difference between the thickness of the electrode parts 720 and the thickness of the omega-shaped part 710 may be approximately 50 μm to approximately 100 μm, for example. An upper surface 720A of the electrode parts 720 lies on the same plane as the upper surface 700A of the omega-shaped part 710, and a lower surface 720B of the electrode parts 720 lies on a plane lower than a lower surface 700B of the omega-shaped part 710. In other words, the electrode parts 720 are formed to project below the omega-shaped part 710 within the metal layer 700.

The metal layer 300 connects to the metal layer 700 in a state where the metal layer 300 is laminated on the metal layer 700. More particularly, the electrode parts 320 are connected to the electrode parts 720.

The base 400 is thinner than that of the first embodiment. The thickness of the base 400 according to the fifth embodiment may be approximately 200 μm to approximately 400 μm, for example.

Inside the base 400, the end parts 711 and 712 of the omega-shaped part 710 are electrically connected to 2 mutually different electrode parts 720. In addition, the lower surface 720B of each of these 2 electrode parts 720 is exposed from the lower surface 400B of the base 400. In the fifth embodiment, the metal layer 700 forms an example of the first metal layer, and these 2 electrode parts 720 form an example of the external electrodes.

The electrode parts 320 of the metal layer 300 are electrically connected to the electrode parts 720 of the metal layer 700, and the upper surface 320A of the electrode parts 320 is exposed from the upper surface 400A of the base 400. The metal layer 300 forms an example of the second metal layer, and the electrode parts 320 form an example of the internal electrodes.

As illustrated in FIG. 44, the plated layer 460 is formed on the lower surface 720B and an end surface 720C of the electrode parts 720, and the upper surface 320A of the electrode parts 320.

According to the fifth embodiment, it is possible to obtain advantageous effects similar to those obtainable by the first embodiment. In addition, the laminated circuit board 5 can be made thinner than that of the first embodiment.

When manufacturing the laminated circuit board 5, the metal layer 700 may be formed similar to the metal layer 100, and the metal layer 700 may be bonded to the metal layer 300 by diffusion bonding or the like, to integrally form the laminated structure of the metal layers 700 and 300.

Sixth Embodiment

Figure 46A:
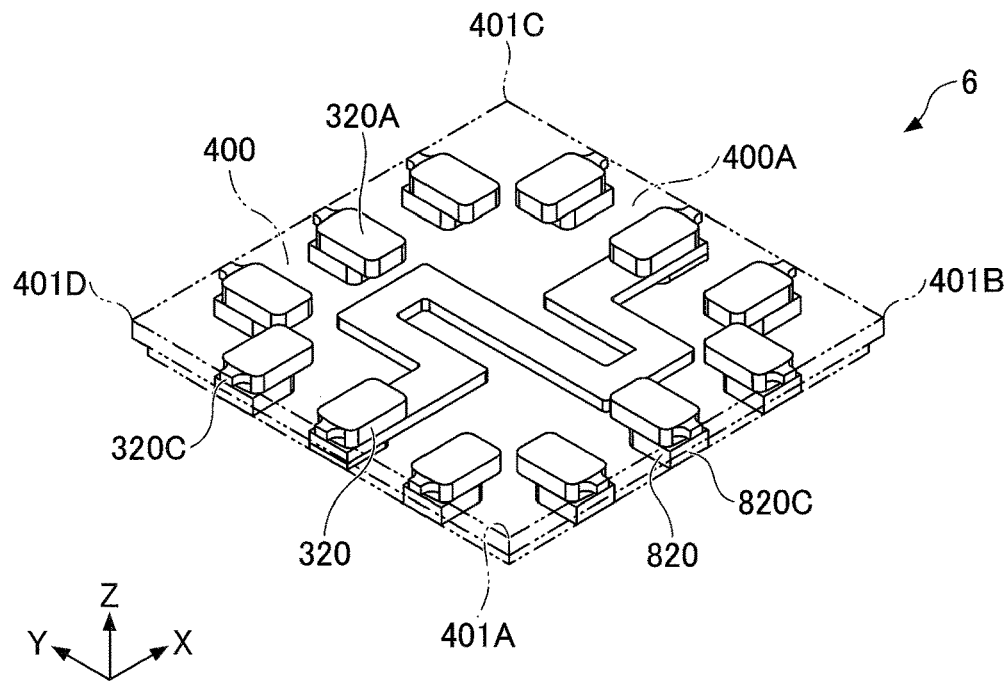
FIG. 46A and FIG. 46B are perspective views illustrating the structure of the laminated circuit board according to a sixth embodiment.
Figure 46B:
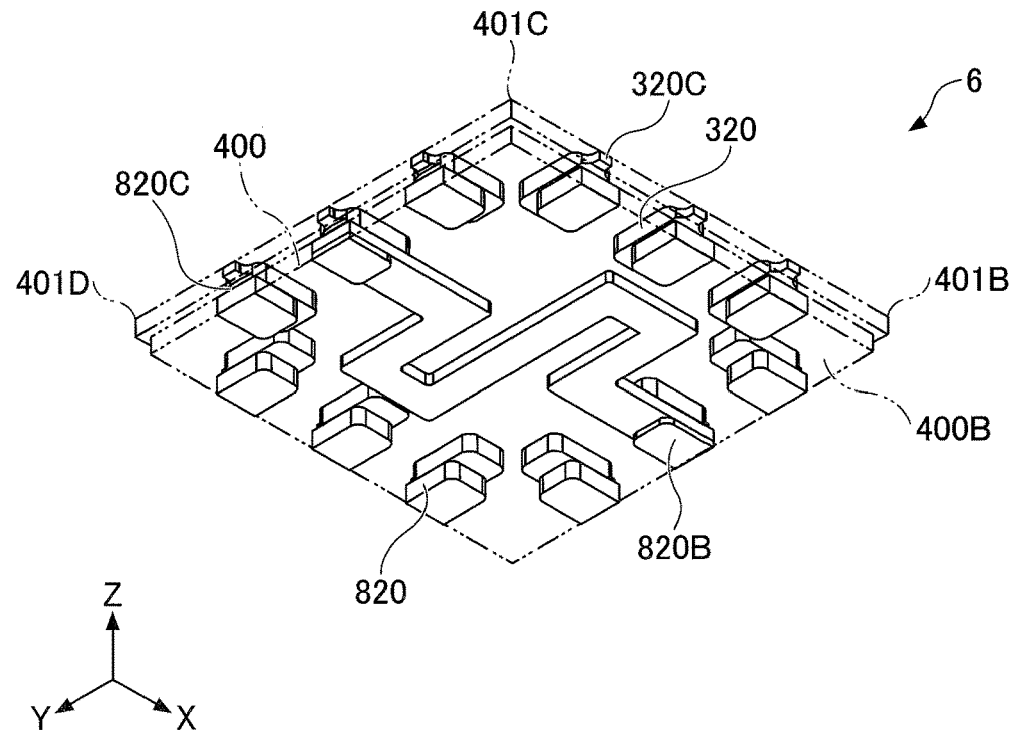
Figure 47:
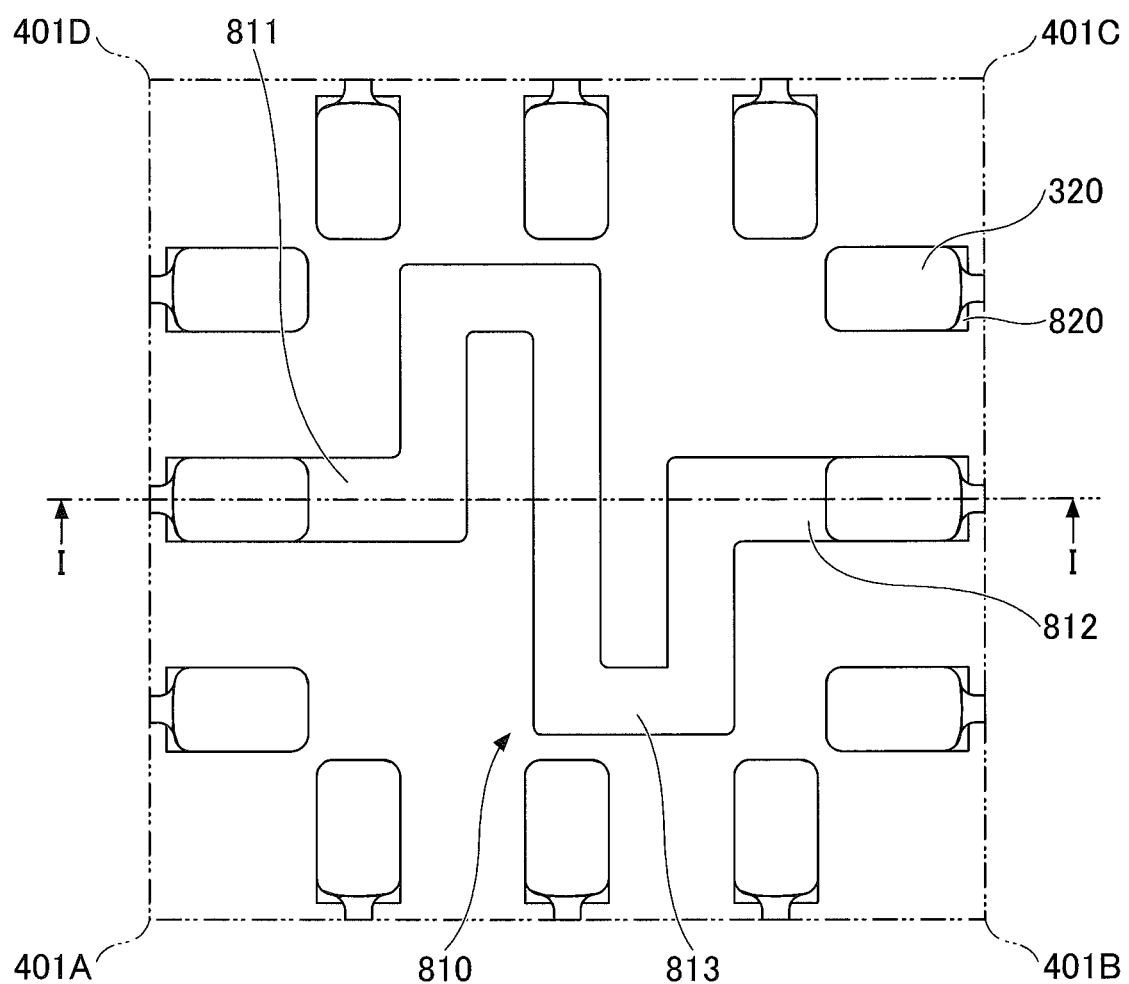
FIG. 47 is a top view illustrating the structure of the laminated circuit board according to the sixth embodiment.
Figure 48:
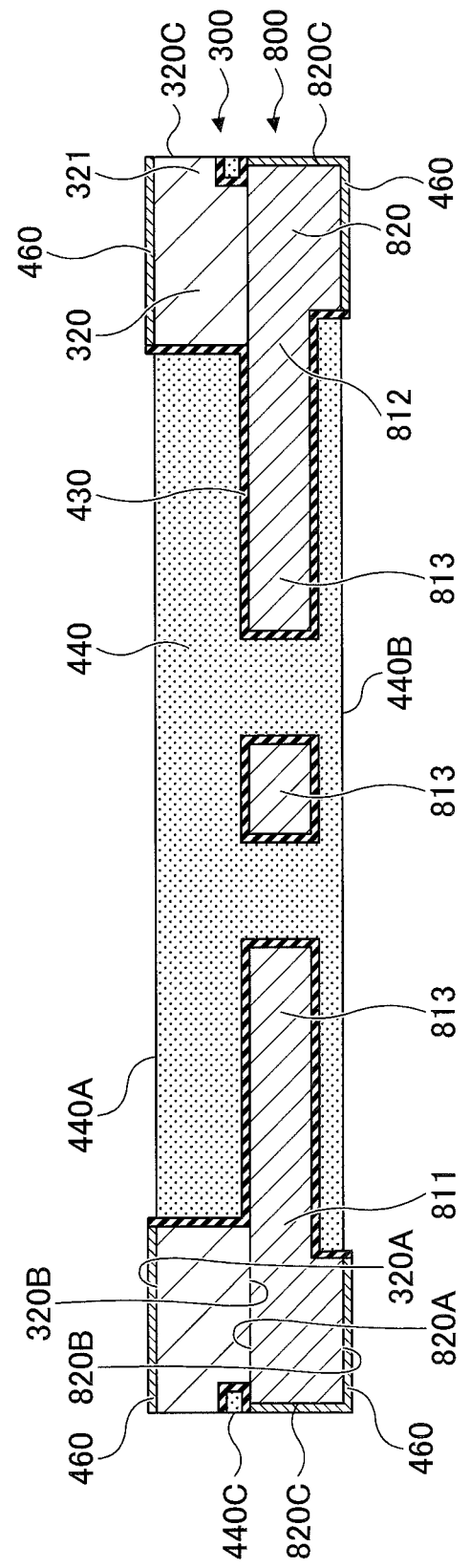
FIG. 48 is a cross sectional view illustrating the structure of the laminated circuit board according to the sixth embodiment.

Next, a sixth embodiment will be described. The sixth embodiment relates to a laminated circuit board 6. The sixth embodiment will be described by focusing on the differences from the first embodiment. FIG. 46A and FIG. 46B are perspective views illustrating the structure of the laminated circuit board 6 according to the sixth embodiment. FIG. 46A is the perspective view of the laminated circuit board 6 viewed from above, and FIG. 46B is the perspective view of the laminated circuit board 6 viewed from below. FIG. 47 is a top view illustrating the structure of the laminated circuit board 6 according to the sixth embodiment. In FIG. 46A, FIG. 46B, and FIG. 47, metal layers included in the laminated circuit board 6 are illustrated by a solid line. FIG. 48 is a cross sectional view illustrating the structure of the laminated circuit board 6 according to the sixth embodiment. FIG. 48 corresponds to the cross sectional view along a line I-I in FIG. 47.

As illustrated in FIG. 46A through FIG. 48, the laminated circuit board 6 according to the sixth embodiment includes the base 400, the metal layer 300, and a metal layer 800.

The metal layer 300 is provided on the metal layer 800, and is electrically connected to the metal layer 800. The metal layers 300 and 800 are provided in the base 400. The metal layer 800 may be made of a metal material such as Cu, Cu alloys, or the like, for example. The metal layer 800 may be made of Fe—Ni alloys, such as a 42-alloy, for example.

[Structure of Metal Layer 800]

Figure 49A:
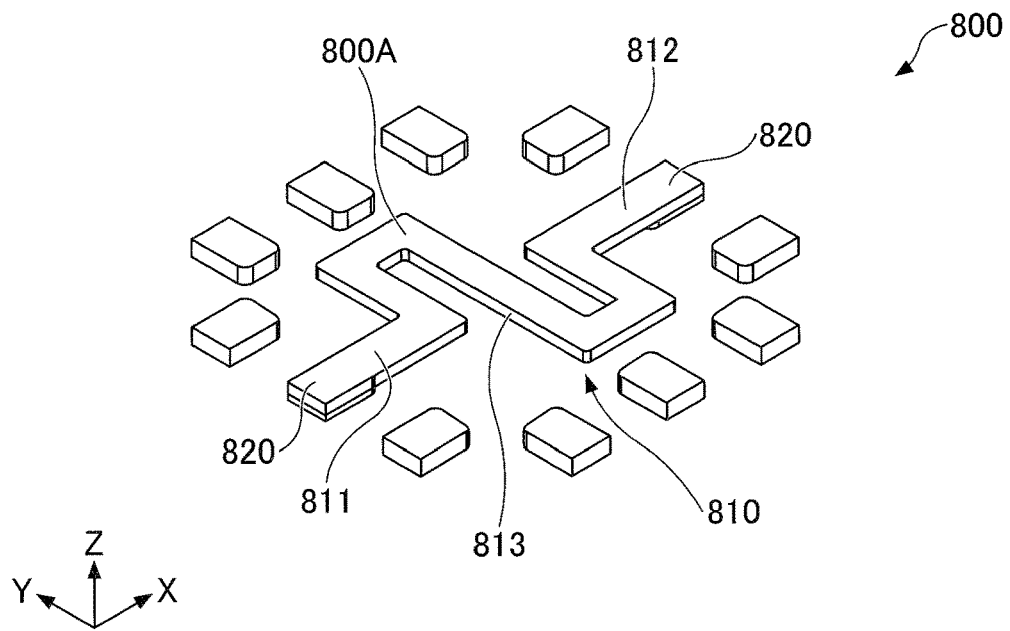
FIG. 49A and FIG. 49B are perspective views illustrating the structure of a metal layer included in the sixth embodiment.
Figure 49B:
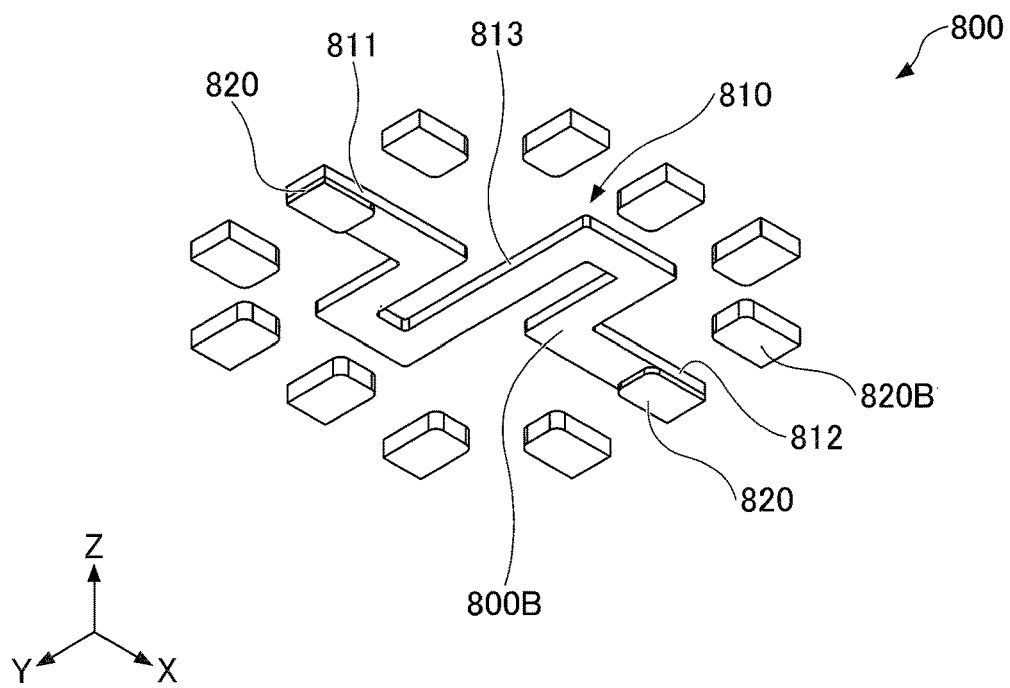

The metal layer 800 will be described. FIG. 49A and FIG. 49B are perspective views illustrating the structure of the metal layer 800 included in the sixth embodiment. FIG. 49A is the perspective view of the metal layer 800 viewed from above, and FIG. 49B is the perspective view of the metal layer 800 viewed from below.

The metal layer 800 includes a plurality of electrode parts 820 provided along the 4 sides of the base 400, and a zigzag-shaped (or meander-shaped) part 810 provided on an inner side of the 4 sides of the base 400 and electrically connected to 2 of the electrode parts 820. The zigzag-shaped part 810 functions as an inductor.

As illustrated in FIG. 49A and FIG. 49B, the zigzag-shaped part 810 is formed to a zigzag-shape (or meander-shape) within the same plane (on the same plane). In this specification, a direction along the zigzag-shape of the zigzag-shaped part 810 is referred to as a longitudinal direction, a direction perpendicular to the longitudinal direction in the plan view is referred to as a transverse direction (or width direction), and a direction perpendicular to both the longitudinal direction and the transverse direction is referred to as a thickness direction. An end surface of the zigzag-shaped part 810, that is, a cross sectional shape of the zigzag-shaped part 810 cut along a plane perpendicular to the longitudinal direction of the zigzag-shaped part 810, is similar to the cross sectional shape of the winding part 210 or the like.

The zigzag-shaped part 810 includes one end part 811, another end part 812, and a conductor part 813 that extends in the zigzag-shape from the end part 811 toward the end part 812. The end part 811, the end part 812, and the conductor part 813 are integrally formed as a single component.

The end part 811 is electrically connected to one electrode part 820, and the end part 812 is electrically connected to another electrode part 820. An upper surface 800A of the end parts 811 and 812 is formed to lie on the same plane as the upper surface 800A of another part (the conductor part 813 or the like) of the metal layer 800.

The plurality of electrode parts 820 are provided in an island-like arrangement on the same plane as the zigzag-shaped part 810. The electrode parts 820 are formed to be thicker than the zigzag-shaped part 810. A difference between the thickness of the electrode parts 820 and the thickness of the zigzag-shaped part 810 may be approximately 50 μm to approximately 100 μm, for example. An upper surface 820A of the electrode parts 820 lies on the same plane as the upper surface 800A of the zigzag-shaped part 810, and a lower surface 820B of the electrode parts 820 lies on a plane lower than a lower surface 800B of the zigzag-shaped part 810. In other words, the electrode parts 820 are formed to project below the zigzag-shaped part 810 within the metal layer 800.

The metal layer 300 connects to the metal layer 800 in a state where the metal layer 300 is laminated on the metal layer 800. More particularly, the electrode parts 320 are connected to the electrode parts 820.

The base 400 is thinner than that of the first embodiment. The thickness of the base 400 according to the sixth embodiment may be approximately 200 μm to approximately 400 μm, for example.

Inside the base 400, the end parts 811 and 812 of the zigzag-shaped part 810 are electrically connected to 2 mutually different electrode parts 820. In addition, the lower surface 820B of each of these 2 electrode parts 820 is exposed from the lower surface 400B of the base 400. In the sixth embodiment, the metal layer 800 forms an example of the first metal layer, and these 2 electrode parts 820 form an example of the external electrodes.

The electrode parts 320 of the metal layer 300 are electrically connected to the electrode parts 820 of the metal layer 800, and the upper surface 320A of the electrode parts 320 is exposed from the upper surface 400A of the base 400. The metal layer 300 forms an example of the second metal layer, and the electrode parts 320 form an example of the internal electrodes.

As illustrated in FIG. 48, the plated layer 460 is formed on the lower surface 820B and an end surface 820C of the electrode parts 820, and the upper surface 320A of the electrode parts 320.

According to the sixth embodiment, it is possible to obtain advantageous effects similar to those obtainable by the first embodiment. In addition, the laminated circuit board 6 can be made thinner than that of the first embodiment.

When manufacturing the laminated circuit board 6, the metal layer 800 may be formed similar to the metal layer 100, and the metal layer 800 may be bonded to the metal layer 300 by diffusion bonding or the like, to integrally form the laminated structure of the metal layers 800 and 300.

The bonding of the metal layers is not limited to the diffusion bonding. A conductive bonding material, such as solder, metal paste, or the like, for example, may be provided between 2 metal layers, to bond the 2 metal layers via the conductive bonding material.

Accordingly to each of the embodiments described above, it is possible to easily form a built-in low-resistance inductor in the laminated circuit board.

Various aspects of the subject-matter described herein may be set out non-exhaustively in the following numbered clauses:

1. A method of manufacturing a laminated circuit board, comprising:

forming a first metal layer that includes a first electrode, and an inductor electrically connected to the first electrode;

forming a second metal layer that includes a second electrode;

laminating the first metal layer and the second metal layer, while electrically connecting the first electrode and the second electrode; and providing the first metal layer and the second metal layer in a base that includes a first surface and a second surface on an opposite side from the first surface, to expose first electrode from the first surface and expose the second electrode from the second surface.

2. The method of manufacturing the laminated circuit board according to clause 1, wherein the forming the first metal layer includes patterning a first metal plate to form a first winding part having a spiral shape within a single plane;

patterning a second metal plate to form a second winding part having a spiral shape within a single plane; and forming the inductor by connecting the first winding part and the second winding part in a state where the first winding part and the second winding part are laminated.

3. The method of manufacturing the laminated circuit board according to clause 1, further comprising:

forming the base to include an insulating layer that covers surfaces of the first electrode, the inductor, and the second electrode.

4. The method of manufacturing the laminated circuit board according to clause 1, wherein the providing the first metal layer and the second metal layer in the base embeds the first electrode, the inductor, and the second electrode in a magnetic body.

5. The method of manufacturing the laminated circuit board according to clause 1, further comprising:

forming a plated layer on parts of the first electrode and the second electrode exposed from the base.

Although the embodiments are numbered with, for example, "first," "second," "third," "fourth," "fifth," or "sixth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A laminated circuit board comprising:

a base having a first surface, and a second surface on an opposite side from the first surface;

a first metal layer, embedded in the base, and including a first electrode having a third surface exposed from the first surface of the base, and a fourth surface on an opposite side from the third surface; and a second metal layer, embedded in the base, and including a second electrode having a fifth surface exposed from the second surface of the base, and a sixth surface on an opposite side from the fifth surface, wherein the first metal layer includes an inductor integral and electrically connected to the first electrode, wherein the fourth surface of the first electrode makes direct contact with the sixth surface of the second electrode, thereby electrically connecting the first electrode and the second electrode, wherein the base includes an insulating layer which overs a surface of the inductor, and surfaces of the first electrode and the second electrode other than exposed surfaces of the first electrode and the second electrode, and a magnetic body, embedded with the inductor, the first electrode, and the second electrode, and covering the insulating layer, wherein each of the first electrode and the second electrode is embedded inside of the magnetic body, and wherein the exposed surfaces of the first electrode and the second electrode include the third surface of the first electrode and the fifth surface of the second electrode.

2. The laminated circuit board as claimed in claim 1, further comprising:

a plated layer formed on parts of the first electrode and the second electrode exposed from the base.

3. The laminated circuit hoard as claimed in claim 1, wherein the inductor includes a first conductor part formed in a spiral shape within a single plane, and a second conductor part formed in a spiral shape within a single plane, and connected to the first conductor part in a state laminated on the first conductor part.

4. The laminated circuit board as claimed in claim 3, wherein the first metal layer includes a first metal plate including the first electrode, and the first conductor part, and a second metal plate, laminated directly on the first metal plate, and including a third electrode, and the second conductor part, wherein the first electrode and the second electrode are bonded to each other via the third electrode.

5. The laminated circuit board as claimed in claim 1, wherein the first metal layer and the second metal layer are formed by metal plates.

6. An electronic component comprising:

the laminated circuit board according to claim 1;

a semiconductor chip electrically connected to the second electrode; and a passive element electrically connected to the second electrode.

7. The electronic component as claimed in claim 6, wherein the laminated circuit hoard further includes a plated layer formed on parts of the first electrode and the second electrode exposed from the base.

8. The electronic component as claimed in claim 6, wherein the inductor of the laminated circuit board includes a first conductor part formed in a spiral shape within a single plane, and a second conductor part formed in a spiral shape within a single plane, and connected to the first conductor part in a state laminated on the first conductor part.

9. The electronic component as claimed in claim 8, wherein the first metal layer of the laminated circuit board includes a first metal plate including the first electrode, and the first conductor part, and a second metal plate, laminated directly on the first metal plate, and including a third electrode, and the second conductor part, wherein the first electrode and the second electrode are bonded to each other via the third electrode.

10. The electronic component as claimed in claim 6, wherein the first metal layer and the second metal layer of the laminated circuit board are formed by metal plates.

11. The laminated circuit board as claimed in claim 1, wherein the base has a side at a lateral end thereof, the first electrode further has a seventh surface exposed from the side of the base, the second electrode further has an eighth surface exposed from the side of the base, the insulating layer covers the entire surface of the inductor, and the exposed surfaces of the first electrode and the second electrode further include the seventh surface of the first electrode and the eighth surface of the second electrode.

12. The laminated circuit board as claimed in claim 11, wherein the first metal layer and the second metal layer are formed by metal plates.

13. The laminated circuit board as claimed in claim 11, wherein
- a ninth surface of the magnetic body, exposed from the first surface of the base, lies on the same plane as the third surface of the first electrode, and an end surface of the insulating layer which covers a surface of the first electrode on the opposite side from the seventh surface of the first electrode, and
- a tenth surface of the magnetic body, exposed from the second surface of the base, lies on the same plane as the fifth surface of the second electrode, and an end surface of the insulating layer which covers a surface of the second electrode on the opposite side from the eighth surface of the second electrode.

14. The laminated circuit board as claimed in claim 11, wherein
- a first end surface of the magnetic body, exposed from the side of the base, lies on the same plane as the seventh surface of the first electrode, and an end surface of the insulating layer which covers the fourth surface of the first electrode, and
- a second end surface of the magnetic body, exposed from the side of the base, lies on the same plane as the eighth surface of the second electrode, and the end surface of the insulating layer which covers the sixth surface of the second electrode.

15. The laminated circuit board as claimed in claim 1, wherein
- the base has a side at a lateral end thereof,
- a first end surface of the magnetic body, exposed from the side of the base, lies on the same plane as a surface of the first electrode, exposed from the side of the base, and an end surface of the insulating layer, exposed from the side of the base and covering the fourth surface of the first electrode, and
- a second end surface of the magnetic body, exposed from the side of the base, lies on the same plane as a surface of the second electrode, exposed from the side of the base, and the end surface of the insulating layer, exposed from the side of the base and covering the sixth surface of the second electrode.

* * * * *